United States Patent
Koshino et al.

(10) Patent No.: US 8,994,858 B2
(45) Date of Patent: Mar. 31, 2015

(54) SOLID-STATE IMAGING DEVICE, METHOD OF MANUFACTURING SOLID-STATE IMAGING DEVICE, AND ELECTRONIC EQUIPMENT

(71) Applicant: Sony Corporation, Tokyo (JP)

(72) Inventors: Yasunori Koshino, Kumamoto (JP); Atsushi Toda, Kanagawa (JP); Yoichi Otsuka, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 14/083,365

(22) Filed: Nov. 18, 2013

(65) Prior Publication Data

US 2014/0077326 A1 Mar. 20, 2014

Related U.S. Application Data

(62) Division of application No. 12/906,627, filed on Oct. 18, 2010, now Pat. No. 8,610,807.

(30) Foreign Application Priority Data

Oct. 27, 2009 (JP) .................................. 2009-246866

(51) Int. Cl.
- *H04N 5/335* (2011.01)
- *H04N 5/225* (2006.01)
- *H01L 31/18* (2006.01)
- *H01L 27/146* (2006.01)
- *H04N 5/357* (2011.01)

(52) U.S. Cl.
CPC .... *H01L 27/14627* (2013.01); *H01L 27/14685* (2013.01); *H04N 5/3572* (2013.01); *H04N 5/3575* (2013.01); *H01L 27/14621* (2013.01)
USPC .............. 348/273; 348/294; 348/340; 438/69

(58) Field of Classification Search
None
See application file for complete search history.

(56) References Cited

U.S. PATENT DOCUMENTS

| | | | | |
|---|---|---|---|---|
| 2005/0045975 | A1* | 3/2005 | Kondo et al. | 257/414 |
| 2005/0051860 | A1* | 3/2005 | Takeuchi et al. | 257/436 |
| 2008/0151378 | A1* | 6/2008 | Kim | 359/626 |
| 2008/0246853 | A1* | 10/2008 | Takizawa et al. | 348/222.1 |
| 2009/0122171 | A1* | 5/2009 | Suzuki | 348/294 |

* cited by examiner

*Primary Examiner* — Luong T Nguyen
(74) *Attorney, Agent, or Firm* — Sheridan Ross P.C.

(57) ABSTRACT

A solid-state imaging device includes a photoelectric transformation portion and a micro lens, the micro lens has a first refractive index layer which is a first refractive index and a second refractive index layer which is a second refractive index different from the first refractive index, wherein the micro lens is configured so that a vertical cross section, which is a surface perpendicular to the capturing surface, has a rectangular shape, wherein each of the first refractive index layer and the second refractive index layer are arranged adjacent to each other in a direction along the capturing surface, and an interface between the first refractive index layer and the second refractive index layer in the vertical cross section is formed so as to follow a direction perpendicular to the capturing surface.

10 Claims, 38 Drawing Sheets

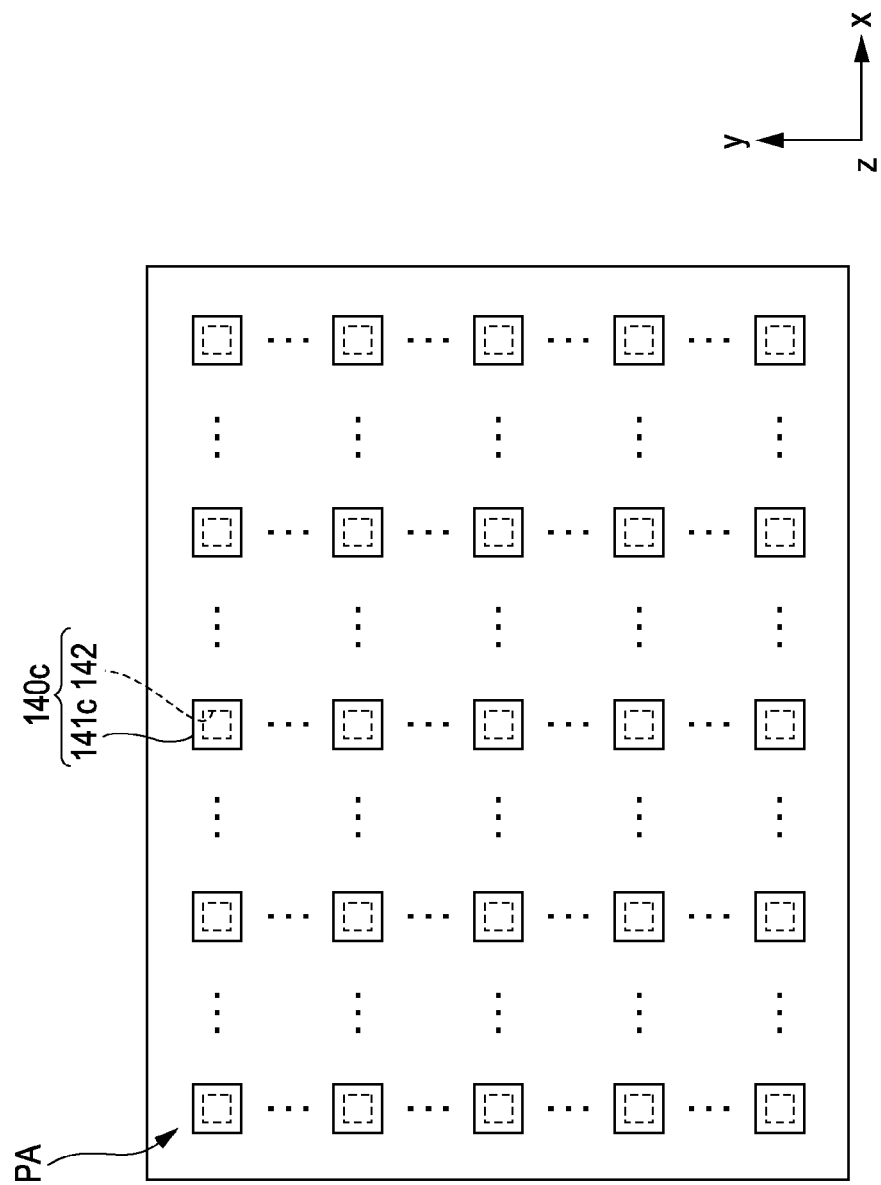

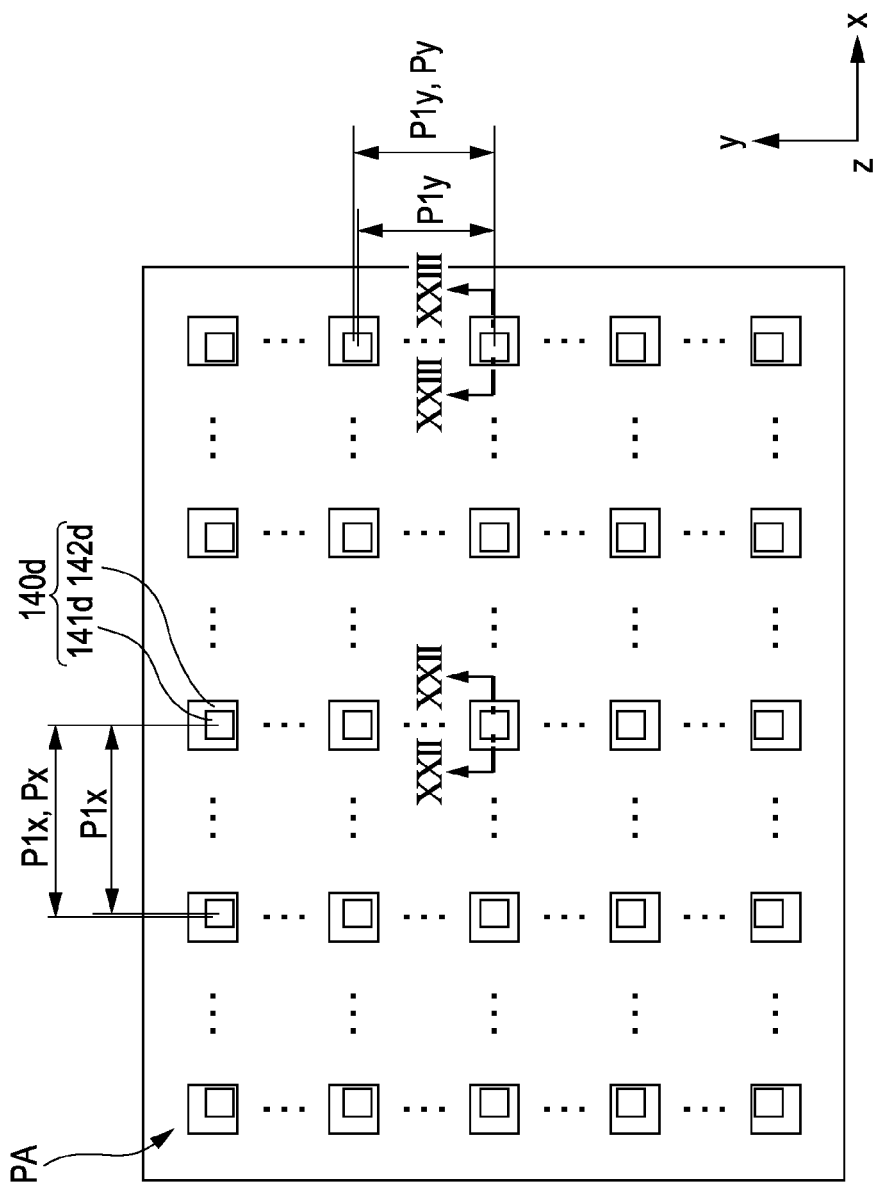

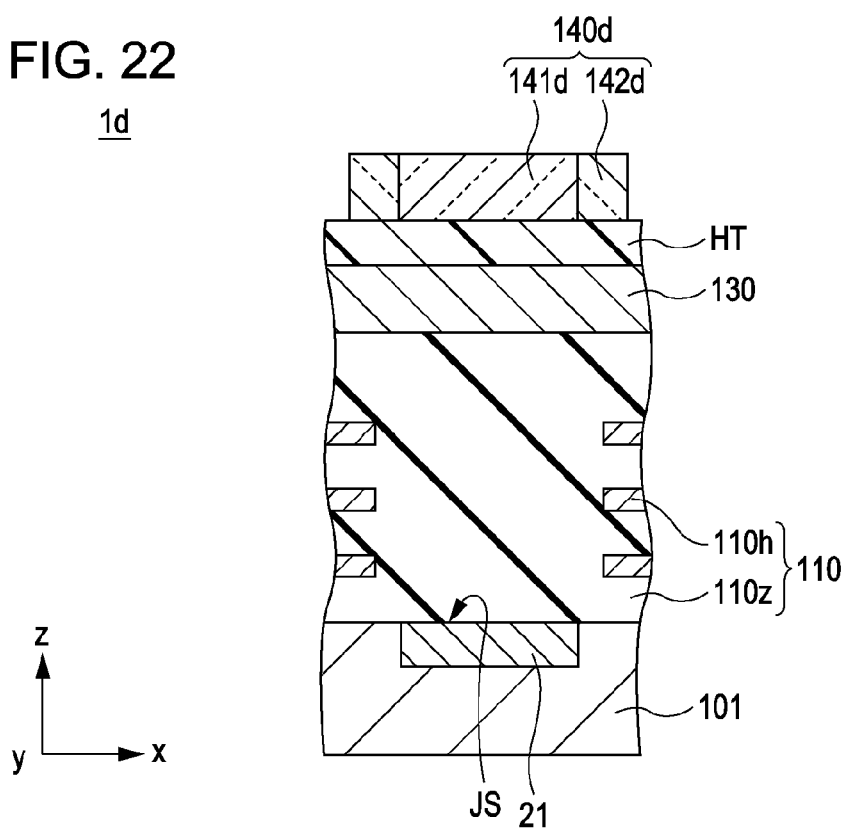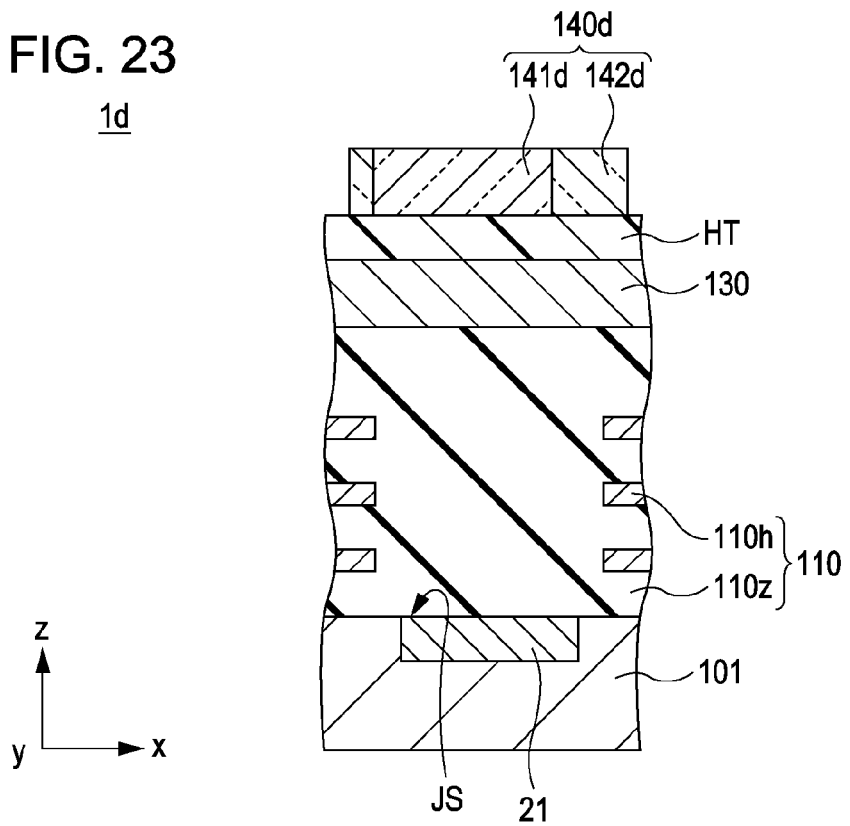

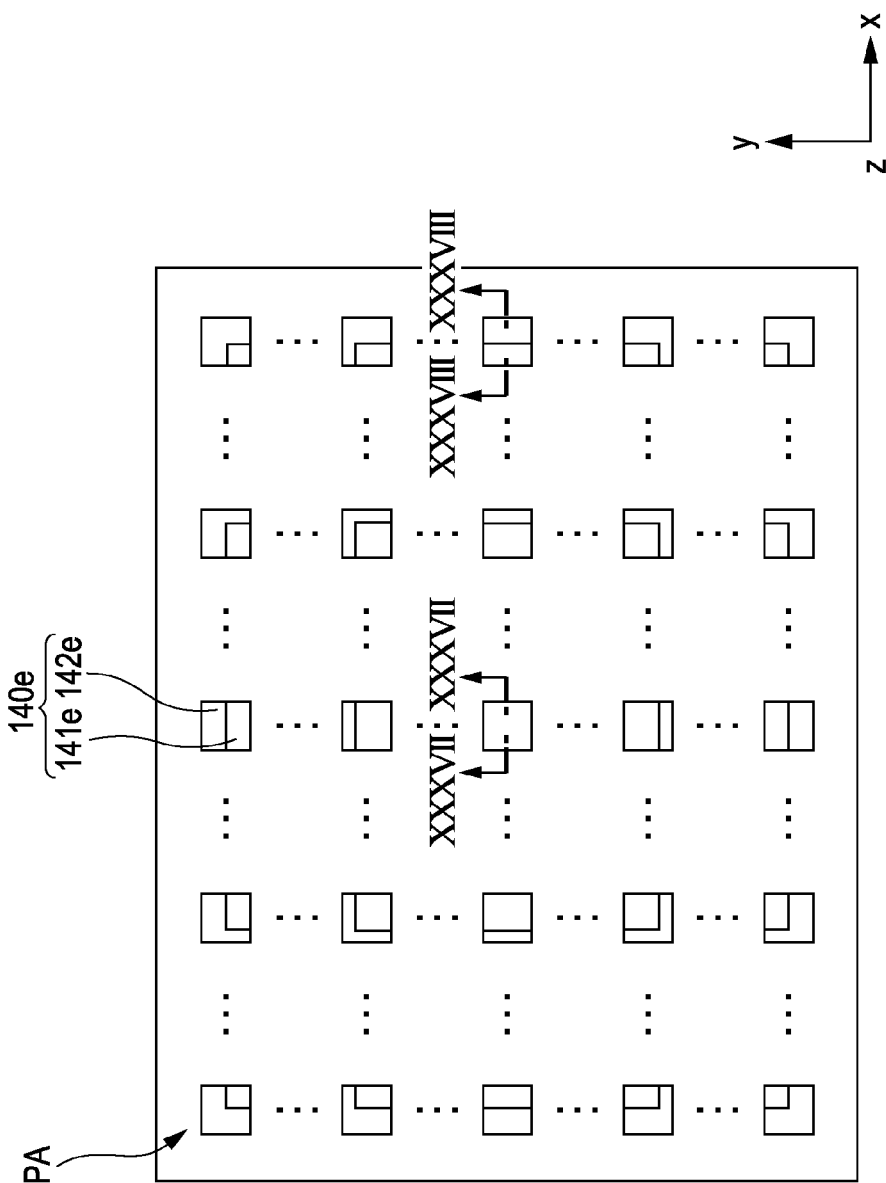

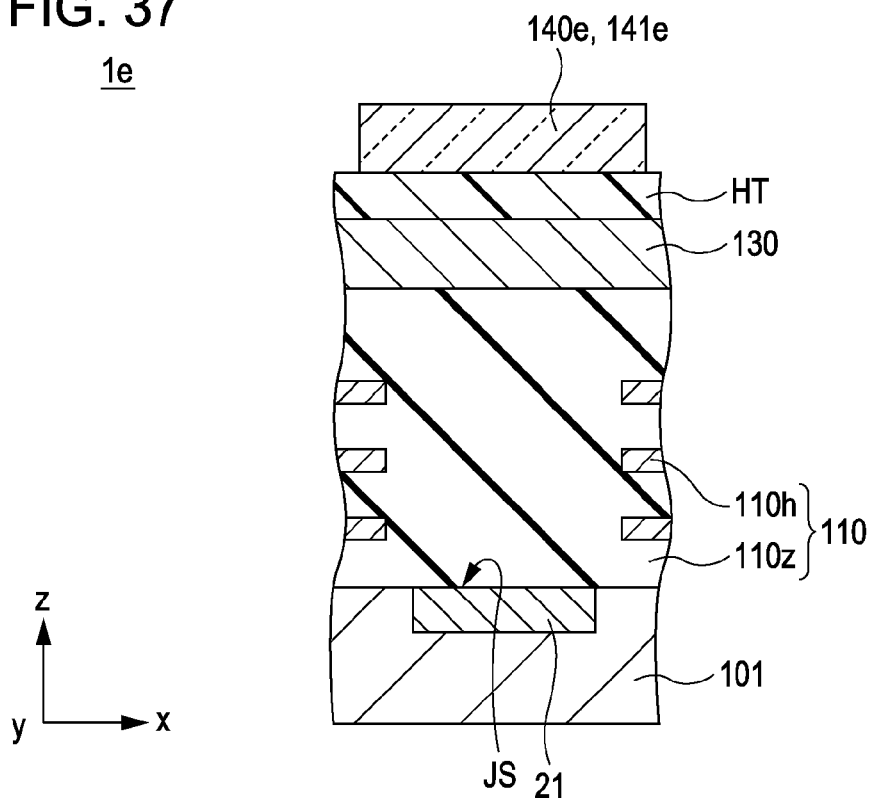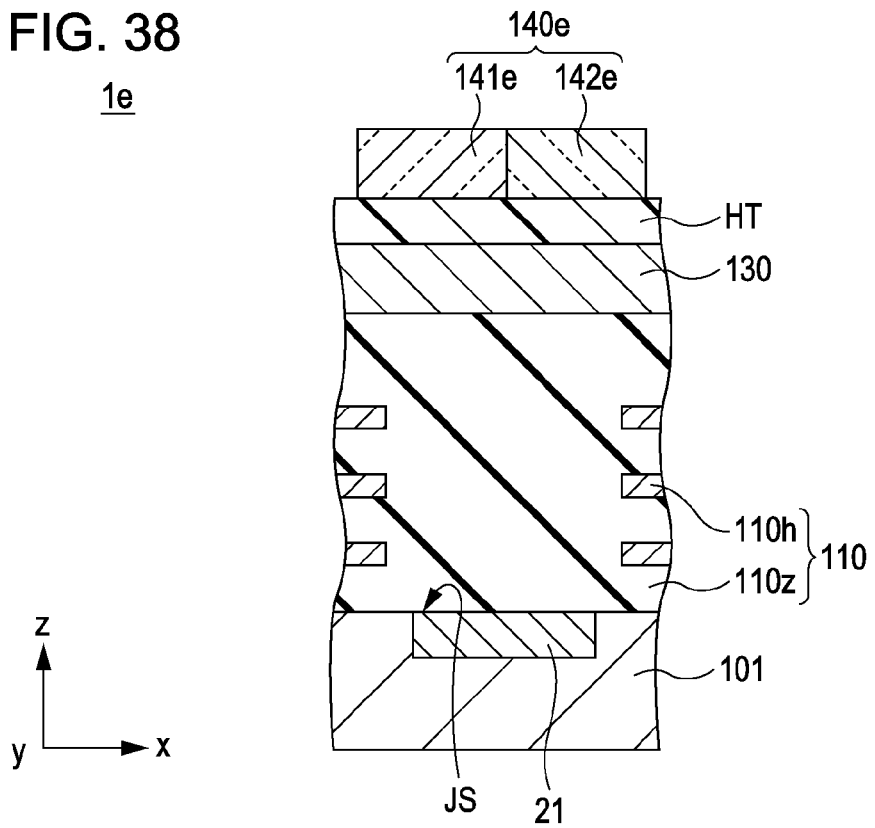

SOLID-STATE IMAGING DEVICE, METHOD OF MANUFACTURING SOLID-STATE IMAGING DEVICE, AND ELECTRONIC EQUIPMENT

CROSS-REFERENCE TO RELATED APPLICATIONS

This application is a divisional of U.S. patent application Ser. No. 12/906,627, filed Oct. 18, 2010, which claims priority to Japanese Patent Application Serial No. JP 2009-246866, filed in the Japan Patent Office on Oct. 27, 2009, the entire disclosures of which are hereby incorporated herein by reference.

BACKGROUND OF THE INVENTION

1. Field of the Invention

The present invention relates to a solid-state imaging device, a method of producing the solid-state imaging device, and a piece of electronic equipment.

2. Description of the Related Art

A piece of electronic equipment such as a digital video camera, digital camera or the like includes a solid-state imaging device. For example, as the solid-state imaging device, a CMOS (Complementary Metal Oxide Semiconductor) type image sensor and a CCD (Charge Coupled Device) type image sensor are included.

In the solid-state imaging device, a capturing area in which a plurality of pixels is arranged in a matrix shape is provided on a surface of a semiconductor substrate. Photoelectric transformation portions are provided on each of the plurality of pixels. The photoelectric transformation portions are, for example, photodiodes, and create a signal electric charge by receiving light, which is incident via an externally attached optical system, at a light sensing surface to perform a photoelectric transformation.

In the solid-state imaging device, a micro lens is disposed at an upper part of the light sensing surface of the photoelectric transformation portion, so that the incident light is concentrated to the light sensing surface by the micro lens.

Since the sensitivity difference is generated between a center portion of the capturing area and the surrounding portion thereof in the solid-state imaging device, the image quality of the captured image declines.

Specifically, in the center portion of the capturing area, the angle of the main ray, which is incident via the externally attached optical system, is nearly perpendicular to the light sensing surface in the center portion of the capturing area, whereas the angle of the incident main ray slopes in the surrounding portion of the capturing area. For this reason, the center portion of the captured image becomes a light image and the surrounding portion becomes a dark image, whereby the image quality of the captured image declines. That is, a so-called shading phenomenon is generated, whereby the image quality declines.

In addition, in a case where the color image is captured, when the incident light is incident obliquely with respect to the light sensing surface, the incident light is not incident to just below the light sensing surface but is naturally incident to other light sensing surface that receive the colored light of other color. For this reason, a so-called "mixed color" is generated, and the deviation of shade is generated in the captured color image, whereby the image quality declines.

Particularly, in electronic equipment used for a miniaturized mobile application such as a mobile phone with a camera, since the distance between the externally attached optical system and the light sensing surface of the image sensor is short, the occurrence of the disadvantage as above may become an issue.

In order to improve the disadvantage, the correction of the arrangement of the micro lens or the like called "pupil correction" is carried out. For example, it is carried out to provide the micro lens so that the position of the micro lens disposed around the capturing area is shifted to the center side of the capturing area with respect to the light sensing surface (e.g., Japanese Patent No. 2600250 and Japanese Unexamined Patent Application Publication No. 2003-273342).

As the above-mentioned micro lens, a refraction type lens, which uses the refraction of the surface, such as a spherical lens and a Fresnel lens is used.

In addition, as the above-mentioned micro lens, lenses, which do not use the refraction of the surface, such as a refractive index profile type lens or a diffractive lens are used. Herein, a digital lens having a rectangular sectional shape is provided as the micro lens (e.g., see Japanese Unexamined Patent Application Publication Nos. 2005-203526, 2006-344752, 2006-351972, 2008-10773, 2008-16722, and 2009-15315).

For example, the micro lens includes a plurality of layers with different refractive indexes, and the plurality of layers is alternately arranged in a transverse direction perpendicular to an optical axis of the micro lens. Furthermore, the micro lens is configured by providing the plurality of layers with different refractive indexes in a depth direction along the optical axis of the micro lens. The micro lens is a concentration element (SWLL: Subwave Length Lens) which has a periodic structure of a wavelength order or a sub wavelength area smaller than that, and a high concentration efficiency can be realized by a thin film.

SUMMARY OF THE INVENTION

However, in a micro lens such as the above-mentioned digital lens, a micro machining of 0.1 µm unit is necessary to realize the high concentration efficiency. For this reason, it is difficult to produce the lenses using existing facilities. Furthermore, a disadvantage such as a decline in production efficiency or a decline in reliability of the product may occur. As a result, an increase in cost may occur.

In addition, along with this, it is difficult to realize high concentration efficiency, whereby the image quality of the captured image may decline.

Thus, according to an embodiment of the present invention, there is provided a solid-state imaging device, a method of producing the solid-state imaging device, and a piece of electronic equipment which can improve production efficiency and can improve the image quality of the captured image.

A solid-state imaging device according to an embodiment of the present invention includes a photoelectric transformation portion which is provided on a capturing surface of a substrate and receives an incident light by a light sensing surface to create a signal electric charge; and a micro lens which is provided on an upper part of the light sensing surface in the capturing surface of the substrate and concentrates the incident light to the light sensing surface, wherein the micro lens has a first refractive index layer which is a first refractive index; and a second refractive index layer which is a second refractive index different from the first refractive index, wherein the micro lens is configured so that a vertical cross section, which is a surface perpendicular to the capturing surface, has a rectangular shape, wherein both the first refractive index layer and the second refractive index layer are arranged adjacent to each other in a direction along the capturing surface, an interface between the first refractive index layer and the second refractive index layer in the vertical cross section is formed so as to follow a direction perpendicular to the capturing surface, and wherein the incident light is incident from a third refractive index layer, which is a third refractive index lower than the first refractive index and the second refractive index, to the first refractive index layer and the second refractive index layer, and is concentrated to the light sensing surface.

A piece of electronic equipment according to an embodiment of the present invention includes a photoelectric transformation portion which is provided on a capturing surface of a substrate and receives an incident light by a light sensing surface to create a signal electric charge; and a micro lens which is provided at an upper part of the light sensing surface in the capturing surface of the substrate and concentrates the incident light to the light sensing surface, wherein the micro lens has a first refractive index layer which is a first refractive index, and a second refractive index layer which is a second refractive index different from the first refractive index, wherein the micro lens is configured so that a vertical cross section, which is a surface perpendicular to the capturing surface, has a rectangular shape, wherein each of the first refractive index layer and the second refractive index layer are arranged adjacently to each other in a direction along the capturing surface, and an interface between the first refractive index layer and the second refractive index layer in the vertical cross section is formed so as to follow the direction perpendicular to the capturing surface, and wherein the incident light is incident from a third refractive index layer, which is a third refractive index lower than the first refractive index and the second refractive index, to the first refractive index layer and the second refractive index layer, and is concentrated to the light sensing surface.

A method of producing a solid-state imaging device according to an embodiment of the present invention includes a photoelectric transformation portion forming process that provides a photoelectric transformation portion, which receives an incident light by a light sensing surface to create a signal electric charge, on a capturing surface of a substrate; and a micro lens forming process which provides a micro lens, which concentrates the incident light to the light sensing surface, on an upper part of the light sensing surface so that a vertical cross section, which is a surface perpendicular to the capturing surface, becomes a rectangular shape, wherein the micro lens forming process has the steps of forming a first refractive index layer which is a first refractive index, and forming a second refractive index layer which is a second refractive index different from the first refractive index, wherein in the steps of: forming the first refractive index layer and the second refractive index layer, the first refractive index layer and the second refractive index layer are formed so that both the first refractive index layer and the second refractive index layer are arranged adjacent to each other in a direction along the capturing surface, an interface between the first refractive index layer and the second refractive index layer in the vertical cross section follows the direction perpendicular to the capturing surface, and the incident light is incident from a third refractive index layer, which is a third refractive index lower than the first refractive index and the second refractive index, to the first refractive index layer and the second refractive index layer and is concentrated to the light sensing surface.

In the embodiment of the present invention, the micro lens, which concentrates the incident light to the light sensing surface, is provided at the upper part of the light sensing surface so that the vertical cross section, which is the surface perpendicular to the capturing surface, becomes a rectangular shape. In forming the micro lens, the first refractive index layer which is the first refractive index is formed. Furthermore, the second refractive index layer, which is a second refractive index different from the first refractive index, is formed. Herein, each of the first refractive index layer and the second refractive index layer are formed so as to be arranged adjacent to each other in the direction along the capturing surface. Moreover, the interface between the first refractive index layer and the second refractive index layer in the vertical cross section is formed so as to follow the direction perpendicular to the capturing surface. As a result, the incident light is incident from the third refractive index layer, which is the third refractive index lower than the first refractive index and the second refractive index, to the first refractive index layer and the second refractive index layer and is concentrated to the light sensing surface.

According to the embodiment of the present invention, it is possible to provide a solid-state imaging device, a method of producing the solid-state imaging device, and a piece of electronic equipment in which the production efficiency and the like can be improved, which can improve the image quality of the captured image.

BRIEF DESCRIPTION OF THE DRAWINGS

FIG. 17 is a diagram illustrating the principal parts of a solid-state imaging device in a second embodiment relating to the present invention;

FIG. 21 is a diagram illustrating the principal parts of a solid-state imaging device in a fourth embodiment relating to the present invention;

FIG. 22 is a diagram illustrating the principal parts of a solid-state imaging device in a fourth embodiment relating to the present invention;

FIG. 23 is a diagram illustrating the principal parts of a solid-state imaging device in a fourth embodiment relating to the present invention;

FIG. 36 is a diagram illustrating the principal parts of a solid-state imaging device in a sixth embodiment relating to the present invention;

FIG. 37 is a diagram illustrating the principal parts of a solid-state imaging device in a sixth embodiment relating to the present invention;

FIG. 38 is a diagram illustrating the principal parts of a solid-state imaging device in a sixth embodiment relating to the present invention;

DESCRIPTION OF THE PREFERRED EMBODIMENTS

Hereinafter, embodiments of the present invention will be described with reference to the drawings.

In addition, the description will be performed in the following sequence.

1. First Embodiment (a case where a second refractive index layer exists around a first refractive index layer)

2. Second Embodiment (a case where a second refractive layer covers a upper surface of a first refractive index layer)

3. Third Embodiment (a case where a first refractive index layer covers a upper surface of a second refractive index layer)

4. Fourth Embodiment (a case where a pupil correction is performed in regard to the first embodiment)

5. Fifth Embodiment (a case where a center is only a second refractive index layer)

6. Sixth Embodiment (a case where a center is only a first refractive index layer)

7. Seventh Embodiment (a case where a production method is different from the first embodiment)

8. Eighth Embodiment (a case where a production method is different from the second embodiment)

9. Ninth Embodiment (a case where a production method is different from the third embodiment)

10. The Rest

<1. First Embodiment>

(A) Device Configuration (A-1) Principal Part Configuration of Camera

Figure 1:
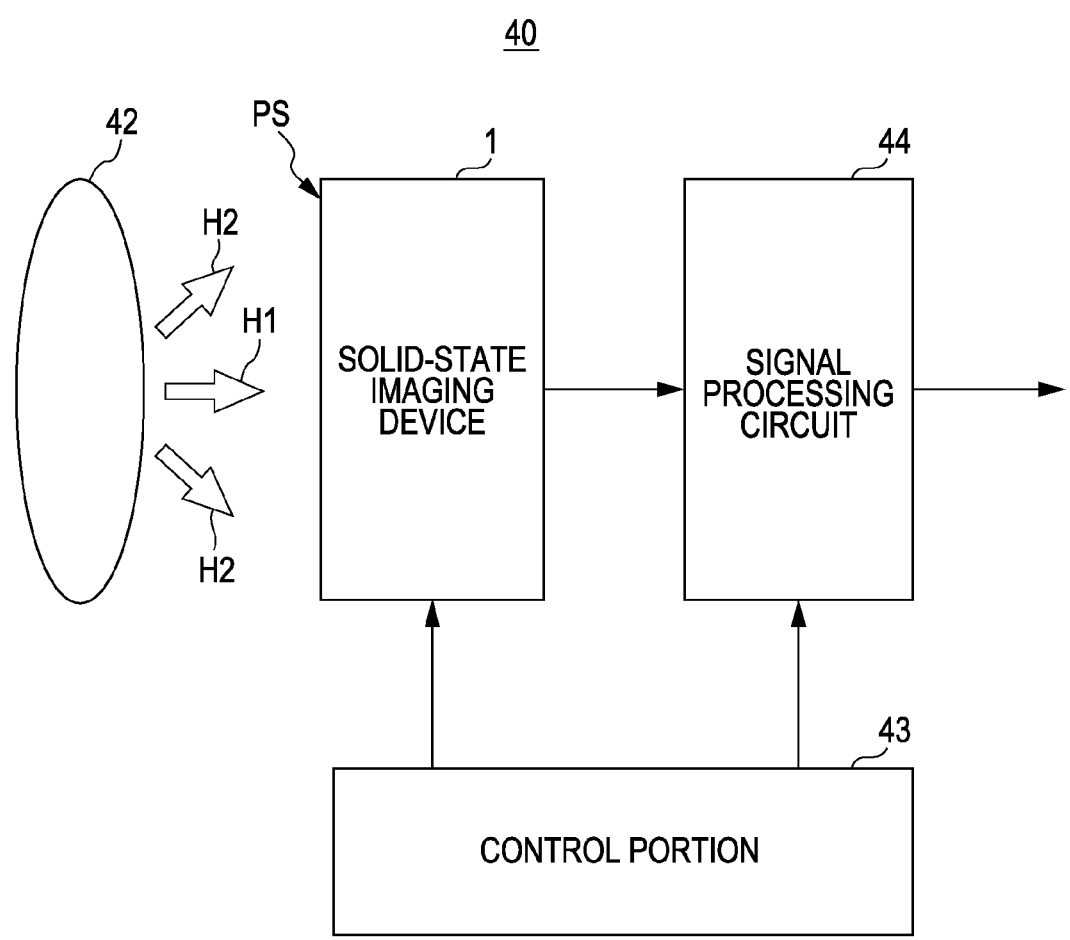
FIG. 1 is a configuration diagram illustrating a configuration of a camera in a first embodiment relating to the present invention.

FIG. 1 is a configuration diagram illustrating a configuration of a camera 40 in a first embodiment relating to the present invention.

As shown in FIG. 1, the camera 40 has a solid-state imaging device 1, an optical system 42, a control portion 43, and a signal processing circuit 44. Each portion will be sequentially described.

The solid-state imaging device 1 creates a signal electric charge by receiving light (subject image), which is incident via the optical system 42, at a capturing surface PS and performing the photoelectric transformation. Herein, the solid-state imaging device 1 is driven based on the control signal that is output from the control portion 43. Specifically, the signal electric charge is read and output as low data.

In the present embodiment, as shown in FIG. 1, in the solid-state imaging device 1, in a center portion of the capturing surface PS, a main ray H1 emitted from the optical system 42 is incident at an angle perpendicular to the capturing surface PS. On the other hand, in the surrounding portion of the capturing surface PS, a main ray H2 is incident at an angle sloped with respect to a direction perpendicular to the capturing surface PS of the solid-state imaging device 1. Herein, the main ray H2 of the incident light slopes from the center of the capturing surface PS toward the surroundings thereof.

The optical system 42 includes optical members such as an image forming lens or an aperture, and is disposed so as to concentrate the light by the incident subject image to the capturing surface PS of the solid-state imaging device 1.

In the present embodiment, the optical system 42 is provided so that the optical axis thereof corresponds to the center of the capturing surface PS of the solid-state imaging device 1. For this reason, as shown in FIG. 1, the optical system 42 emits the main ray H1 at an angle perpendicular to the capturing surface PS with respect to the center portion of the capturing surface PS of the solid-state imaging device 1. On the other hand, the optical system 42 emits the main ray H2 at an angle sloped to the direction perpendicular to the capturing surface PS with respect to the surrounding portion of the capturing surface PS. This is due to the fact that an emission pupil distance formed by the aperture is limited.

The control portion 43 outputs various control signals to the solid-state imaging device 1 and the signal processing circuit 44, thereby controlling and driving the solid-state imaging device 1 and the signal processing circuit 44.

The signal processing circuit 44 is configured so as to create a digital image with respect to the subject image by performing the signal processing with respect to the low data which is output from the solid-state imaging device 1.

(A-2) Principal Part Configuration of Solid-State Imaging Device

The overall configuration of the solid-state imaging device 1 will be described.

Figure 2:
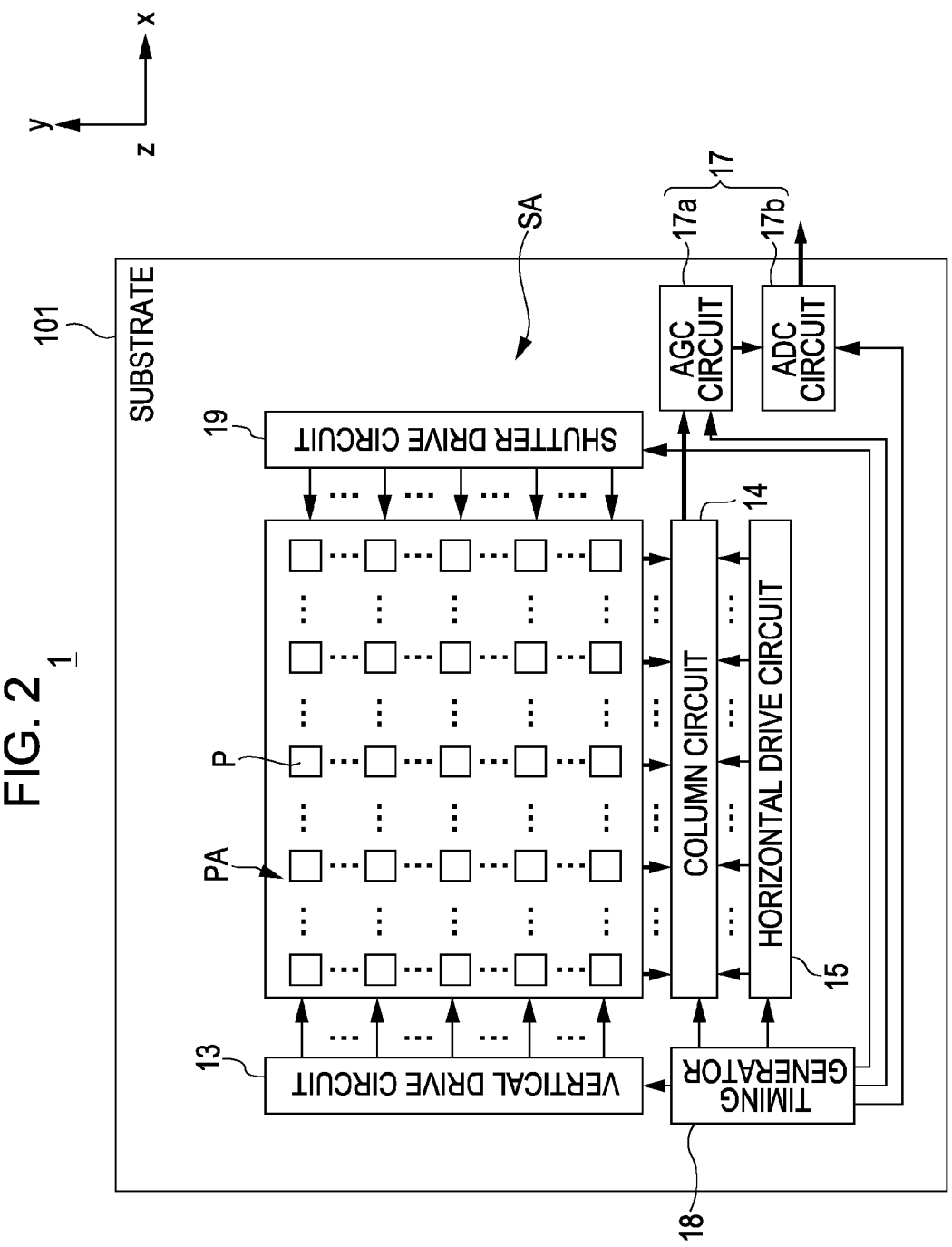
FIG. 2 is a block diagram illustrating the overall configuration of a solid-state imaging device in a first embodiment relating to the present invention.
Figure 3:
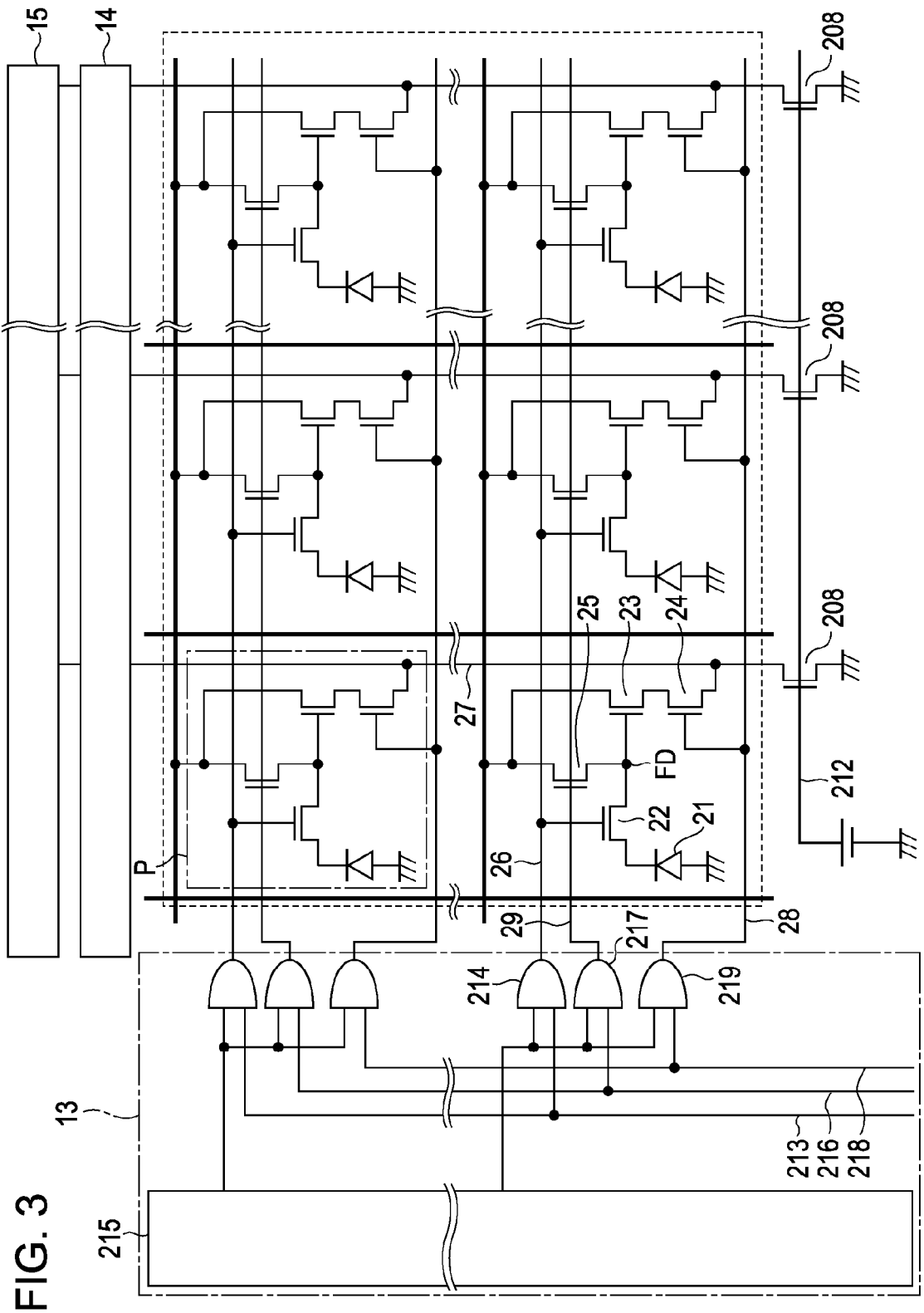
FIG. 3 is a diagram illustrating the principal parts of a circuit configuration of a solid-state imaging device in a first embodiment relating to the present invention.

FIG. 2 is a block diagram illustrating the overall configuration of the solid-state imaging device 1 in a first embodiment relating to the present invention. FIG. 3 is a diagram illustrating principal parts of a circuit configuration of the solid-state imaging device 1 in a first embodiment relating to the present invention.

The solid-state imaging device 1 of the present embodiment is a CMOS type image sensor, and includes a substrate 101 as shown in FIG. 2. The substrate 101 is, for example a semiconductor substrate formed of silicon. As shown in FIG. 2, a capturing area PA and a surrounding area SA are provided on the surface of the substrate 101.

As shown in FIG. 2, the capturing area PA has a rectangular shape, and a plurality of pixels P is disposed in each of a horizontal direction x and in a vertical direction y. That is, the pixels P are arranged in a matrix shape. In addition, in the capturing area PA, the center thereof is disposed so as to correspond to the optical axis of the optical system 42 shown in FIG. 1.

The capturing area PA corresponds to the capturing surface PS shown in FIG. 1. For this reason, as described above, in the pixel P disposed at the center portion in the capturing area PA, the main ray (H1 of FIG. 1) is incident at an angle perpendicular to the surface of the capturing area PA. On the other hand, in the pixel P disposed at the surrounding portion in the capturing area PA, the main ray (H2 of FIG. 1) is incident at an angle sloped with respect to the direction perpendicular to the surface of the capturing area PA.

As shown in FIG. 3, the pixel P provided in the capturing area PA includes a photodiode 21, a transmission transistor 22, an amplification transistor 23, a selection transistor 24, and a reset transistor 25. That is, there are provided the photodiode 21 and a pixel transistor, which performs the operation of reading the signal electric charge from the photodiode 21. In the pixel transistor, an active area is formed on the substrate 101, and each gate electrode is formed, for example, using polysilicon.

In the pixel P, the photodiode 21 receives the light due to the subject image and performs photoelectric transformation of the received light, thereby creating and accumulating the signal electric charge. As shown in FIG. 3, the photodiode 21 is connected to the gate of the amplification transistor 23 via the transmission transistor 22. In addition, in the photodiode 21, the accumulated electric charge is transmitted to a floating diffusion FD connected to the gate of the amplification transistor 23 as the output signal by the transmission transistor 22.

In the pixel P, the transmission transistor 22 is configured so as to output the signal electric charge created in the photodiode 21 to the gate of the amplification transistor 23 as electric signal. Specifically, as shown in FIG. 3, the transmission transistor 22 is provided so as to be interposed between the photodiode 21 and the floating diffusion FD. In addition, the transmission signal is sent from a transmission line 26 to the gate, whereby the transmission transistor 22 transmits the signal electric charge accumulated in the photodiode 21 to the floating diffusion FD as the output signal.

In the pixel P, the amplification transistor 23 is configured so as to amplify and output the electric signal that is output from the transmission transistor 22. Specifically, as shown in FIG. 3, in the amplification transistor 23, the gate is connected to the floating diffusion FD. In the amplification transistor 23, a drain is connected to a power source electric potential supply line Vdd and a source is connected to the selection transistor 24. When the selection transistor 24 is selected so as to be an ON state, the amplification transistor 23 is supplied with the constant current from a constant current source (not shown) provided other than the capturing area PA and is operated as a source follower. For this reason, the selection signal is supplied to the selection transistor 24, whereby the output signal that is output from the floating diffusion FD is amplified in the amplification transistor 23.

In the pixel P, the selection transistor 24 is configured so as to output the electric signal output by the amplification transistor 23 to a vertical signal line 27, when the selection signal is input. Specifically, as shown in FIG. 3, in the selection transistor 24, the gate is connected to an address line 28 which is supplied with the selection signal. The selection transistor 24 enters the ON state when the selection signal is supplied, thereby outputting the output signal amplified by the amplification transistor 23 as described above to the vertical signal line 27.

In the pixel P, the reset transistor 25 is configured so as to reset the gate electric potential of the amplification transistor 23. Specifically, as shown in FIG. 3, in the reset transistor 25, the gate is connected to a reset line 29 which is supplied with the reset signal. Furthermore, in the reset transistor 25, the drain is connected to the power supply electric potential supply line Vdd, and the source is connected to the floating diffusion FD. In addition, when the reset signal is supplied from the reset line 29 to the gate, the reset transistor 25 resets the gate electric potential of the amplification transistor 23 to the power supply electric potential via the floating diffusion FD.

As shown in FIG. 2, the surrounding area SA is situated around the capturing area PA. In addition, peripheral circuits are provided in the surrounding area SA.

Specifically, as shown in FIG. 2, a vertical drive circuit 13, a column circuit 14, a horizontal drive circuit 15, an external output circuit 17, a timing generator (TG) 18, and a shutter drive circuit 19 are provided as peripheral circuits.

As shown in FIG. 2, the vertical drive circuit 13 is provided at a side part of the capturing area PA in the surrounding area SA, and is configured so as to select and drive the pixel P of the capturing area PA in a line unit. Specifically, as shown in FIG. 3, the vertical drive circuit 13 includes a vertical selection unit 215, and a plurality of first line selection AND terminals 214, second line selection AND terminals 217, and third line selection AND terminals 219 is provided so as to correspond to the lines of the pixel P.

In the vertical drive circuit 13, the vertical selection unit 215 includes, for example, a shift register, and as shown in FIG. 3, is electrically connected to the first line selection AND terminals 214, the second line selection AND terminals 217, and the third line selection AND terminals 219. The vertical selection unit 215 outputs the control signal to the first line selection AND terminals 214, the second line selection AND terminals 217, and the third line selection AND terminals 219 so as to sequentially select and drive each line of the pixel P.

As shown in FIG. 3, in the vertical drive circuit 13, one input end of the first line selection AND terminal 214 is connected to the vertical selection unit 215. In addition, the other input end thereof is connected to a pulse terminal 213 which supplies the transmission signal. In addition, the output end thereof is connected to the transmission line 26.

As shown in FIG. 3, in the vertical drive circuit 13, one input end of the second line selection AND terminal 217 is connected to the vertical selection unit 215. In addition, the other input end thereof is connected to the pulse terminal 216 which supplies the reset signal. In addition, the output end thereof is connected to the reset line 29.

As shown in FIG. 3, in the vertical drive circuit 13, one input end of the third line selection AND terminal 219 is connected to the vertical selection unit 215. In addition, the other end thereof is connected to the pulse terminal 218 which supplies the selection signal. In addition, the output end thereof is connected to the address line 28.

As shown in FIG. 2, the column circuit 14 is provided at a lower end portion of the capturing area PA in the surrounding area SA and carries out the signal processing with respect to the signal output from the pixel P in the row unit. As shown in FIG. 3, the column circuit 14 is electrically connected to the vertical signal line 27 and carries out the signal processing with respect to the signal output via the vertical signal line 27. Herein, the column circuit 14 includes a CDS (Correlated Double Sampling) circuit (not shown) and carries out the signal processing that removes the fixed pattern noise.

As shown in FIG. 2, the horizontal drive circuit 15 is electrically connected to the column circuit 14. The horizontal drive circuit 15 includes, for example, a shift register, and sequentially outputs the signal maintained for each row of the pixel P in the column circuit 14 to the external output circuit 17.

As shown in FIG. 2, the external output circuit 17 is electrically connected to the column circuit 14 and outputs the signal to the outside after carrying out the signal processing with respect to the signal output from the column circuit 14. The external output circuit 17 includes an AGC (Automatic Gain Control) circuit 17a and an ADC circuit 17b. In the external output circuit 17, after the AGC circuit 17a applies the gain to the signal, the ADC circuit 17b is converted from analog signal to digital signal and outputs the signal to the outside.

As shown in FIG. 2, the timing generator 18 is electrically connected to each of the vertical drive circuit 13, the column circuit 14, the horizontal drive circuit 15, the external output circuit 17, and the shutter drive circuit 19. The timing generator 18 creates various timing signals and outputs the signals to the vertical drive circuit 13, the column circuit 14, the horizontal drive circuit 15, the external output circuit 17, and the shutter drive circuit 19, thereby performing the drive control with respect to each portion.

The shutter drive circuit 19 is configured so as to select the pixel P in a line unit, thereby adjusting the light exposure time in the pixel P.

In addition, in the surrounding area SA, a plurality of transistors 208 for supplying the vertical signal line 27 with constant current is provided corresponding to each of the plurality of vertical signal lines 27. The transistors 208 is operated so that the gate is connected to a constant electric potential supply line 212 and constant electric potential is applied to the gate by the constant electric potential supply line 212 to supply the constant current. The transistor 208 supplies the amplification transistor 23 of the selected pixel with the constant current to make it the source follower. As a result, the electric potential having a certain voltage different from the electric potential of the amplification transistor 23 appears in the vertical signal line 27.

Figure 4:
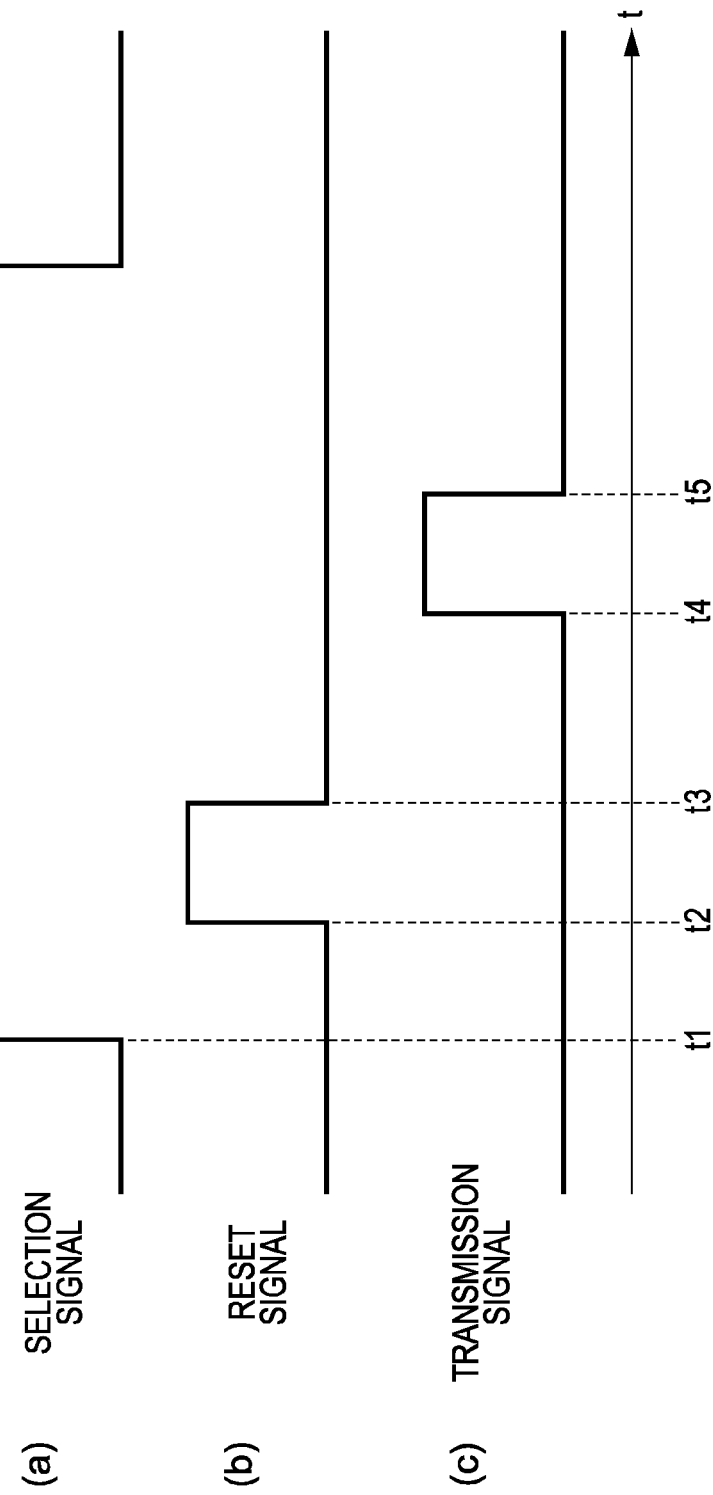
FIG. 4 is a timing chart which illustrates a pulse signal supplied to the respective portions when reading a signal from a pixel in a first embodiment relating to the present invention.

FIG. 4 is a timing chart illustrating the pulse signal which is supplied to each portion when reading the signal from the pixel P in a first embodiment according to the present invention. In FIG. 4, (a) illustrates the selection signal, (b) illustrates the reset signal, and (c) illustrates the transmission signal.

Firstly, as shown in FIG. 4, in a first point of time t1, the selection transistor 24 is set to a conductive state. In addition, in a second point of time t2, the reset transistor 25 is set to the conductive state. As a result, the gate electric potential of the amplification transistor 23 is reset.

Next, in a third point of time t3, the reset transistor 25 is set to be in a non-conductive state. In addition, after that, the voltage corresponding to the reset level is read to the column circuit 14.

Next, in a fourth point of time t4, the transmission transistor 22 is set to be in the conductive state, whereby the signal electric charge accumulated in the photodiode 21 is transmitted to the gate of the amplification transistor 23.

Next, in a fifth point of time t5, the transmission transistor 22 is set to be in the non-conductive state. In addition, after that, the voltage of the signal level corresponding to an amount of the accumulated signal electric charge is read to the column circuit 14.

In the column circuit 14, the reset level read in advance and the signal level read later are subjected to a differential process to accumulate the signal. As a result, a fixed pattern noise, which is generated by imbalance and the like of Vth of each transistor provided for each pixel P, is cancelled.

Each gate of the respective transistors 22, 24, and 25 is connected in the line unit including the plurality of pixels arranged in the horizontal direction x, so that the operation of driving the pixel as described above is performed concurrently with respect to the plurality of pixels arranged in the line unit. Specifically, the pixel is sequentially selected in the vertical direction in the horizontal line (pixel line) unit by the selection signal supplied by the vertical drive circuit 13 described above. In addition, the transistors of each pixel are controlled by various timing signals that are output from the timing generator 18. As a result, the output signals in each pixel are read to the column circuit 14 for each pixel row through the vertical signal line 27.

In addition, the signal accumulated in the column circuit 14 is selected by the horizontal drive circuit 15 and is sequentially output to the external output circuit 17.

(A-3) Detailed Configuration of Solid-State Imaging Device

The detailed content of the solid-state imaging device 1 relating to the present invention will be described.

Figure 5:
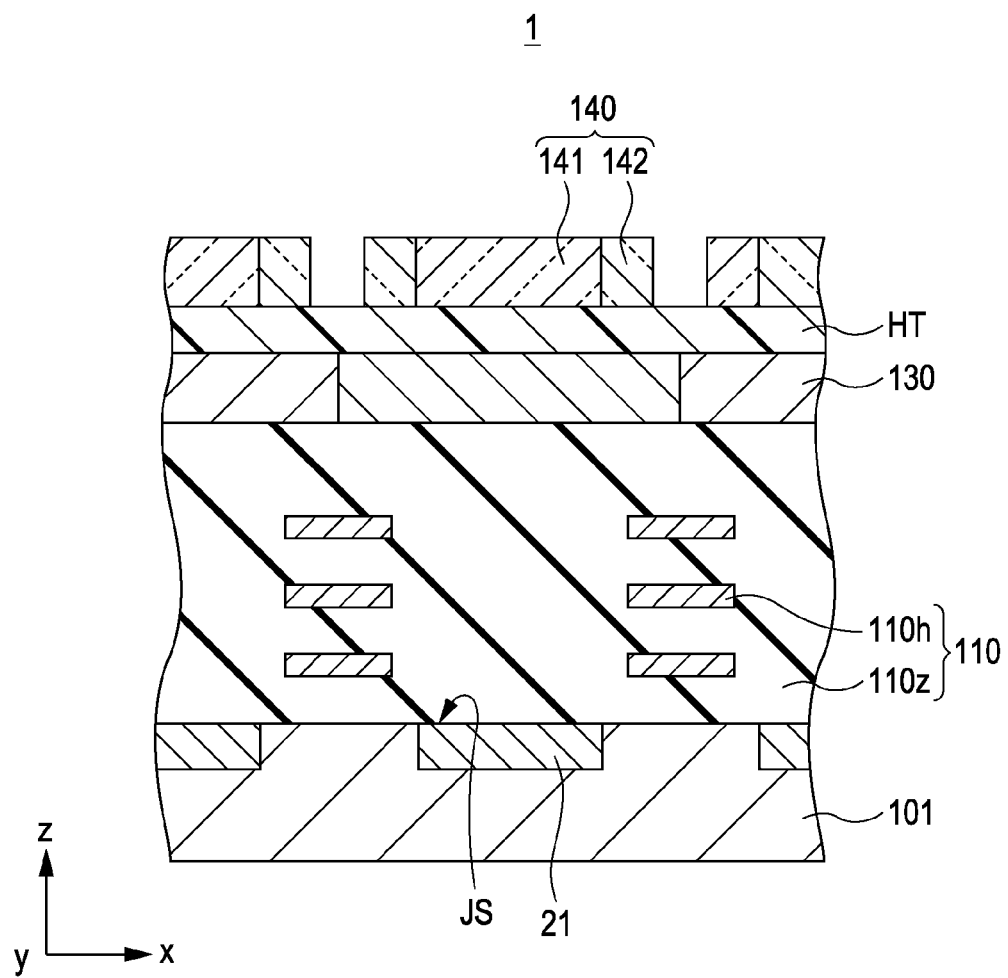
FIG. 5 is a diagram illustrating the principal parts of a solid-state imaging device in a first embodiment relating to the present invention.

FIG. 5 is a diagram illustrating principal parts of the solid-state imaging device 1 in the first embodiment according to the present invention.

Herein, FIG. 5 illustrates the cross section of the capturing area PA.

As shown in FIG. 5, the solid-state imaging device 1 includes the photodiode 21, the color filter 130, and the micro lens 140. In addition, the transmission transistor 22, the amplification transistor 23, the selection transistor 24, and the reset transistor 25 (see FIG. 3) constituting the pixel P, are also formed in the capturing area PA, but are not shown herein for convenience of description.

The respective portions will be sequentially described.

(A-3-1) Photodiode 21

In the solid-state imaging device 1, as shown in FIG. 5, the photodiode 21 is provided at the capturing surface of the substrate 101. The photodiode 21 is configured so as to receive the incident light at the light sensing surface JS and performs the photoelectric transformation, thereby creating the signal electric charge. A plurality of photodiodes 21 is disposed at the surface of the substrate 101 so as to correspond to each of the plurality of pixels P shown in FIG. 2.

Furthermore, as shown in FIG. 5, the plurality of photodiodes 21 is arranged at intervals so as to correspond to the plurality of pixels P shown in FIG. 2. That is, the photodiodes 21 are not shown in FIG. 2, but are provided so as to correspond to the pixels P which are arranged in each of the horizontal direction x and in the vertical direction y perpendicular to the horizontal direction x in the capturing area PA. In the photodiode 21, the light sensing surface JS is formed in a quadrangle shape.

In addition, as shown in FIG. 5, a wiring layer 110 is provided at an upper part of the substrate 101 with the photodiode 21 formed thereon. In the wiring layer 110, a wiring 110h, which is electrically connected to each element, is formed in an insulation layer 110z. The insulation layer 110z is formed by a light transmitting material that is permeable to light. For example, the insulation layer 110z is formed of a silicon dioxide film (refractive index n=1.43). Furthermore, the wiring 110h is formed by a conductive material such as a metal. Each wiring 110h functions as the wirings such as the transmission line 26, the address line 28, the vertical signal line 27, and the reset line 29 as shown in FIG. 3. Moreover, each wiring 110h is formed at a portion other than the portion situated at the upper part of the light sensing surface JS at the upper part of the surface of the substrate 101, and the portion corresponding to the light sensing surface JS functions as an opened light shielding portion.

In addition, at the upper part of the photodiode 21, as shown in FIG. 5, the color filter 130 and the micro lens 140 are disposed. For this reason, the photodiode 21 receives the incident light, which is sequentially incident via the micro lens 140 and the color filter 130, at the light sensing surface JS.

(A-3-2) Color Filter 130

In the solid-state imaging device 1, as shown in FIG. 5, the color filter 130 is formed so as to be situated on the wiring layer 110 at the upper part of the surface of the substrate 101.

The color filter 130 is configured so as to color the incident light according to the subject image and transmit the incident light to the surface of the substrate 101. For example, the color filter 130 is formed by a coating liquid including a coloring pigment and a photoresist resin by a coating method such as a spin coat method and forming a coating film, and then pattern working the coating film by a lithographic technique.

Figure 6:
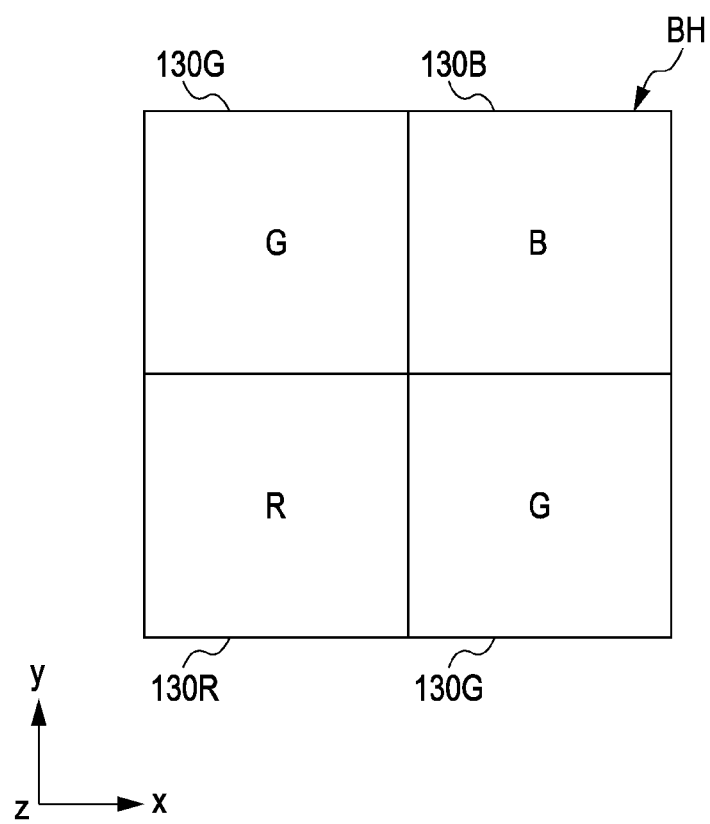
FIG. 6 is a diagram illustrating a color filter in a first embodiment relating to the present invention.

FIG. 6 is a diagram illustrating a color filter 130 in a first embodiment relating to the present invention. In FIG. 6, the upper surface of the color filter 130 is shown.

As shown in FIG. 6, the color filter 130 includes a red filter layer 130R, a green filter layer 130G, and a blue filter layer 130B. In addition, any one of the red filter layer 130R, the green filter layer 130G, and the blue filter layer 130B is provided at each pixel P as the color filter 130.

Herein, as shown in FIG. 6, each of the red filter layer 130R, the green filter layer 130G, and the blue filter layer 130B are disposed so as to be arranged in a Bayer array BH. That is, a plurality of green filter layers 130G is arranged in rows in a diagonal direction so as to be a checked pattern. In addition, the red filter layer 130R and the blue filter layer 130B are disposed so as to be arranged in a diagonal direction in the plurality of green filter layers 130G.

Specifically, in the color filter layer 130, the red filter layer 130R is configured so that optical transmittance is high in a wavelength range (e.g., 625 to 740 nm) corresponding to the color red and the incident light is colored red and is transmitted to the light sensing surface JS. As shown in FIG. 6, the red filter layer 130R is formed so that the plane configuration has a quadrangle shape. Herein, the red filter layer 130R is formed to have a square shape in which the width in the horizontal direction x is the same as the width in the vertical direction y.

Furthermore, in the color filter 130, the green filter layer 130G is configured so that optical transmittance is high in a wavelength range (e.g., 500 to 565 nm) corresponding to the color green and the incident light is colored green and is transmitted to the light sensing surface JS. As shown in FIG. 6, the green filter layer 130G has a plane structure formed of a quadrangle shape. Herein, the green filter layer 130G is formed so as to have a square shape in which the width in the horizontal direction x is the same as the width in the vertical direction y.

In the color filter 130, the blue filter layer 130B is configured so that optical transmittance is high in a wavelength range (e.g., 450 to 485 nm) corresponding to the color blue and the incident light is colored blue and is transmitted to the light sensing surface JS. The blue filter layer 130B has a plane structure formed of a quadrangle shape. Herein, the blue filter layer 130B is formed so as to be a square shape in which the width in the horizontal direction x is the same as the width in the vertical direction y.

In addition, in the color filter 130, as shown in FIG. 5, a planarized film HT is coated onto the upper surface thereof. For example, the planarized film HT is formed by applying an acrylic-based thermosetting resin by the spin coat method so as to cover the upper surface of the color filter 130, and then carrying out a heat treatment.

(A-3-3) Micro Lens 140

In the solid-state imaging device 1, as shown in FIG. 5, the micro lens 140 is formed on the planarized film HT covering the color filter 130 at the upper part of the surface of the substrate 101. The micro lens 140 is provided at the upper part of the light sensing surface JS and is configured so as to concentrate the incident light to the light sensing surface JS of the photodiode 21.

In the present embodiment, as shown in FIG. 5, the micro lens 140 includes the first refractive index layer 141 and the second refractive index layer 142, and a vertical cross section, which is a surface (xz surface) perpendicular to the capturing surface (xy surface), is a rectangular shape. That is, the micro lens 140 is a refractive index division type of digital micro lens (η lens). In the micro lens 140, the first refractive index layer 141 is formed by a light transmitting material which has a predetermined refractive index. In the present embodiment, the first refractive index layer 141 is formed by the use of a material having a refractive index higher than that of the material forming the second refractive index layer 142. As shown in FIG. 5, in the first refractive index layer 141, the vertical cross section (xz surface) perpendicular to the capturing surface (xy surface) is a rectangular shape. That is, the first refractive index layer 141 is formed so that the upper surface thereof follows the capturing surface (xy surface) and the side surface thereof follows a direction z perpendicular to the capturing surface (xy surface). In addition, the first refractive index layer 141 is provided so that the center of the vertical cross section corresponds to the center of the light sensing surface JS. Furthermore, the second refractive index layers 142 are provided at the side surfaces of the first refractive index layer 141.

In the micro lens 140, the second refractive index layers 142 are formed by the light transmitting material of the refractive index different from the first refractive index layer 141. In the present embodiment, the second refractive index layers 142 are formed by the material of a refractive index lower than that of the material forming the first refractive index layer 141.

As shown in FIG. 5, the second refractive index layers 142 are provided so as to surround the side surfaces of the first refractive index layer 141. In the second refractive index layers 142, the vertical cross sections (xz surfaces) perpendicular to the capturing surface (xy surface) are a rectangular shape, and are provided so that the cross sections of rectangular shape pinch the first refractive index layer 141 therebetween.

Specifically, the second refractive index layers 142 are formed so that the upper surfaces thereof follow the capturing surface (xy surface) and the inner side surface and the outer side surface follow the direction z perpendicular to the capturing surface (xy surface). Furthermore, the first refractive index layer 141 is formed at the inner part of the second refractive index layer 142. In addition, the second refractive index layer 142 is configured so that the overall center in the vertical cross section corresponds to the center of the light sensing surface JS. In this manner, each of the first refractive index layer 141 and the second refractive index layer 142 are arranged adjacent to each other in the direction along the capturing surface (xy surface). In addition, in the vertical cross section, an interface between the first refractive index layer 141 and the second refractive index layer 142 is formed so as to follow the direction z perpendicular to the capturing surface (xy surface).

For example, the first refractive index layer 141 and the second refractive index layer 142 may be formed using the following materials.
  zinc oxide (refractive index n=1.95)
  zirconium oxide (refractive index n=2.4)
  niobium oxide (refractive index n=about 2.3)
  tin oxide (refractive index n=2.0)
  tantalum oxide (refractive index n=2.1)
  hafnium oxide (refractive index n=2.0)
  titanium oxide (refractive index n=2.52)
  P—SiO (refractive index n=1.45)
  P—SiN (refractive index n=1.90)
  P—SiON (refractive index n=1.45 to 1.90)

Figure 7:
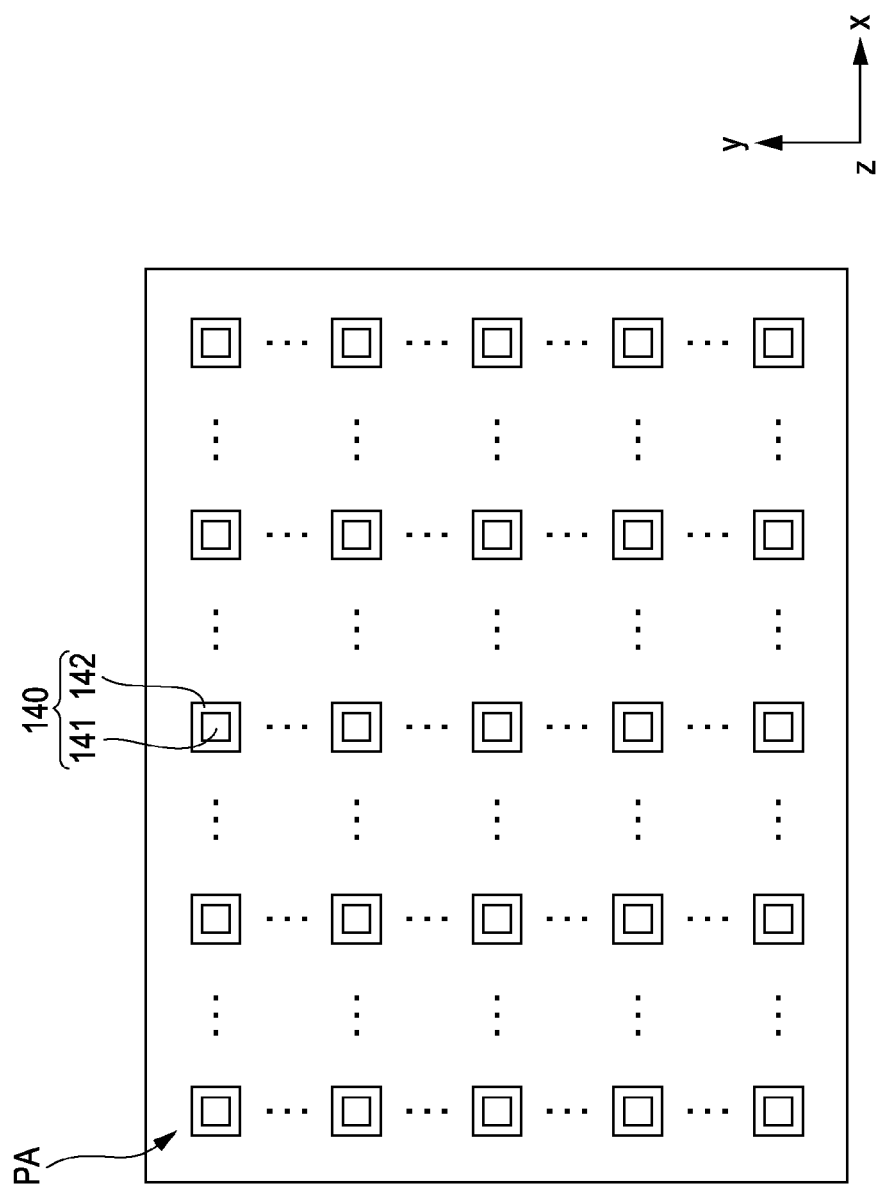
FIG. 7 is a diagram illustrating a micro lens in a first embodiment relating to the present invention.

In addition, in the above, P—SiO, P—SiN, AND P—SiON can be formed by the following conditions at a film forming temperature of 250° C. or less (preferably, 200° C. or less) by the plasma CVD method.
  P—SiO
  film forming gas type: $SiH_4$, $N_2O$ and $N_2$
  P—SiN
  film forming gas type: $SiH_4$, $NH_3$ and $N_2$
  P—SiON
  film forming gas type: $SiH_4$, $N_2O$, $NH_3$ and $N_2$ FIG. 7 is a diagram illustrating the micro lens 140 in the first embodiment relating to the present invention. In FIG. 7, the upper surface of the micro lens 140 is shown.

As shown in FIG. 7, the micro lens 140 is formed so that the horizontal cross section along the horizontal plane (xy surface) becomes the rectangular shape in the capturing area PA. Furthermore, as shown in FIG. 7, a plurality of micro lenses 140 is arranged at intervals so as to correspond to the plurality of pixels P. Herein, each of the plurality of micro lenses 140 are arranged in each of the horizontal direction x and in the vertical direction y so as to correspond to the plurality of pixels P. In addition, each of the plurality of micro lenses 140 is formed so that the horizontal cross sections have the same sizes from the center of the capturing area PA to the surroundings thereof.

In the present embodiment, as shown in FIG. 7, the micro lens 140 is formed so that the second refractive index layer 142 surrounds the first refractive index layer 141 in the horizontal cross section. In addition, each of the plurality of micro lenses 140 are formed so that the sizes of the areas where the first refractive index layer 141 is formed in the horizontal plane (xy surface) are identical from the center of the capturing area PA to the surrounding thereof. In addition, along with this, each of the plurality of micro lenses 140 are formed so that the sizes of the areas where the second refractive index layers 142 are formed in the horizontal plane (xy surface) are identical from the center of the capturing area PA to the surrounding thereof.

Specifically, as shown in FIG. 7, the first refractive index layer 141 is formed so that the horizontal cross section in the horizontal plane (xz surface) becomes the square shape. In addition, the first refractive index layer 141 is formed so that the center in the horizontal cross section corresponds to the center of the pixel P. Although it is not shown in FIG. 7, as shown in FIG. 5, the first refractive index layer 141 is formed so that the center thereof corresponds to the center of the light sensing surface JS. On the contrary to this, as shown in FIG. 7, the second refractive index layer 142 is formed so that the horizontal cross section in the horizontal plane (xz surface) draws a square shape in the surrounding area of the first refractive index layer 141. In addition, the second refractive index layer 142 is provided so that the center in the overall horizontal cross section corresponds to the center of the pixel P. Although it is not shown in FIG. 7, as shown in FIG. 5, the center of the overall cross section of the second refractive index layer 142 is formed so as to correspond to the center of the light sensing surface JS.

In addition, in the micro lens 140, the incident light is incident from the air layer, which is the refractive index lower than the first refractive index layer 141 and the second refractive index layer 142, to the first refractive index layer 141 and the second refractive index layer 142 and is concentrated to the light sensing surface JS. In order to obtain the light concentration function in the micro lens 140 having the vertical cross section of rectangular shape as mentioned above, the first refractive index layer 141 and the second refractive index layer 142 are formed, for example, by the following conditions. The following conditions show an example which is suitable for a case where the unit cell size of the solid-state imaging element is 1.1 µm.

(A Case of First Refractive Index Layer 141)
    material: P—SiON (plasma nitrided silicon oxide)
    width: 0.4 µm
    thickness: 0.5 µm (A Case of Second Refractive Index Layer 142)
    material: P—SiO (plasma silicon oxide)
    width: 0.8 µm including the first refractive index layer
    thickness: 0.5 µm By forming the micro lens 140 in this manner, the rectangular-shaped micro lens 140 obtains the light concentration function in the same manner as the convex lens.

In addition, it is desirable that the rectangular micro lens 140 be formed so as to satisfy the following.

(1) relatively thinner than the optical length (optical lens length of the micro lens itself)

(2) the high refractive index layer (the first refractive index layer 141) and the low refractive index layer (the second refractive index layer 142) are arranged alternately with respect to the optical axis, whereby the width of each of the high refractive index layer and the low refractive index layer are equal to or smaller than the wavelength order of the incident light.

Figure 8:
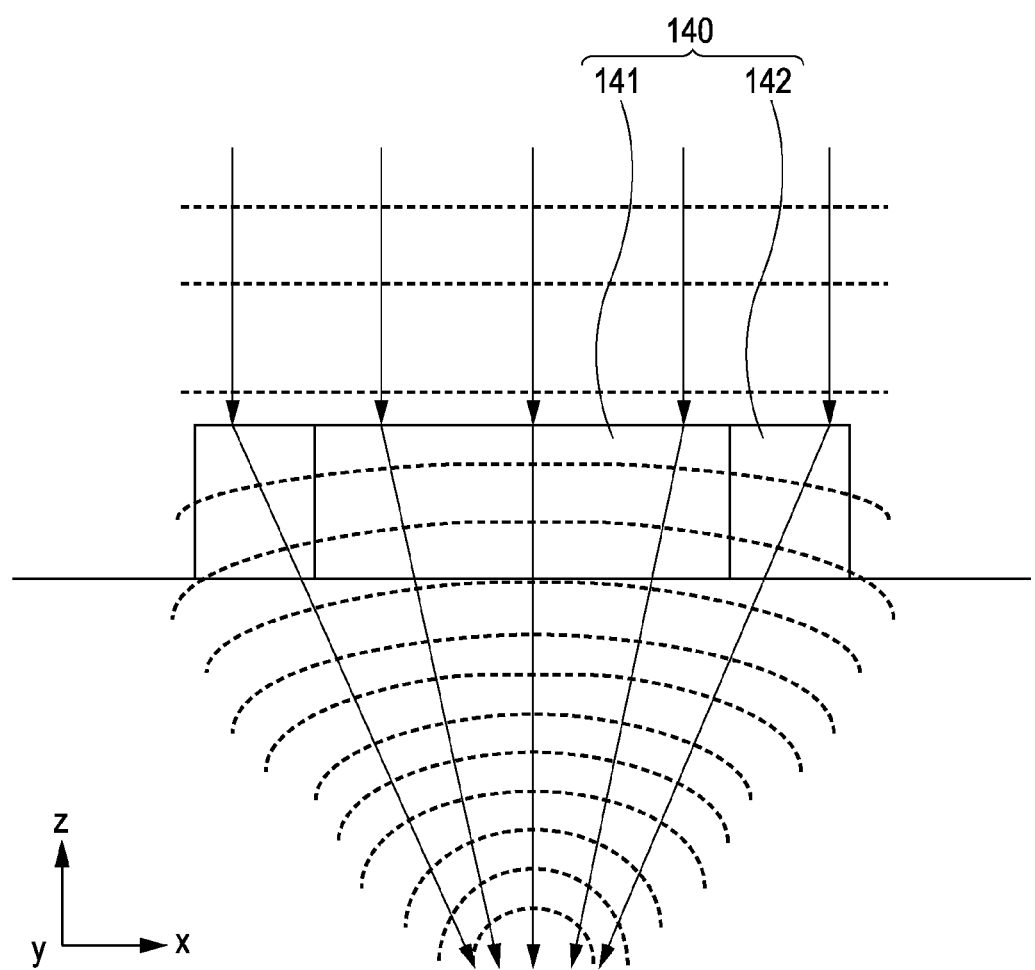
FIG. 8 is a diagram for illustrating the principle in which the micro lens concentrates light in a first embodiment relating to the present invention.

FIG. 8 is a diagram for illustrating the principle in which the micro lens 140 concentrates the light in the first embodiment relating to the present invention.

The first refractive index layer 141 is a high refractive index, whereas the second refractive index layer 142 is a low refractive index. For this reason, the progressing speed of the incident light differs between the first refractive index layer 141 and the second refractive index layer 142, whereby the phase difference is generated.

Thus, as shown in FIG. 8, the wave surface of light is curved due to the occurrence of phase difference. In addition, by the succession of the curve of the wave surface, a light concentration property is generated. That is, the micro lens 140 functions as a so-called diffraction lens, whereby the light concentration function is revealed.

(B) Production Method

Hereinafter, the principal parts of the method of producing the solid-state imaging device 1 will be described. Herein, the process of forming the micro lens 140 in the solid-state imaging device 1 will be described in detail.

FIGS. 9A and 9B to 11A and 11B are diagrams illustrating the principal parts provided at each process of the method of producing the solid-state imaging device 1 in the first embodiment relating to the present invention. Each of FIGS. 9A and 9B to 11A and 11B show the cross section of the capturing area PA in the same manner as FIG. 5.

(B-1) Film Formation of First Refractive Index Layer 141

Figure 9A:
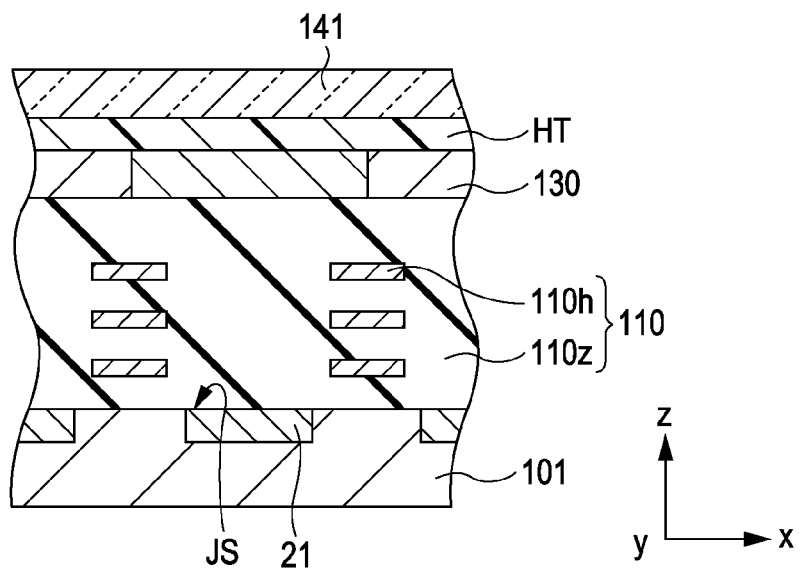
FIGS. 9A and 9B are diagrams illustrating the principal parts provided in each process of a method of producing a solid-state imaging device in a first embodiment relating to the present invention.

Firstly, as shown in FIG. 9A, the first refractive index layer 141 is formed.

Herein, before the film formation of the first refractive index layer 141, as shown in FIG. 9A, each member situated at a lower layer of the first refractive index layer 141 is formed on the substrate 101. That is, as shown in FIG. 5 and the like, each member such as the photodiode 21 is formed in the capturing area PA. Furthermore, in the surrounding area SA, the peripheral circuit element forming the peripheral circuit is provided. In addition, as shown in FIG. 5, the wiring layer 110 is formed so as to cover each part provided on the surface of the substrate 101. In addition, the color filter 130 and the planarized film HT are formed.

After that, as shown in FIG. 9A, the first refractive index layer 141 is formed so as to cover the upper surface of the planarized film HT.

For example, P—SiN or P—SiON can be used in the film formation of the first refractive index layer 141. Furthermore, it is desirable to form the film, in which the metallic oxide particles such as zinc oxide, zirconium oxide, niobium oxide, tin oxide, tantalum oxide and hafnium oxide are dispersed in resin, thereby forming the first refractive index layer 141.

(B-2) Formation of Photoresist Mask PR1

Figure 9B:
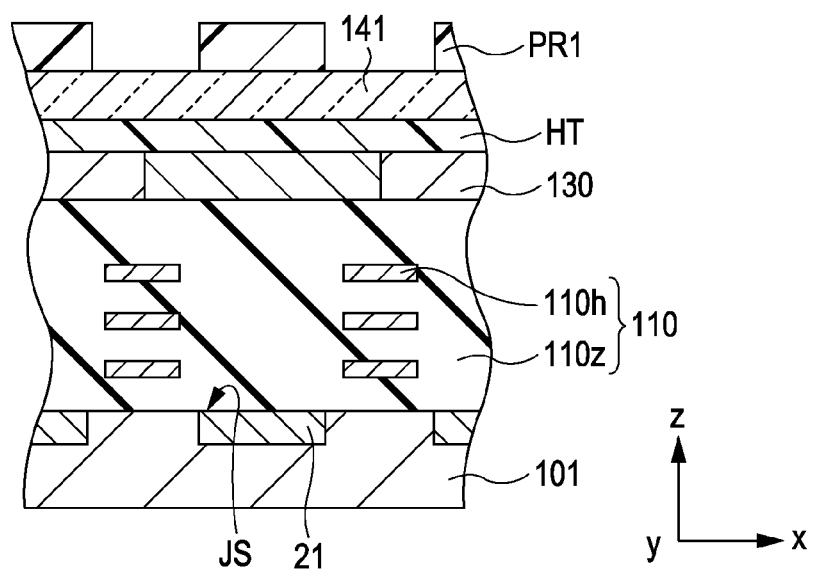

Next, as shown in FIG. 9B, a photoresist mask PR1 is formed.

Herein, after a photoresist film (not shown) is formed on the upper surface of the first refractive index layer 141, pattern machining is carried out with respect to the photoresist film, thereby forming the photoresist mask PR1 as shown in FIG. 9B.

As shown in FIG. 5, in the present embodiment, the photoresist film is subjected to pattern machining so as to correspond to the pattern shape of the first refractive index layer 141 forming the micro lens 140, thereby forming the photoresist mask PR1. Specifically, after carrying out the light exposure processing which exposes the mask pattern image corresponding to the pattern of the first refractive index layer 141 forming the micro lens 140, the developing processing is performed, thereby forming the photoresist mask PR1. As a result, the photoresist mask PR1 is formed in the first refractive index layer 141 so that the surface of the portion (see FIG. 5) of the first refractive index layer 141 forming the micro lens 140 is covered and the remaining portions are exposed.

(B-3) Machining of First Refractive Index Layer 141

Figure 10A:
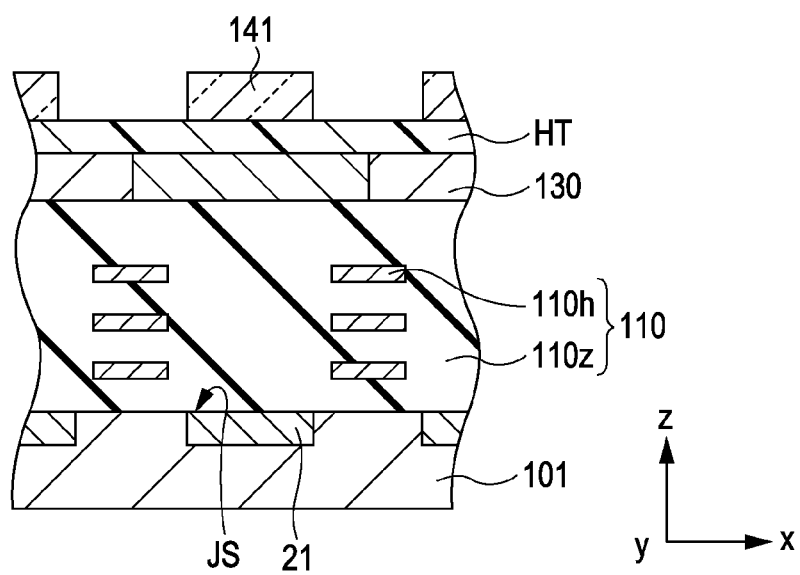
FIGS. 10A and 10B are diagrams illustrating the principal parts provided in each process of a method of producing a solid-state imaging device in a first embodiment relating to the present invention.

Next, as shown in FIG. 10A, the first refractive index layer 141 is machined.

Herein, as shown in FIG. 10A, the first refractive index layer 141 is machined so that the vertical cross section (xz surface) perpendicular to the capturing surface (xy surface) becomes a rectangular shape. Specifically, the first refractive index layer 141 is formed so that the upper surface of the first refractive index layer 141 follows the capturing surface (xy surface) and the side surface thereof follows the direction z perpendicular to the capturing surface (xy surface).

In the present process, by removing a part of the first refractive index layer 141 by the dry etching processing using the photoresist mask PR1, as shown in FIG. 10A, the first refractive index layer 141 is machined.

(B-4) Film Formation of Second Refractive Index Layer 142

Figure 10B:
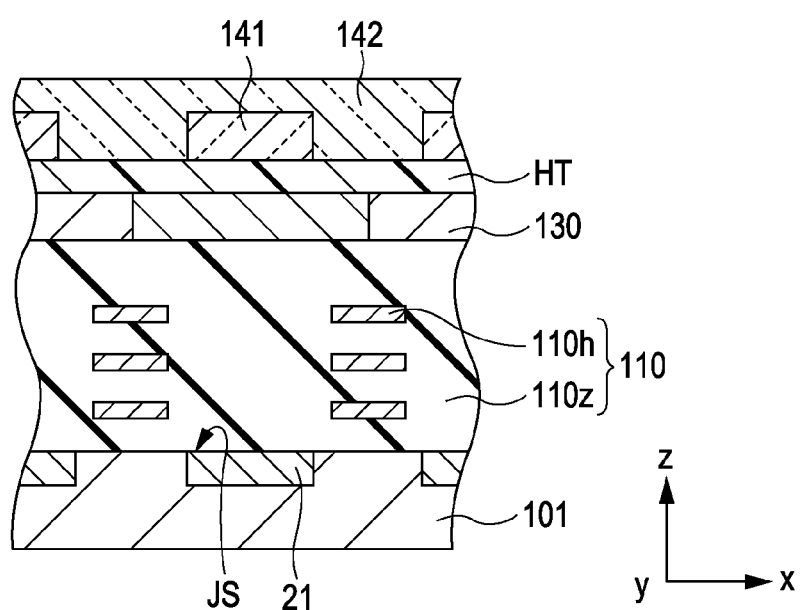

Next, as shown in FIG. 10B, the second refractive index layer 142 is formed.

Herein, as shown in FIG. 10B, the second refractive index layer 142 is formed so as to cover the upper surface of the first refractive index layer 141.

For example, materials such as an organic film including fluorine, epoxy resin, and an organic SOG can be used for forming the second refractive index layer 142.

(B-5) Planarization of Surfaces of First Refractive Index Layer 141 and Second Refractive Index Layer 142

Figure 11A:
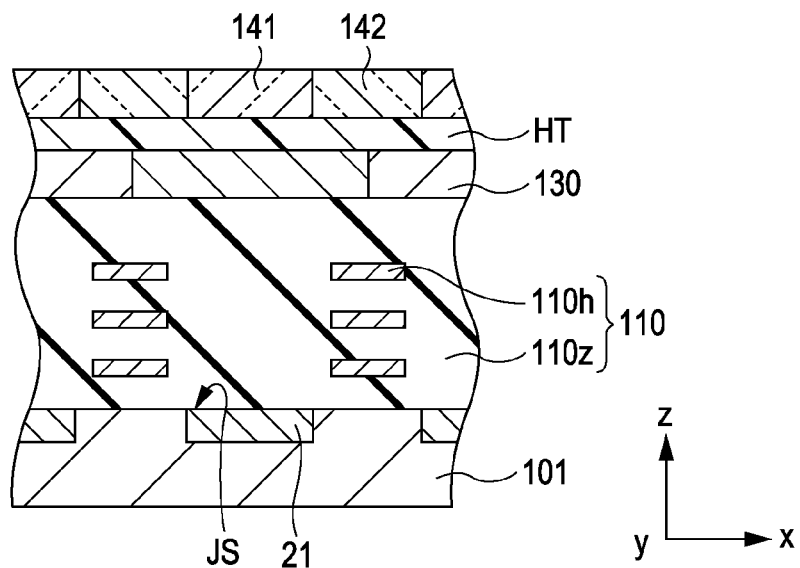
FIGS. 11A and 11B are diagrams illustrating the principal parts provided in each process of a method of producing a solid-state imaging device in a first embodiment relating to the present invention.

Next, as shown in FIG. 11A, the surfaces of the first refractive index layer 141 and the second refractive index layer 142 are planarized.

Herein, by carrying out, for example, CMP processing, the upper surface of the first refractive index layer 141 and the upper surface of the second refractive index layer 142 are integrally planarized. In the implementation of the CMP processing, by causing the first refractive index layer 141 to function as a stopper to remove the second refractive index layer 142, planarization processing is carried out.

In addition, besides the CMP processing, the planarization processing may be carried out by an etch back method.

(B-6) Formation of Photoresist Mask PR2

Figure 11B:
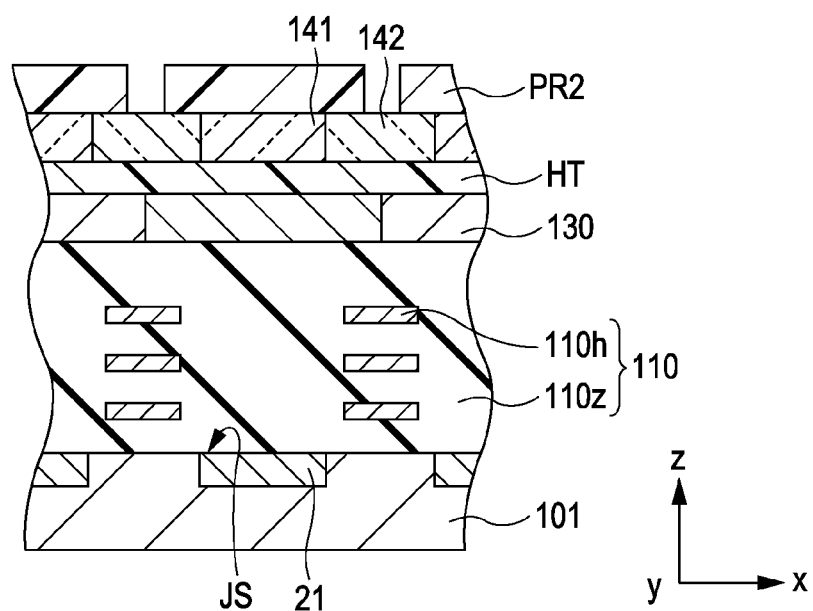

Next, as shown in FIG. 11B, a photoresist mask PR2 is formed.

Herein, after a photoresist film (not shown) is formed on the upper surface of the second refractive index layer 142, pattern machining is carried out with respect to the photoresist film, thereby forming the photoresist mask PR2 as shown in FIG. 11B.

As shown in FIG. 5, in the present embodiment, the photoresist film is subjected to pattern machining so as to correspond to the pattern shape of the micro lens 140, thereby forming the photoresist mask PR2. Specifically, after carrying out light exposure processing which exposes the mask pattern image corresponding to the micro lens 140, the developing processing is performed, thereby forming the photoresist mask PR2. As a result, the photoresist mask PR2 is formed so that the surfaces of the portions (see FIG. 5) of the first refractive index layer 141 and the second refractive index layer 142 forming the micro lens 140 are covered and the remaining portions are exposed.

(B-7) Formation of Micro Lens 140

Next, as shown in FIG. 5, the micro lens 140 is formed.

Herein, by performing pattern machining with respect to the second refractive index layer 142, as shown in FIG. 5, the micro lens 140 is formed. Specifically, the second refractive index layer 142 is subjected to pattern machining so that the vertical cross sections (xz surfaces) perpendicular to the capturing surface (xy surface) are a rectangular shape and the cross sections of rectangular shape pinch the first refractive index layer 141 therebetween. As a result, the micro lens 140, in which a plurality of different refractive index layers is divided in the transverse direction (the horizontal direction x), is formed.

In the present process, by removing a part of the second refractive index layer 142 by the dry etching processing using the photoresist mask PR2, as shown in FIG. 5, the second refractive index layer 142 is machined.

(C) Optical Simulation Results of Micro Lens 140

Figure 12:
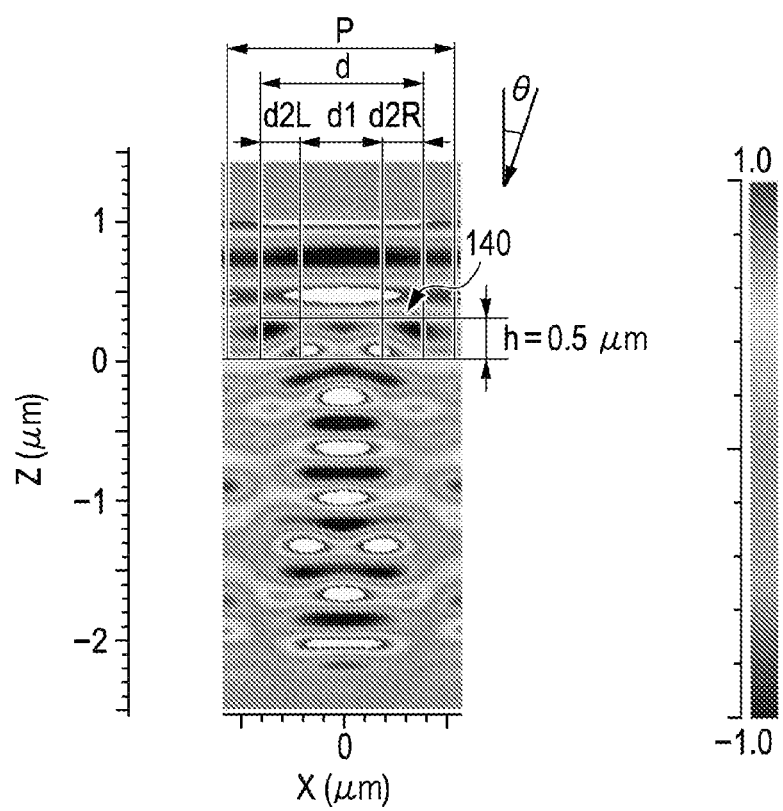
FIG. 12 is a diagram illustrating the result in which an optical simulation is carried out in regard to a micro lens in a first embodiment relating to the present invention.

FIG. 12 is a diagram illustrating the result in which optical simulation is carried out with respect to the micro lens 140 in the first embodiment 1 relating to the present invention.

Herein, in a case where the micro lens 140 is formed by the following conditions and in a case where the incident angle of the main ray satisfies the following conditions, the result when the simulation is carried out by the FDTD method is shown. In addition, the simulation is carried out on the condition that the lower layer of the micro lens 140 is the layer of the material having a refractive index of 1.45.

film thickness h of the micro lens 140: 0.5 μm
transverse width d of the micro lens 140: 0.8 μm
pitch P of the micro lens 140: 1.1 μm
refractive index n1 of the first refractive index layer 141: 1.7
refractive index n2 of the second refractive index layer 142: 1.45
transverse width of the first refractive index layer 141: 0.4 μm
transverse widths d2L, d2R of the portion pinching the first refractive index layer 141 by the second refractive index layer 142: 0.2 μm
(the overall) transverse width d2 (d2L+d2R) of the second refractive index layer 142: 0.4 μm
incident angle θ of the main ray: 0°

As shown in FIG. 12, the micro lens 140 concentrates the incident light to the light sensing surface JS.

(D) Conclusion

As described above, in the present embodiment, the micro lens 140, which concentrates the incident light to the light sensing surface JS, is provided at the upper part of the light sensing surface JS in the capturing surface (xy surface) of the substrate 101. The micro lens 140 is formed so that the vertical cross section (xz surface), which is the surface perpendicular to the capturing surface (xy surface), becomes a rectangular shape. Furthermore, the micro lens 140 has a first refractive index layer 141 and a second refractive index layer 142. In the micro lens 140, the first refractive index layer 141 is formed of a material of high refractive index (e.g., n1=1.7). On the contrary to this, the second refractive index layer 142 is formed of a material of low refractive index (e.g., n2=1.45) different from the first refractive index layer 141. In addition, the micro lens 140 is configured so that the incident light is incident from an air layer (refractive index n=1), which is a refractive index lower than the first and second refractive index layers 141 and 142, to the first and second refractive index layers 141 and 142 and is concentrated to the light sensing surface JS. Specifically, each of the first refractive index layer 141 and the second refractive index layer 142 are arranged adjacent to each other in the direction x along the capturing surface (xy surface). In addition, the micro lens 140 is formed so that the interface between the first refractive index layer 141 and the second refractive index layer 142 follows the direction z perpendicular to the capturing surface (xy surface) in the vertical cross section (xz surface) (see FIG. 5). Furthermore, the micro lens 140 is formed so that the horizontal cross section (xy surface) is a rectangular shape in the horizontal plane (xy surface) and the second refractive index layer 142 surrounds the first refractive index layer 141 in the horizontal cross section (see FIG. 7).

The micro lens 140 having the above-mentioned configuration can be easily manufactured using the existing equipment, whereby it is possible to realize an improvement in production efficiency and reliability of the product. As a result, it is possible to realize a reduction in cost.

In addition, along with this, high concentration efficiency can be realized, which can improve the image quality of the captured image. Specifically, the occurrence of ghost images can be prevented.

In addition, in the present embodiment, the thin film of the micro lens 140 can be easily realized.

Furthermore, in the above, a description has been given of the case where the refractive index of the first refractive index layer 141 situated at the inner side in the micro lens 140 is higher than that of the second refractive index layer 142 situated at the outer side thereof. However, in regard to the relationship of the refractive index, the reverse may be possible. That is, the micro lens 140 may be formed so that the refractive index of the first refractive index layer 141 situated at the inner side in the micro lens 140 becomes lower than that of the second refractive index layer 142 situated at the outer side thereof. In this case, as compared to the above case, there is merit in a process in which the degree of freedom of the selection of the material and the process is widened.

<2. Second Embodiment>

(A) Device Configuration

Figure 13:
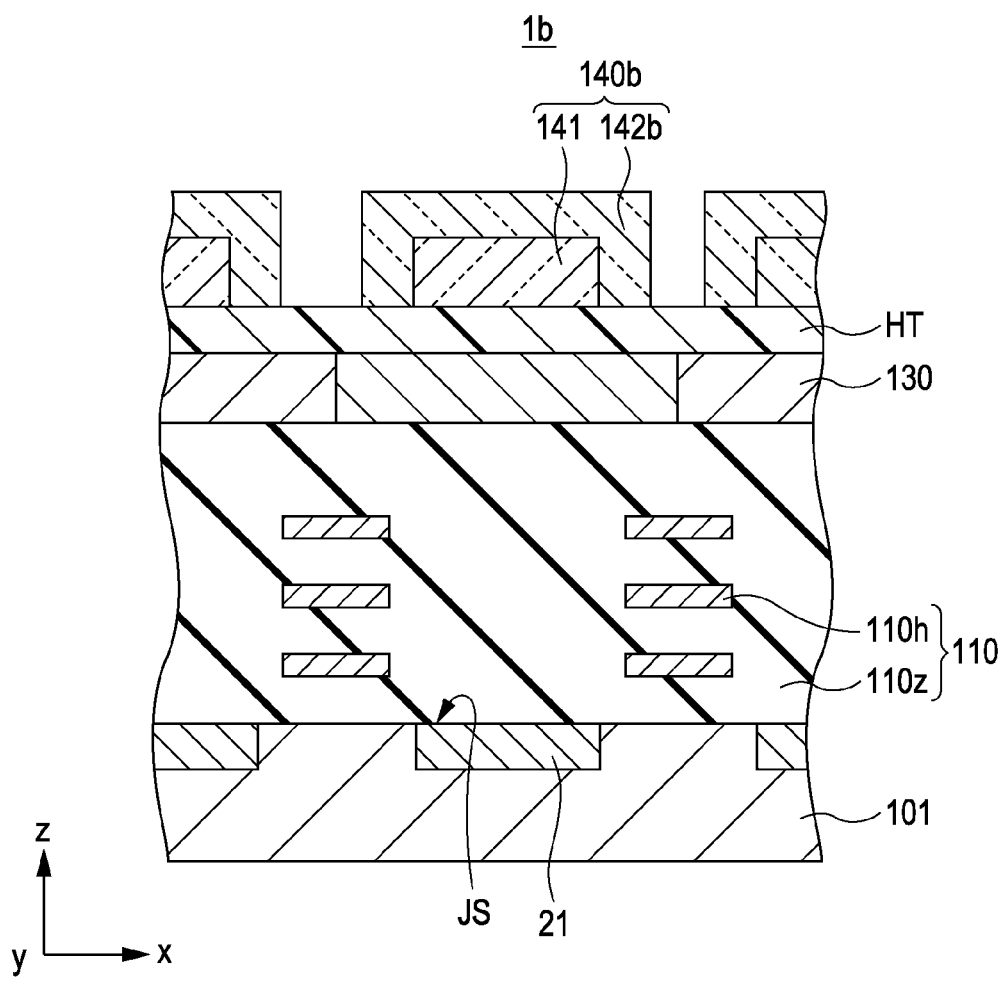
FIG. 13 is a diagram illustrating the principal parts of a solid-state imaging device in a second embodiment relating to the present invention.
Figure 14:
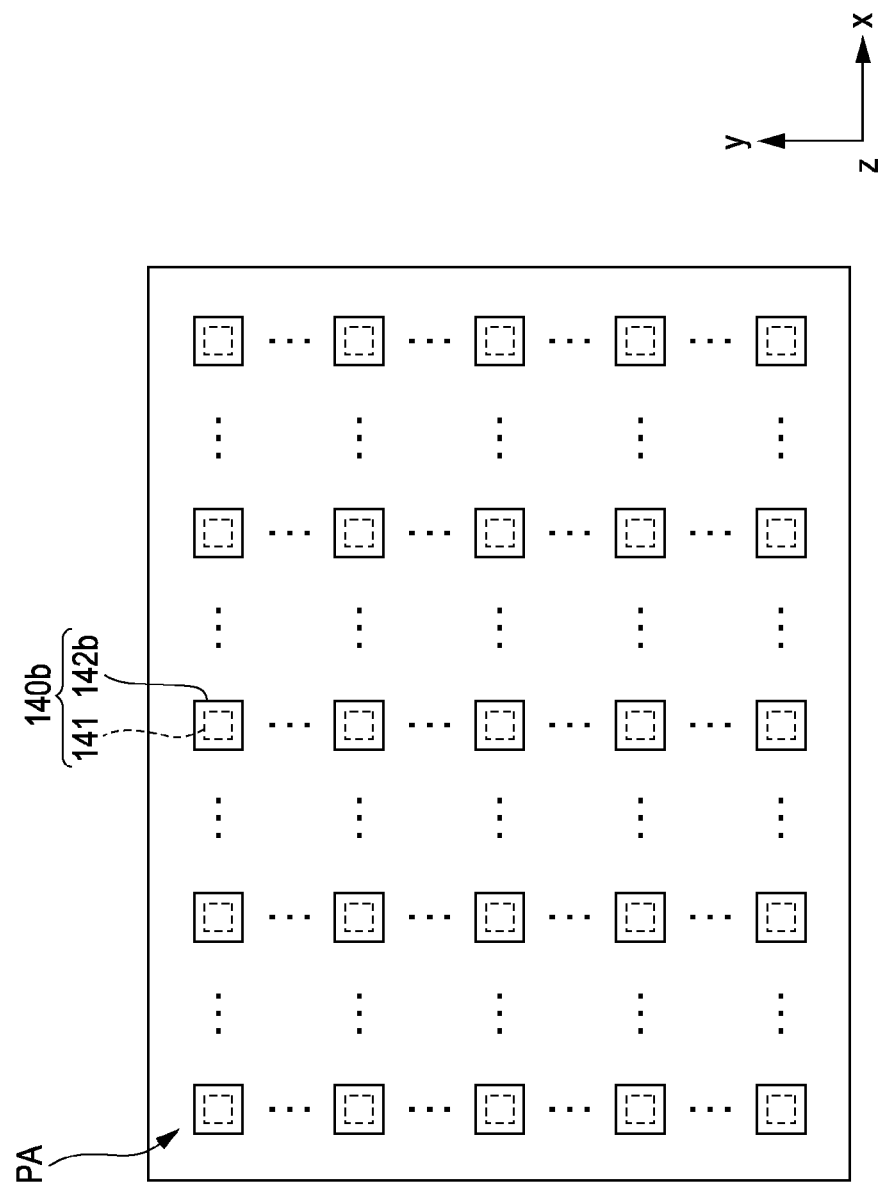
FIG. 14 is a diagram illustrating the principal parts of a solid-state imaging device in a second embodiment relating to the present invention.

FIGS. 13 and 14 are drawings illustrating the principal parts of a solid-state imaging device 1b in a second embodiment relating to the present invention.

Herein, similarly to FIG. 5, FIG. 13 illustrates the cross section of the capturing area PA. Similarly to FIG. 7 FIG. 14 illustrates an upper surface of a micro lens 140b.

As shown in FIGS. 13 and 14, in the present embodiment, the micro lens 140b is different from that of the first embodiment. The present embodiment is the same as the first embodiment except for this. For this reason, description of the overlapping portions will be omitted.

As shown in FIGS. 13 and 14, the micro lens 140b includes the first refractive index layer 141 and the second refractive index layer 142b.

In addition, as shown in FIG. 13, the micro lens 140b is configured so that the vertical cross section which is the surface (xz surface) perpendicular to the capturing surface (xy surface) is a rectangular shape in the same manner as the case of the first embodiment.

However, as shown in FIG. 13, in the present embodiment, unlike the first embodiment, the micro lens 140b has a portion where the second refractive index layer 142b is overlapped on the first refractive index layer 141 so as to include the interface along the capturing surface (xy surface). That is, the micro lens 140b is formed so that the second refractive index layer 142b caps the first refractive index layer 141.

Specifically, in the micro lens 140b, as shown in FIGS. 13 and 14, the first refractive index layer 141 is formed in the same manner as the first embodiment.

Furthermore, in the micro lens 140b, in the same manner as the case of the first embodiment, the second refractive index layer 142b is formed by the use of light transmitting material having a refractive index different from that of the first refractive index layer 141. In addition, as shown in FIGS. 13 and 14, the second refractive index layer 142b is provided so as to surround the side surface of the first refractive index layer 141. Along with this, as shown in FIGS. 13 and 14, the second refractive index layer 142b is provided so as to cover the upper surface of the first refractive index layer 141. That is, as shown in FIG. 13, the second refractive index layer 142b is formed so that the vertical cross section becomes a U shape in the direction (x direction and y direction) along the capturing surface (xy surface).

(B) Production Method

Hereinafter, the principal parts of the production method of producing the solid-state imaging device 1b will be described. Herein, a process of forming the micro lens 140b in the solid state imaging device 1b will be described in detail.

Figure 15:
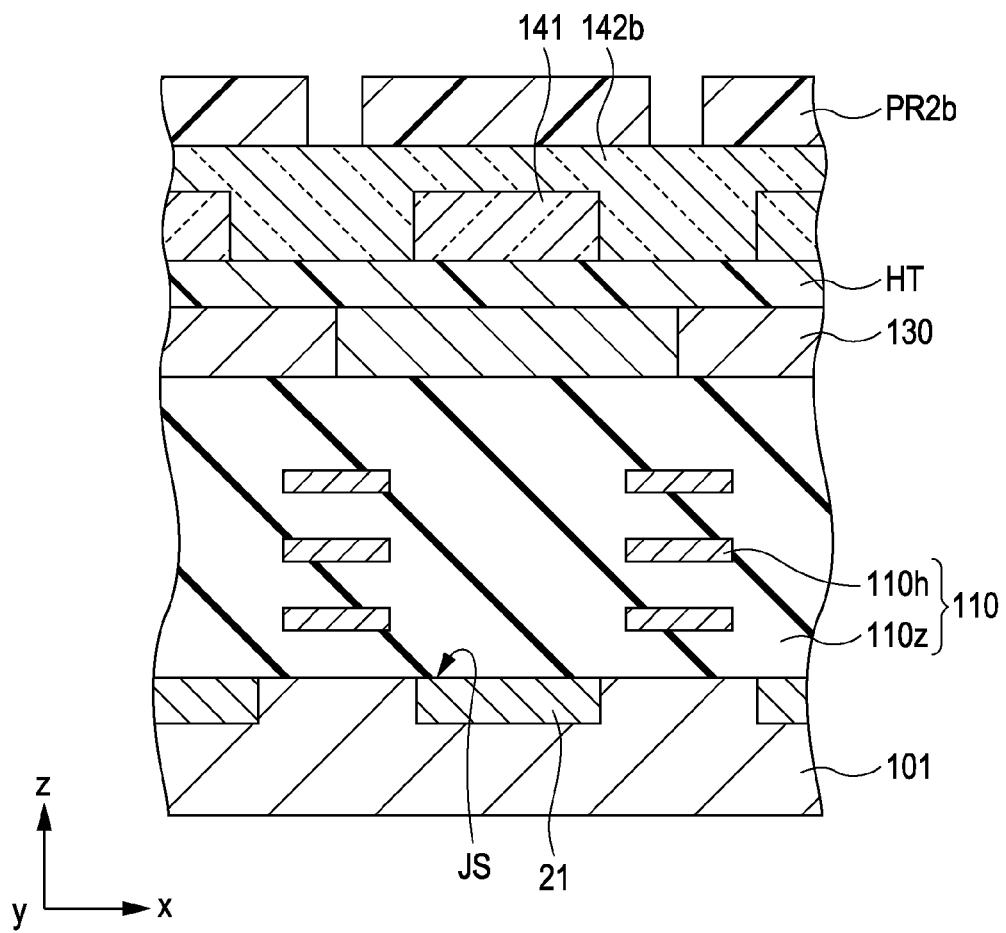
FIG. 15 is a diagram illustrating the principal parts provided in a process of a method of producing a solid-state imaging device in a second embodiment relating to the present invention.

FIG. 15 is a diagram illustrating the principal parts provided in the process of the method of producing a solid-state imaging device 1b in the second embodiment relating to the present embodiment. FIG. 15 illustrates the cross section of the capturing area PA in the same manner as FIG. 13.

When manufacturing the solid-state imaging device 1b, in the first embodiment, in the same manner as the case shown in FIG. 10B, the second refractive index layer 142b is formed so as to cover the upper surface of the first refractive index layer 141.

Next, as shown in FIG. 15, the photoresist mask PR2b is formed.

Herein, after forming a photoresist film (not shown) on the upper surface of the second refractive index layer 142b, by carrying out pattern machining with respect to the photoresist film, as shown in FIG. 15, a photoresist mask PR2b is formed.

As shown in FIG. 13, in the present embodiment, pattern machining is carried out with respect to the photoresist film so as to correspond to the pattern shape of the micro lens 140b, thereby forming the photoresist mask PR2b. Specifically, after carrying out the light exposure processing of exposing the mask pattern image corresponding to the micro lens 140b, the developing processing is performed to form the photoresist mask PR2b. As a result, the photoresist mask PR2b is formed so that the surfaces of the portions (see FIG. 13) of the first refractive index layer 141 and the second refractive index layer 142b forming the micro lens 140b are covered and the surfaces of the other portions are exposed.

Next, as shown in FIG. 13, the micro lens 140b is formed.

Herein, by performing patterning processing of the second refractive index layer 142b, as shown in FIG. 13, the micro lens 140b is formed. Specifically, as shown in FIG. 13, the second refractive index layer 142b is formed so that the vertical cross section becomes U shaped in the directions (x direction and y direction) along the capturing surface (xy surface).

In the present process, by removing a part of the second refractive index layer 142b by dry etching processing using the photoresist mask PR2b, as shown in FIG. 13, the second refractive index layer 142 is machined.

(C) Conclusion

As described above, in the present embodiment, in the same manner as the case of the first embodiment, the micro lens 140b is configured so that each of the first refractive index layer 141 and the second refractive index layer 142b are arranged adjacently in the direction x along the capturing surface (xy surface). In addition, the micro lens 140b is formed so that the interface between the first refractive index layer 141 and the second refractive index layer 142b includes the portion along the direction z perpendicular to the capturing surface (xy surface) in the vertical cross section (xz surface) (see FIG. 13).

Along with this, in the present embodiment, the micro lens 140b has a portion where the second refractive index layer 142b is overlapped on the first refractive index layer 141 so that the first refractive index layer 141 and the second refractive index layer 142b include the interface along the capturing surface (xy surface).

Thus, in the same manner as the case of the first embodiment, the present embodiment can improve the production efficiency and reliability of the product and can realize a reduction in cost. In addition, together with these outcomes, high concentration efficiency can be realized, which can improve the image quality of the captured image.

Furthermore, since the second refractive index layer 142b having a low refractive index is overlapped on the first refractive index layer 141, the present embodiment can prevent the reflection of light. For this reason, the occurrence of ghost images is effectively suppressed, whereby the image quality of the captured image can be further improved.

<3. Third Embodiment>

(A) Device Configuration

Figure 16:
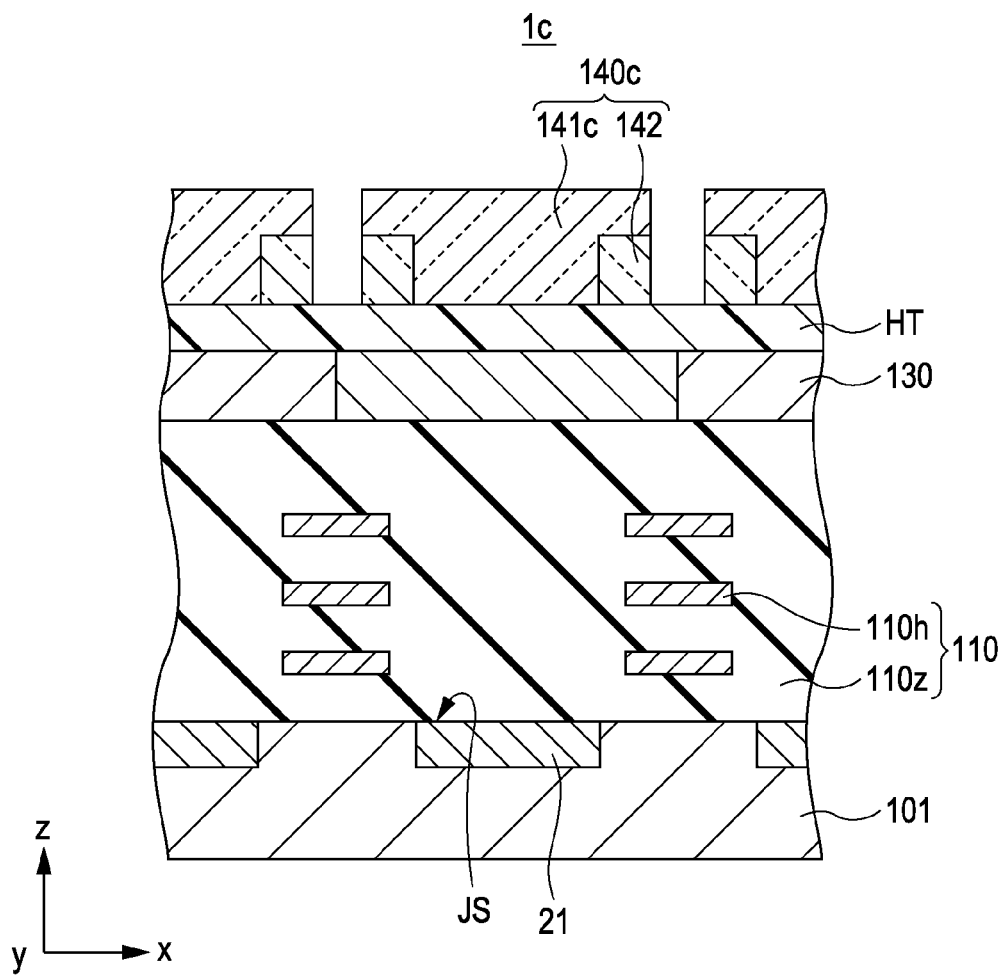
FIG. 16 is a diagram illustrating the principal parts of a solid-state imaging device in a second embodiment relating to the present invention.

FIGS. 16 and 17 are diagrams illustrating the principal parts of a solid-state imaging device 1c in a third embodiment relating to the invention.

Herein, similarly to FIG. 5, FIG. 16 illustrates the cross section of the capturing area PA. Similarly to FIG. 7, FIG. 17 illustrates the upper surface of the micro lens 140c.

As shown in FIGS. 16 and 17, in the present embodiment, the micro lens 140c is different from that of the first embodiment. Except for this point, the present invention is the same as the first embodiment. For this reason, description of the overlapped portions will be omitted.

As shown in FIGS. 16 and 17, the micro lens 140c includes the first refractive index layer 141c and the second refractive index layer 142.

As shown in FIG. 16, the micro lens 140c is configured so that the vertical cross section which is a surface (xz surface) perpendicular to the capturing surface (xy surface) is a rectangular shape, in the same manner as the case of the first embodiment.

However, as shown in FIG. 16, in the present embodiment, unlike the first embodiment, the micro lens 140c has a portion where the first refractive index layer 141c is overlapped on the second refractive index layer 142 so as to include an interface along the capturing surface (xy surface).

Specifically, in the micro lens 140c, as shown in FIGS. 16 and 17, the second refractive index layer 142 is formed in the same manner as the first embodiment.

Furthermore, in the micro lens 140c, in the same manner as the case of the first embodiment, the first refractive index layer 141c is formed using the light transmitting material of a refractive index different from that of the second refractive index layer 142. In addition, as shown in FIGS. 16 and 17, the first refractive index layer 141c is formed so as to embed the inner part of the second refractive index layer 142. Along with this, as shown in FIGS. 16 and 17, the first refractive index layer 141c is provided so that a part thereof covers the upper surface of the second refractive index layer 142. That is, as shown in FIG. 16, the first refractive index layer 141c is formed so that the vertical cross section becomes a T shape in the direction z perpendicular to the capturing surface (xy surface).

(B) Production Method

Next, the principal parts of the production method of producing the solid-state imaging device 1c will be described. Herein, a process of forming the micro lens 140c in the solid-state imaging device 1c will be described in detail.

FIGS. 18A and 18B to FIG. 20 are diagrams illustrating the principal parts provided in each process of the method of producing the solid-state imaging device 1c in the third embodiment relating to the invention. Each of FIGS. 18A and 18B to FIG. 20 show the cross section of the capturing area PA, similarly to FIG. 16.

(B-1) Film formation of First Refractive Index Layer 141

Figure 18A:
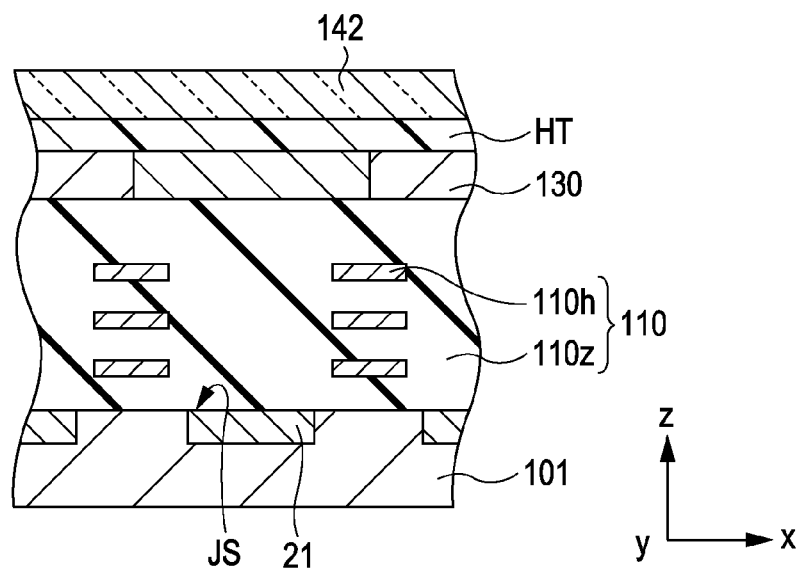
FIGS. 18A and 18B are diagrams illustrating the principal parts provided in each process of a method of producing a solid-state imaging device in a third embodiment relating to the present invention.

Firstly, as shown in FIG. 18A, the second refractive index layer 142 is formed.

Herein, in the same manner as the case of the first embodiment, before the film formation of the second refractive index layer 142, as shown in FIG. 16, each member situated at the lower layer of the second refractive index layer 142 is formed on the substrate 101. That is, each member such as the photodiode 21 is formed in the capturing area PA. Furthermore, in the surrounding area SA, the peripheral circuit element forming the peripheral circuit is provided. In addition, the wiring layer 110 is formed so as to cover each portion provided on the surface of the substrate 101. Furthermore, the formation of the color filter 130 and the formation of the planarized film HT are carried out.

After that, as shown in FIG. 18A, the second refractive index layer 142 is formed so as to cover the upper surface of the planarized film HT. Herein, in the same condition as the case of the first embodiment, the film formation of the second refractive index layer 142 is carried out.

(B-2) Formation of Photoresist Mask PR1c

Figure 18B:
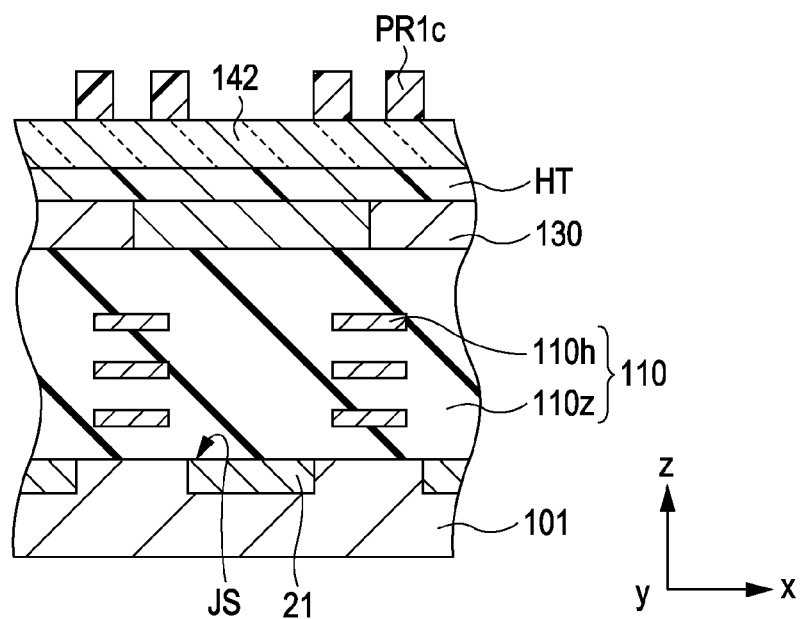

Next, as shown in FIG. 18B, a photoresist mask PR1c is formed.

Herein, by carrying out pattern machining in regard to the photoresist film after forming a photoresist film (not shown) on the upper surface of the second refractive index layer 142, as shown in FIG. 18B, the photoresist mask PR1c is formed.

As shown in FIG. 16, in the present embodiment, pattern machining is carried out with respect to the photoresist film so as to correspond to the pattern shape of the second refractive index layer 142 forming the micro lens 140c, thereby forming the photoresist mask PR1c. Specifically, after carrying out the exposing processing of exposing the mask pattern image corresponding to the pattern of the second refractive index layer 142 that forms the micro lens 140c, the developing processing is carried out, thereby forming the photoresist mask PR1c. As a result, the photoresist mask PR1c is formed so that surface of the portion (see FIG. 16) of the second refractive index layer 142 forming the micro lens 140c is covered and the surfaces of the remaining portions are exposed in the second refractive index layer 142.

(B-3) Machining of Second Refractive Index Layer 142

Figure 19A:
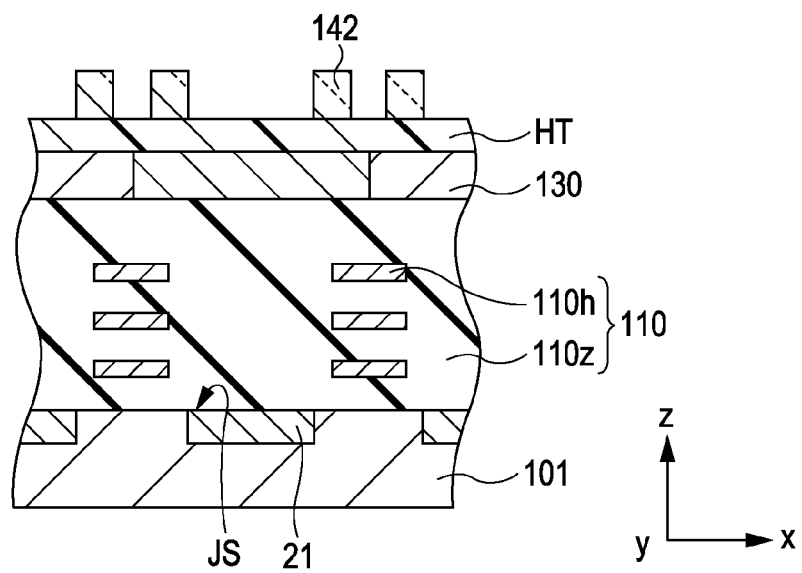
FIGS. 19A and 19B are diagrams illustrating the principal parts provided in each process of a method of producing a solid-state imaging device in a third embodiment relating to the present invention.

Next, as shown in FIG. 19A, the second refractive index layer 142 is machined.

Herein, as shown in FIG. 19A, the second refractive index layer 142 is machined so that the vertical cross section (xz surface) perpendicular to the capturing surface (xy surface) becomes the rectangular shape. Specifically, the second refractive index layer 142 is formed so that the upper surface of the second refractive index layer 142 follows the capturing surface (xy surface) and the side surface thereof follows the direction z perpendicular to the capturing surface (xy surface).

In the present process, by removing the part of the second refractive index layer 142 by the dry etching processing using the photoresist mask PR1c, as shown in FIG. 19A, the second refractive index layer 142 is machined.

(B-4) Film Formation of First Refractive Index Layer 141c

Figure 19B:
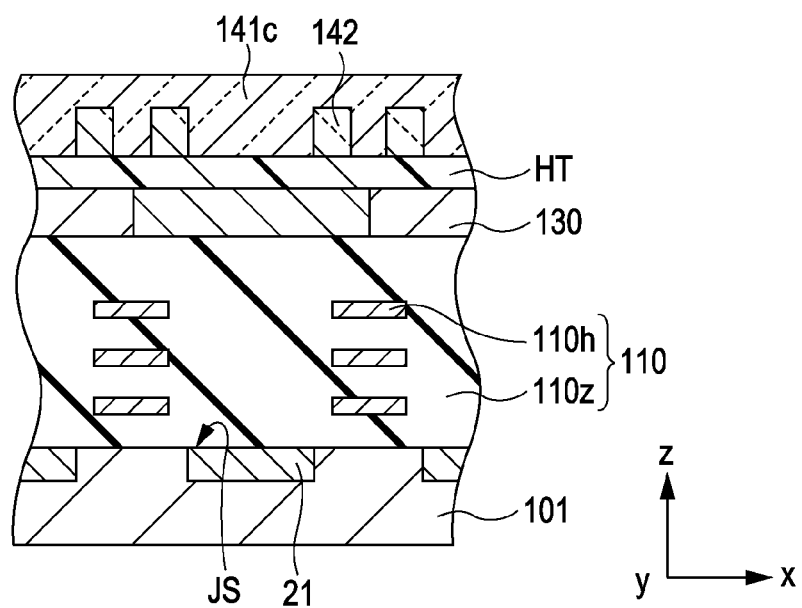

Next, as shown in FIG. 19B, the first refractive index layer 141c is formed.

Herein, in the same condition as the case of the first embodiment, as shown in FIG. 19B, the first refractive index layer 141c is formed so as to cover the upper surface of the second refractive index layer 142.

(B-5) Formation of Photoresist Mask PR2c

Figure 20:
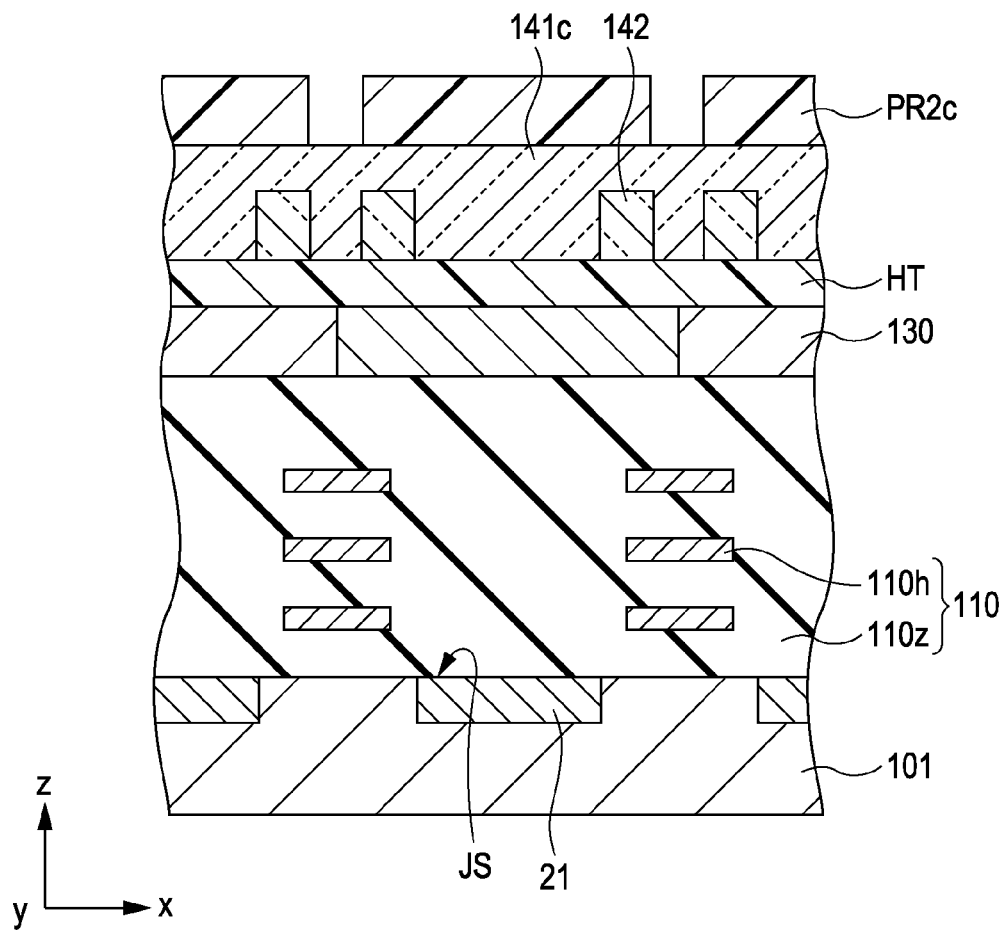
FIG. 20 is a diagram illustrating the principal parts provided in each process of a method of producing a solid-state imaging device in a third embodiment relating to the present invention.

Next, as shown in FIG. 20, a photoresist mask PR2 is formed.

Herein, by carrying out pattern machining in regard to the photoresist film after forming a photoresist film (not shown) on the upper surface of the first refractive index layer 141c, as shown in FIG. 20, the photoresist mask PR2c is formed.

As shown in FIG. 16, in the present embodiment, pattern machining is carried out with respect to the photoresist film so as to correspond to the pattern shape of the micro lens 140c, thereby forming the photoresist mask PR2c. Specifically, after carrying out the exposing process of exposing the mask pattern image corresponding to the micro lens 140c, developing processing is performed, thereby forming the photoresist mask PR2c. As a result, the photoresist mask PR2c is formed so that surfaces of the portions (see FIG. 16) of the first refractive index layer 141c and the second refractive index layer 142 forming the micro lens 140c are covered and the surfaces of the remaining portions are exposed.

(B-6) Formation of Micro Lens 140c

Next, as shown in FIG. 16, the micro lens 140c is formed.

Herein, as shown in FIG. 16, the first refractive index layer 141c is subjected to pattern machining, thereby forming the micro lens 140c. Specifically, as shown in FIG. 16, the first refractive index layer 141c is formed so that the vertical cross section thereof becomes a T shape in the direction z perpendicular to the capturing surface (xy surface).

In the present process, by removing a part of the first refractive index layer 141c using the photoresist mask PR2c by dry etching processing, as shown in FIG. 16, the first refractive index layer 141c is machined.

(C) Conclusion

As described above, in the present embodiment, in the same manner as the case of the first embodiment, the micro lens 140c includes the portion in which each of the first refractive index layer 141c and the second refractive index layer 142 are arranged adjacently in the direction x along the capturing surface (xy surface). In addition, the micro lens 140c is formed so that the interface between the first refractive index layer 141c and the second refractive index layer 142 includes the portion along the direction z perpendicular to the capturing surface (xy surface) in the vertical cross section (xz surface) (see FIG. 16).

Along with this, in the present embodiment, the micro lens 140c has the portion where the first refractive index layer 141c is overlapped on the second refractive index layer 142 so that the first refractive index layer 141c and the second refractive index layer 142 include the interface along the capturing surface (xy surface).

Thus, in the same manner as the case of the first embodiment, the present embodiment can improve the production efficiency and reliability of the product and can realize a reduction in cost. In addition, together with these, high concentration efficiency can be realized, which can improve the image quality of the captured image.

<4. Fourth Embodiment>

(A) Device Configuration and the Like

FIGS. 21, 22 and 23 are diagrams illustrating the principal parts of a solid-state imaging device 1d in a fourth embodiment relating to the invention.

Herein, similarly to FIG. 7, FIG. 21 illustrates the upper surface of the capturing area PA. Similarly to FIG. 5, FIGS. 22 and 23 show the cross section of the capturing area PA. FIG. 22 illustrates the cross section of a X1dc-X2dc portion shown in FIG. 21 which is a center portion of the capturing area PA. Furthermore, FIG. 23 illustrates the cross section of a X1ds-X2ds portion shown in FIG. 21 which is a surrounding portion of the capturing area PA.

As shown in FIGS. 21, 22 and 23, in the present embodiment, the micro lens 140d is different from that of the first embodiment. Except for this point, the present invention is the same as the first embodiment. Thus, the descriptions of the overlapped portions will be omitted.

As shown in FIGS. 21, 22 and 23, the micro lens 140d includes a first refractive index layer 141d and a second refractive index layer 142d.

As shown in FIG. 21, each of plurality of micro lenses 140d are formed so that the size of the area where the first refractive index layer 141d are formed in the horizontal plane (xy surface) is identical from the center of the capturing area PA to the surrounding thereof. Furthermore, along with this, as shown in FIG. 21, each of the plurality of micro lenses 140d are formed so that the size of the area where the second refractive index layer 142d are formed in the horizontal plane (xy surface) is identical from the center of the capturing area PA to the surrounding thereof.

Moreover, as shown in FIGS. 22 and 23, in the same manner as the case of the first embodiment, the micro lens 140d is configured so that the vertical cross section, which is a surface (xz surface) perpendicular to the capturing surface (xy surface), becomes a rectangular shape.

As shown in FIGS. 21 and 22, the micro lens 140d is formed in the same manner as the case of the first embodiment in the center portion of the capturing area PA. That is, the micro lens 140d is formed so that the center of the area where the first refractive index layer 141d is formed in the horizontal plane (xy surface) corresponds to the center of the light sensing surface JS. In addition, the micro lens 140d is formed so that the center of the area where the second refractive index layer 142d is formed in the horizontal plane (xy surface) corresponds to the center of the light sensing surface JS.

However, in the present embodiment, as shown in FIGS. 21 and 23, in the surrounding portions of the capturing area PA, the micro lens 140d is different from the case of the first embodiment.

Specifically, as shown in FIGS. 21 and 23, as the first refractive index layer 141d faces away from the center of the capturing area PA to the surroundings, the center of the area where the first refractive index layer 141d is formed in the horizontal plane (xy surface) is shifted to the center side of the capturing area PA with respect to the center of the light sensing surface JS. For example, as shown in FIGS. 21 and 23, in the pixel situated at the end portion of the right side in the capturing area PA, the first refractive index layer 141d is formed so that the center of the first refractive index layer 141d is shifted to the left side (center side of the capturing area PA) with respect to the center of the light sensing surface JS.

That is, as shown in FIG. 21, the first refractive index layer 141d is configured so that the plurality of pitches P1x arranged in the horizontal direction x is smaller than a pixel pitch Px in which a plurality of pixels is arranged in the horizontal direction x. Similarly, a pitch P1y, in which a plurality of first refractive index layer 141d is arranged in the vertical direction y, is smaller than a pixel pitch Py in which a plurality of pixels is arranged in the vertical direction y. On the contrary to this, as shown in FIGS. 21 and 23, the second refractive index layer 142d is formed so that the center of the area where the second refractive index layer 142d is formed in the horizontal plane (xy surface) in the center and the surrounding of the capturing area PA corresponds to the center of the light sensing surface JS.

That is, as shown in FIG. 21, the second refractive index layer 142d is configured so that pitches P2x arranged in plural in the horizontal direction x is the same as the pixel pitch Px in which the plurality of pixels is arranged in the horizontal direction x. Similarly, pitches P2y in which a plurality of second refractive index layers 142d is arranged in the vertical direction y is the same as the pixel pitches Py in which the plurality of pixels is arranged in the vertical direction y.

In this manner, in the present embodiment, the micro lens 140d is formed so that pitches P1dx and P1dy, in which the plurality of first refractive index layers 141d is arranged, become smaller than pitches P2dx and P2dy in which the plurality of second refractive index layers 142d is arranged.

(B) Optical Simulation Results of Micro Lens 140d

FIGS. 24A, 24B, 25A and 25B are diagrams illustrating the result in which the optical simulation is carried out with respect to the micro lens 140d in a fourth embodiment relating to the invention.

Figure 24A:
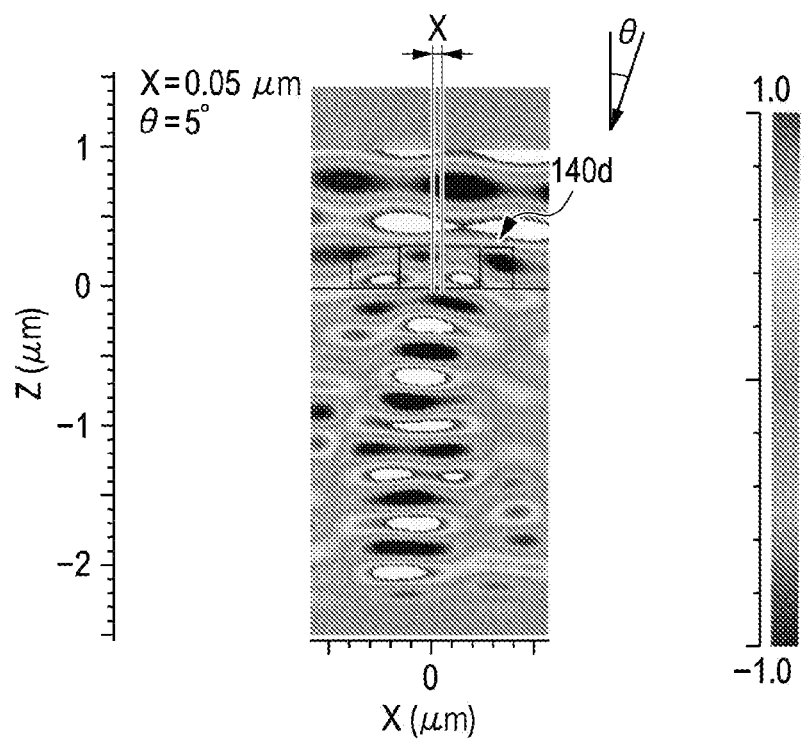
FIGS. 24A and 24B are diagrams illustrating the result in which an optical simulation is carried out in regard to a micro lens in a fourth embodiment relating to the present invention.

Herein, in FIG. 24A, in a case where the micro lens 140d is formed by the following conditions and in a case where the incident angle of the main ray is the following conditions, the result when the simulation is carried out by the FDTD method is shown.

shift amount X by which the center of the first refractive index layer 141d is shifted to the center of the micro lens 140d: 0.05 μm incident angle θ of main ray: 5°

Figure 24B:
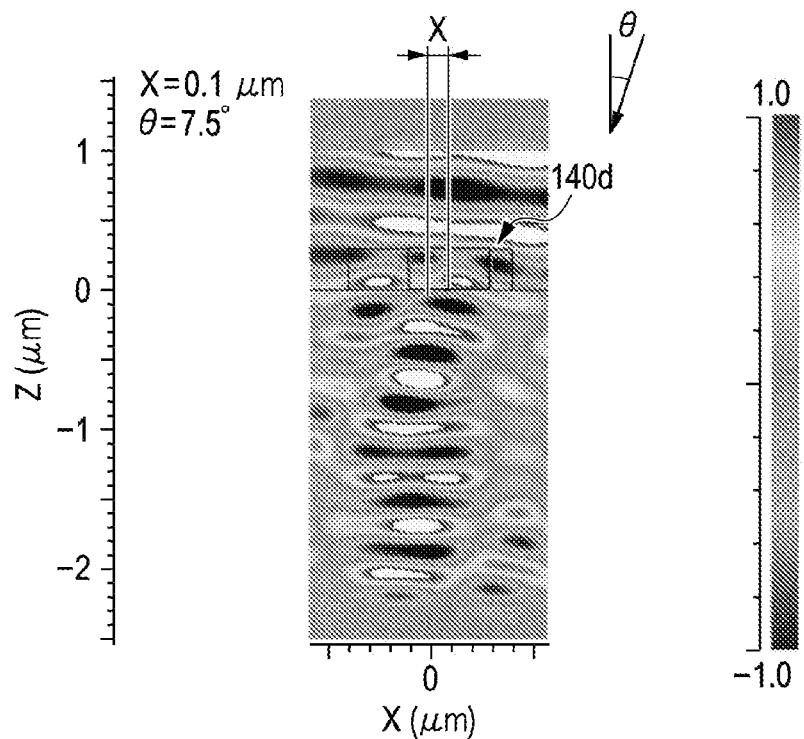

In FIG. 24B, in a case where the micro lens 140d is formed by the following conditions and in a case where the incident angle of the main ray is the following conditions, the result when the simulation is carried out by the FDTD method is shown.

shift amount X by which the center of the first refractive index layer 141d is shifted to the center of the micro lens 140d: 0.1 μm incident angle θ of main ray: 7.5°

Figure 25A:
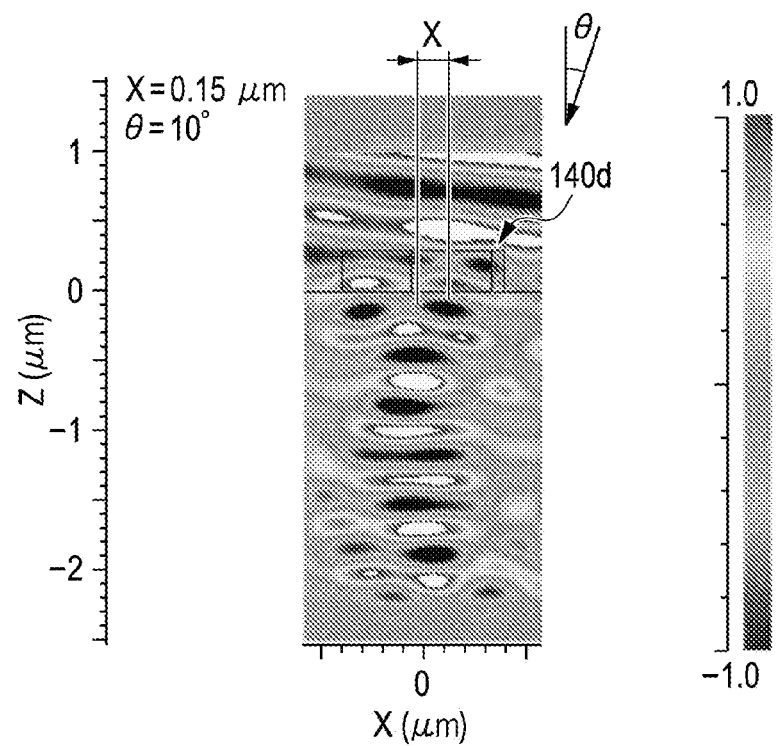
FIGS. 25A and 25B are diagrams illustrating the result in which an optical simulation is carried out in regard to a micro lens in a fourth embodiment relating to the present invention.

In FIG. 25A, in a case where the micro lens 140d is formed by the following conditions and in a case where the incident angle of the main ray is the following conditions, the result when the simulation is carried out by the FDTD method is shown.

shift amount X by which the center of the first refractive index layer 141$d$ is shifted to the center of the micro lens 140$d$: 0.15 μm incident angle θ of main ray: 10°

Figure 25B:
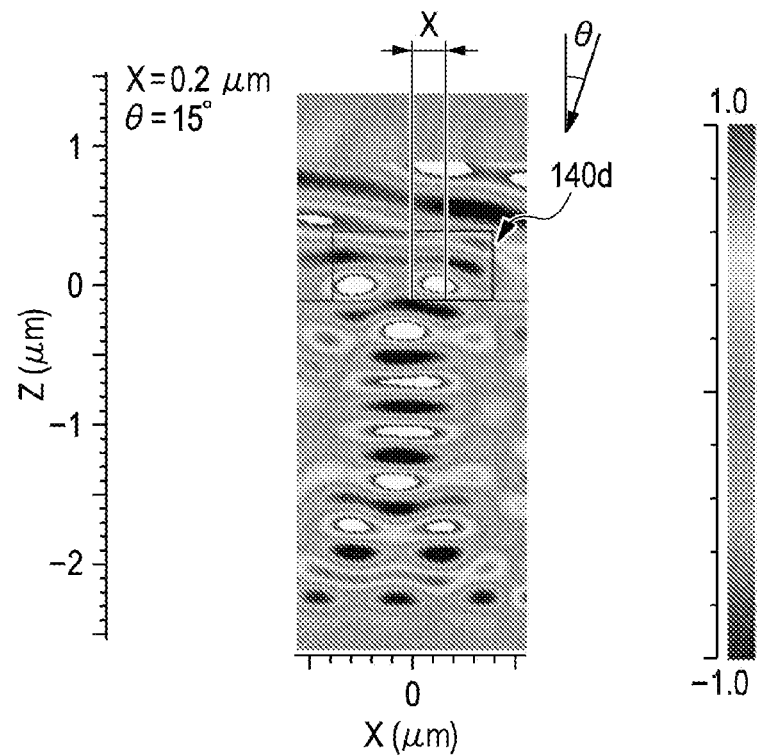

In FIG. 25B, in a case where the micro lens 140$d$ is formed by the following conditions and in a case where the incident angle of the main ray is the following conditions, the result when the simulation is carried out by the FDTD method is shown.

shift amount X by which the center of the first refractive index layer 141$d$ is shifted to the center of the micro lens 140$d$: 0.2 μm incident angle θ of main ray: 15°

Except for the above-mentioned conditions, in FIGS. 24A, 24B, 25A and 25B, the micro lens 140$d$ is formed by the conditions shown by FIG. 12 in the first embodiment.

Figure 26:
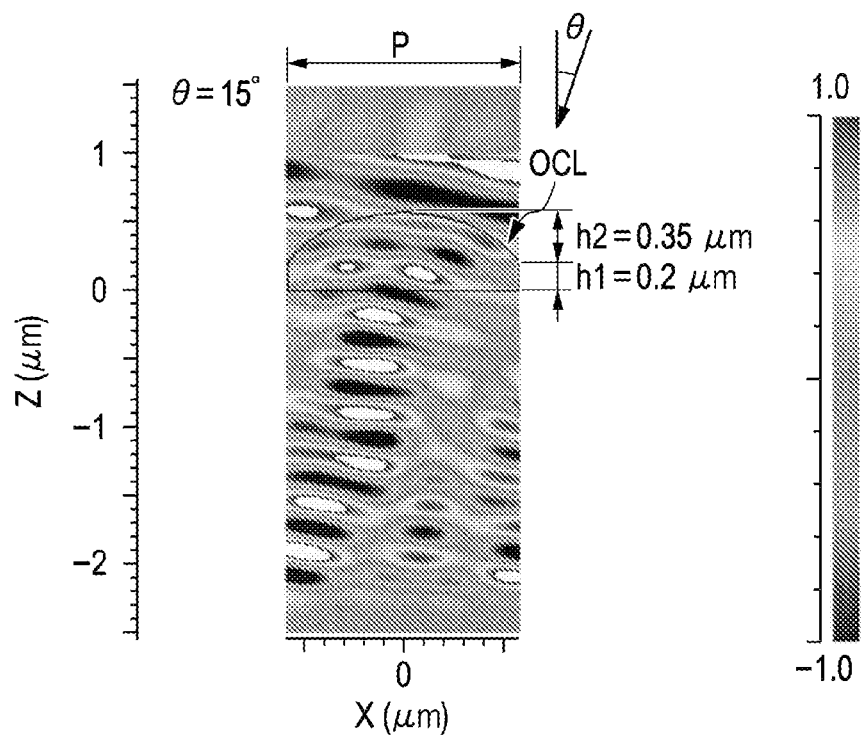
FIG. 26 is a diagram illustrating the result in which an optical simulation is carried out in regard to a micro lens which has an upper convex surface lens.

FIG. 26 is a diagram illustrating the result in which the optical simulation is carried out in regard to a micro lens OCL which is an upper convex curved surface lens.

Herein, there is shown the result in which the simulation is carried out by the FDTD method in regard to the case where the micro lens OCL is formed by the following conditions.

refractive index: 1.45 film thickness h1 of the curved surface portion: 0.35 μm film thickness h2 of the lower layer of the curved surface portion: 0.2 μm transverse width and pitch P of Micro lens OCL: 1.1 μm As shown in FIGS. 24A, 24B, 25A and 25B, in the case of the micro lens 140$d$ of the present embodiment, the inclined main ray is concentrated to the light sensing surface JS perpendicularly to the capturing surface by the micro lens 140$d$. On the contrary to this, as shown in FIG. 26, in the case of the micro lens OCL of the upper convex curved surface lens, the slope of the main ray is rarely changed by the micro lens OCL and is not perpendicular to the capturing surface.

FIGS. 27A, 27B, 28A, 28B and 29A are diagrams illustrating the result in which the optical simulation is carried out with respect to the micro lens 140$d$ in the fourth embodiment relating to the invention.

Figure 27A:
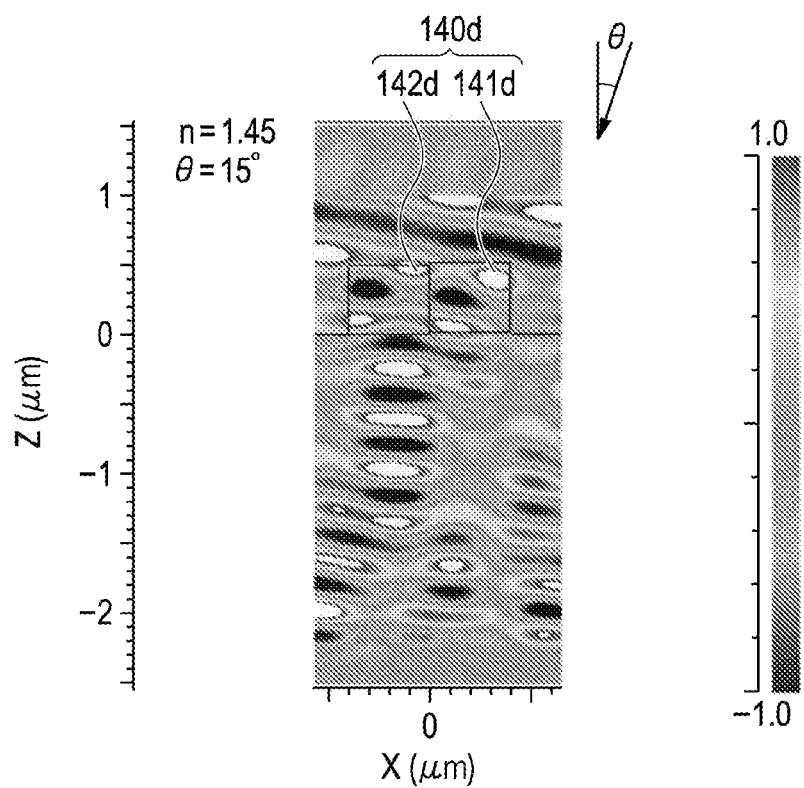
FIGS. 27A and 27B are diagrams illustrating the result in which an optical simulation is carried out in regard to a micro lens in a fourth embodiment relating to the present invention.

Herein, in FIG. 27A, in a case where the micro lens 140$d$ is formed by the following conditions and in a case where the incident angle of the main ray is the following conditions, the result when the simulation is carried out by the FDTD method is shown.

refractive index n1 of first refractive index layer 141: 1.45 incident angle θ of main ray: 15°

Figure 27B:
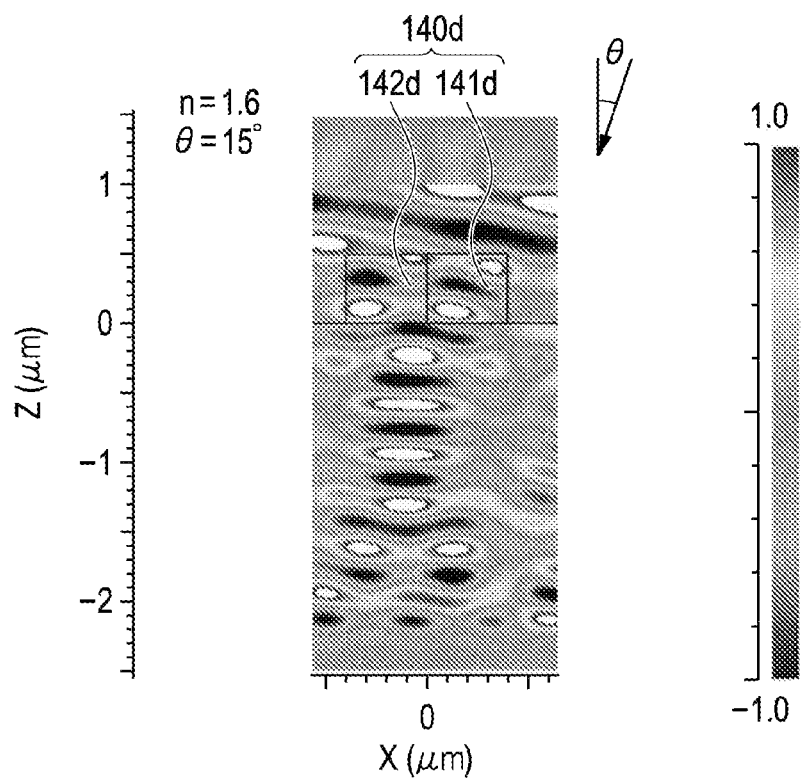

In FIG. 27B, in a case where the micro lens 140$d$ is formed by the following conditions and in a case where the incident angle of the main ray is the following conditions, the result when the simulation is carried out by the FDTD method is shown.

refractive index n1 of first refractive index layer 141: 1.6 incident angle θ of main ray: 15°

Figure 28A:
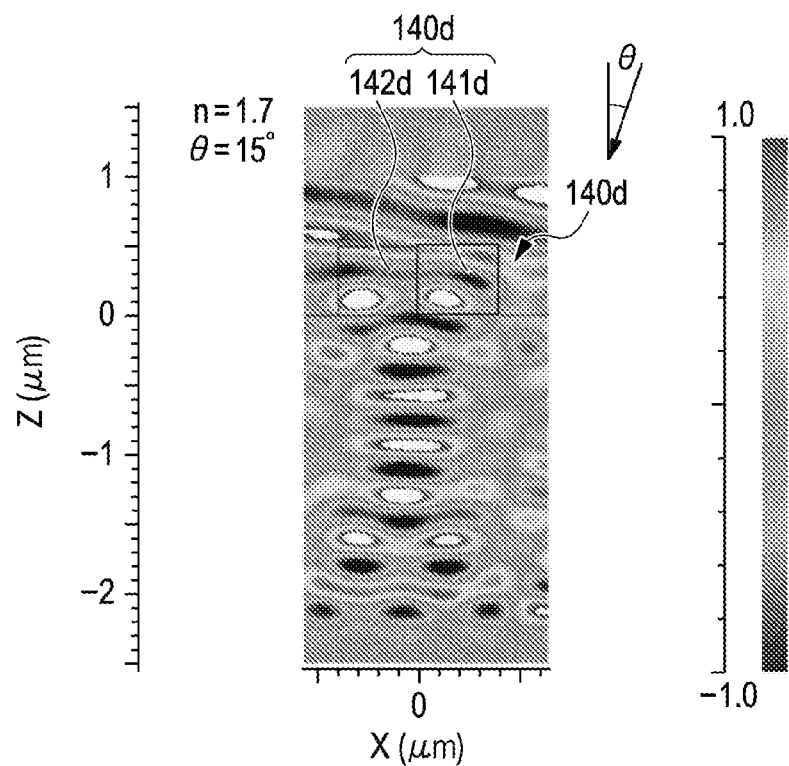
FIGS. 28A and 28B are diagrams illustrating the result in which an optical simulation is carried out in regard to a micro lens in a fourth embodiment relating to the present invention.

In FIG. 28A, in a case where the micro lens 140$d$ is formed by the following conditions and in a case where the incident angle of the main ray is the following conditions, the result when the simulation is carried out by the FDTD method is shown.

refractive index n1 of first refractive index layer 141: 1.70 incident angle θ of main ray: 15°

Figure 28B:
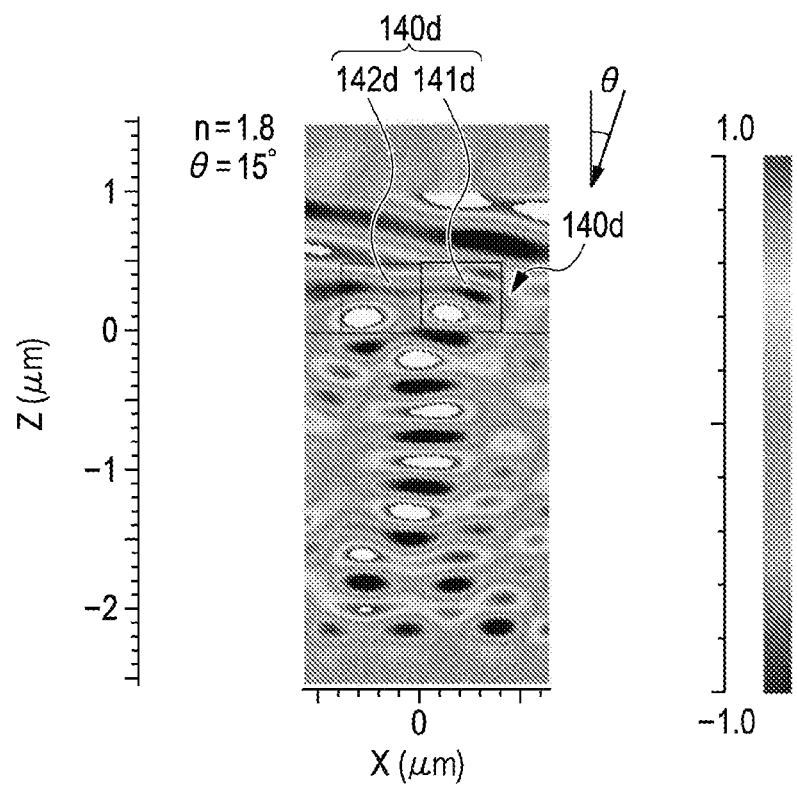

In FIG. 28B, in a case where the micro lens 140$d$ is formed by the following conditions and in a case where the incident angle of the main ray is the following conditions, the result when the simulation is carried out by the FDTD method is shown.

refractive index n1 of first refractive index layer 141: 1.80 incident angle θ of main ray: 15°

Figure 29:
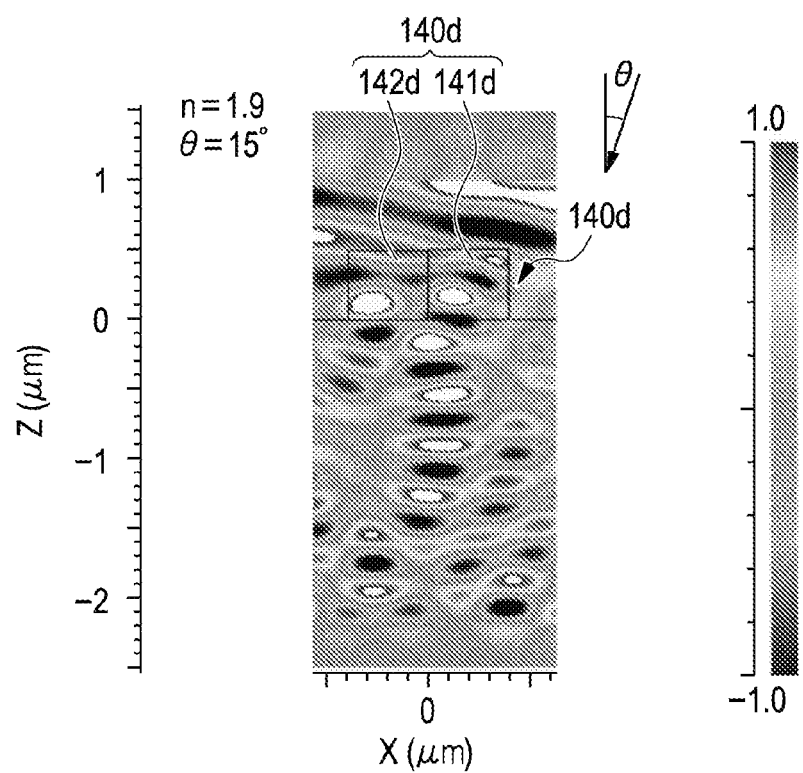
FIG. 29 is a diagram illustrating the result in which an optical simulation is carried out in regard to a micro lens in a fourth embodiment relating to the present invention.

In FIG. 29, in a case where the micro lens 140$d$ is formed by the following conditions and in a case where the incident angle of the main ray is the following conditions, the result when the simulation is carried out by the FDTD method is shown.

refractive index n1 of first refractive index layer 141: 1.90 incident angle θ of main ray: 15°

Except for the above-mentioned conditions, in FIGS. 27A, 27B, 28A, 28B and 29, the micro lens 140$d$ is formed by the conditions shown by FIG. 12 in the first embodiment.

As shown in FIG. 27A, in the micro lens 140$d$ of the present embodiment, in a case where the refractive index of the first refractive index layer 141$d$ is the same as that of the second refractive index layer 142$d$ (n1=n2=1.45), the slope of the sloped main ray is rarely changed by the micro lens 140$d$. On the contrary to this, as shown in FIGS. 27B, 28A, 28B and 29, in a case where the refractive index of the first refractive index layer 141$d$ is different from that of the second refractive index layer 142$d$, the slope of the sloped main ray is concentrated to the light sensing surface JS almost perpendicularly to the capturing surface. In particular, a case where the refractive index n1 of the first refractive index layer 141 is 1.7 is suitable.

(C) Conclusion

As described above, in the present embodiment, the second refractive index layer 142$d$ is formed so that the center of the area where the second refractive index layer 142$d$ is formed in the horizontal plane in the center and the surrounding of the capturing area PA corresponds to the center of the light sensing surface JS. On the contrary to this, the first refractive index layer 141$d$ is formed so that, as it faces from the center of the capturing area PA toward the surrounding thereof, the center of the area where the first refractive index layer 141$d$ is formed in the horizontal plane is shifted to the center side of the capturing area PA surface with respect to the center of the light sensing surface JS.

For this reason, as described above, the sloped main ray is concentrated to the light sensing surface JS perpendicularly to the capturing surface by the micro lens 140$d$. That is, a so-called "pupil correction" is performed.

Thus, in the present embodiment, in the same manner as the case of the first embodiment, it is possible to improve the production efficiency and the reliability of the product, which can realize a reduction in cost. In addition, along with this, high concentration efficiency can be realized, whereby the image quality of the captured image can be improved.

In addition, since "pupil correction" can be realized in the present embodiment, the occurrence of shading is prevented, whereby the image quality of the captured image can be further improved.

<5. Fifth Embodiment>

(A) Device Configuration and the Like

Figure 30:
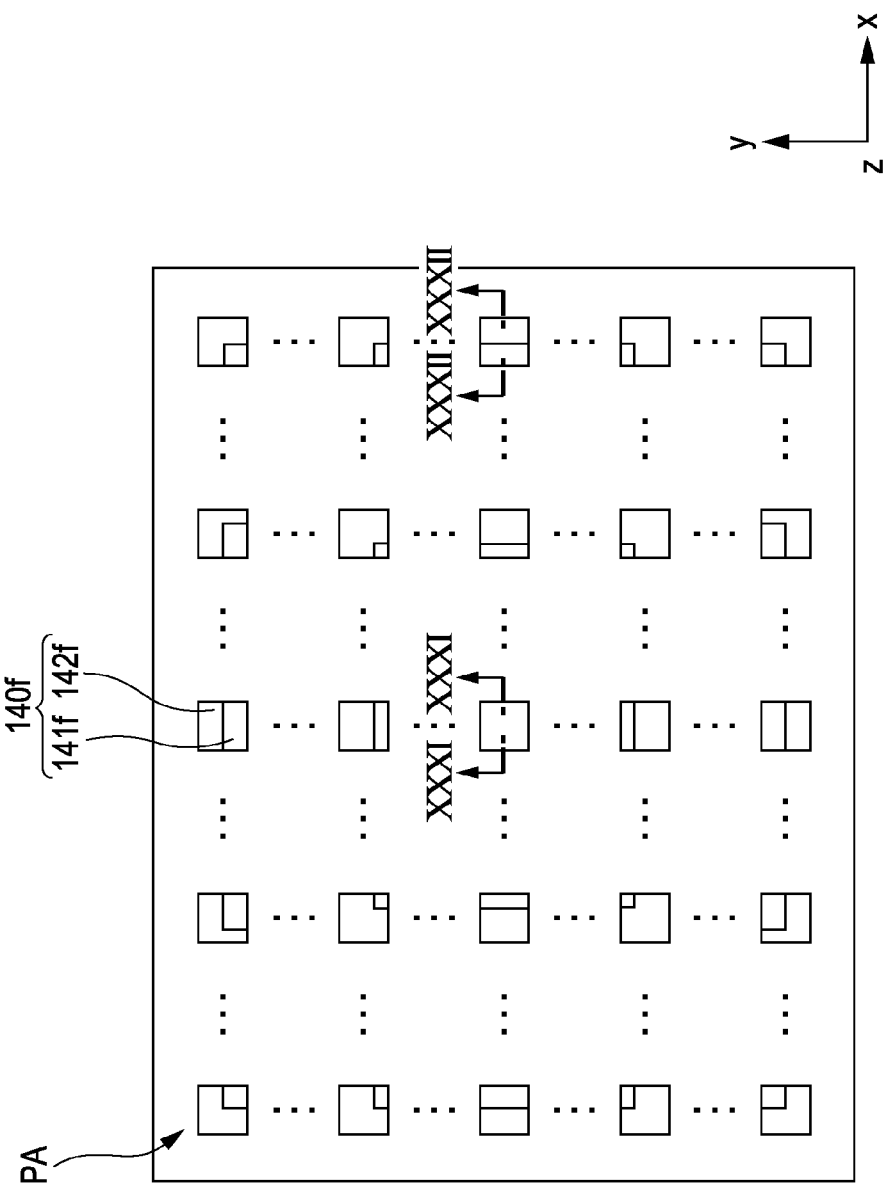
FIG. 30 is a diagram illustrating the principal parts of a solid-state imaging device in a fifth embodiment relating to the present invention.
Figure 31:
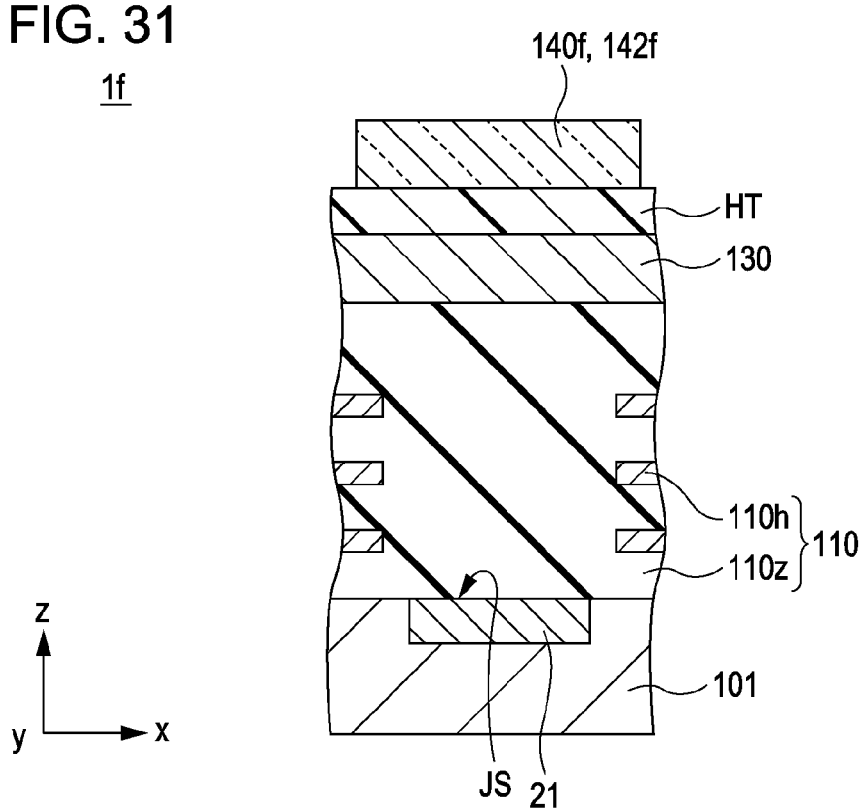
FIG. 31 is a diagram illustrating the principal parts of a solid-state imaging device in a fifth embodiment of the present invention.
Figure 32:
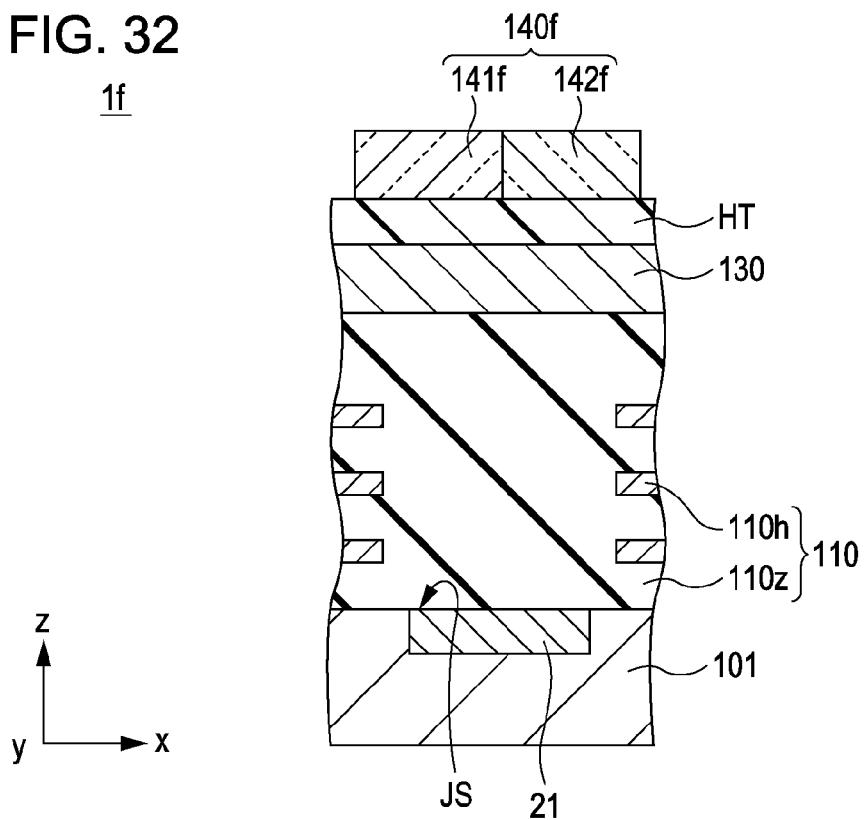
FIG. 32 is a diagram illustrating the principal parts of a solid-state imaging device in a fifth embodiment relating to the present invention.

FIGS. 30 to 32 are diagrams illustrating principal parts of a solid-state imaging device if in a fifth embodiment relating to the invention.

Herein, similarly to FIG. 7, FIG. 30 illustrates the upper surface of the capturing area PA. Similarly to FIG. 5, FIGS. 31 and 32 show the cross section of the capturing area PA. FIG. 31 illustrates the cross section of a X1$fc$-X2$fc$ portion shown in FIG. 30 which is a center portion of the capturing area PA.

Furthermore, FIG. 32 illustrates the cross section of a X1*fs*-X2*fs* portion shown in FIG. 30 which is a surrounding portion of the capturing area PA.

As shown in FIGS. 30 to 32, in the present embodiment, the micro lens 140*f* is different from that of the first embodiment. Except for this point, the present invention is the same as the first embodiment. For this reason, the descriptions of the overlapped portions will be omitted.

As shown in FIGS. 30 to 32, the micro lens 140*f* includes a first refractive index layer 141*f* and a second refractive index layer 142*f*. Similarly to the first embodiment, the first refractive index layer 141*f* is formed using the material of the refractive index higher than that of the second refractive index layer 142*f*.

As shown in FIG. 30, in the same manner as the case of the first embodiment, plurality of micro lenses 140*f* is formed so that the horizontal cross section is the square shape and the size of the horizontal cross section is identical from the center of the capturing area PA to the surroundings thereof.

Moreover, as shown in FIGS. 31 and 32, in the same manner as the case of the first embodiment, the micro lens 140*f* is configured so that the vertical cross section, which is a surface (xz surface) perpendicular to the capturing surface (xy surface), becomes a rectangular shape.

However, in the present embodiment, as shown in FIG. 30, the plurality of micro lenses 140*f* is formed so that the sizes of the area where the first refractive index layer 141*f* is formed in the horizontal plane (xy surface) are different from each other, depending on the arrangement position between the center of the capturing area PA and the surrounding thereof. In addition, along with this, as shown in FIG. 30, the plurality of micro lenses 140*f* is formed so that the sizes of the area where the second refractive index layer 142*f* is formed in the horizontal plane (xy surface) are different from each other, depending on the arrangement position between the center of the capturing area PA and the surrounding thereof.

Specifically, as shown in FIGS. 30 to 32, the first refractive index layer 141*f* is provided so as to be situated at the center side of the capturing area PA with respect to the second refractive index layer 142*f* in the respective micro lenses 140*f*. On the other hand, the second refractive index layer 142*f* is provided so as to be situated at the surrounding side of the capturing area PA with respect to the first refractive index layer 141*f* in the respective micro lenses 140*f*.

In addition, as shown in FIG. 30, each of the plurality of micro lenses 140*f* are formed so that the horizontal cross section of the first refractive index layer 141*f* becomes larger than that of the second refractive index layer 142*f*, as they face from the center of the capturing area PA to the surrounding thereof. That is, as they face from the center of the capturing area PA to the surrounding thereof, the micro lenses 140*f* are formed so that the horizontal cross section of the second refractive index layer 142*f* becomes smaller than that of the first refractive index layer 141*f*.

In the present embodiment, in the center portion of the capturing area PA, as shown in FIGS. 30 and 31, the micro lens 140*f* does not include the first refractive index layer 141*f* but includes the second refractive index layer 142*f*.

In addition, in the surrounding portion other than the center portion of the capturing area PA, as shown in FIGS. 30 and 32, the micro lens 140*f* includes both of the first refractive index layer 141*f* and the second refractive index layer 142*f*. In addition, the micro lens 140*f* is formed in rows so that the first refractive index layer 141*f* is situated at the center side of the capturing area PA and the second refractive index layer 142*f* is situated at the surrounding side of the capturing area PA.

For example, as shown in FIGS. 30 and 32, in the capturing area PA, similarly to the sixth embodiment, in the capturing area PA, in the pixel situated at the right side end portion along the horizontal direction x from the center pixel, the first refractive index layer 141*f* is provided at the left side (center side of the capturing area PA). Specifically, as shown in FIGS. 30 and 32, in the micro lens 140*f*, a left half portion when divided into two in the horizontal direction x around the vertical direction y is constituted by the first refractive index layer 141*f*. Furthermore, in the pixel, as shown in FIGS. 30 and 32, the second refractive index layer 142*f* is provided at the right side (surrounding side of the capturing area PA). Specifically, as shown in FIGS. 30 and 32, a right half portion of the micro lens 140*f* is constituted by the second refractive index layer 142*f*.

In addition, as shown in FIG. 30, in the capturing area PA, in the pixel situated in the middle between the center pixel and the pixel of the right side end portion, a portion occupying ¼ at the left side of the micro lens 140*f* is constituted by the first refractive index layer 141*f*. That is, the micro lens 140*f* is formed so that the micro lens 140*f* includes the first refractive index layer 141*f* at ratio between ratio in which the first refractive index layer 141*f* occupies in the center pixel and ratio in which the first refractive index layer 141*f* occupies in the pixel of the right side end portion. In addition, in the pixel, the remaining portion of the micro lens 140*f* is constituted by the second refractive index layer 142*f*. That is, a portion which occupies ¾ of the whole at the right side of the micro lens 140*f* is constituted by the second refractive index layer 142*f*.

Furthermore, as shown in FIG. 30, in the pixel situated at the right upper end portion in the capturing area PA, a left lower portion when dividing the micro lens 140*f* into four in the horizontal direction x and the vertical direction y is constituted by the first refractive index layer 141*f*. In addition, in the pixel, the remaining portion of the micro lens 140*f* is constituted by the second refractive index layer 142*f*.

In addition, as shown in FIG. 30, in the capturing area PA, each of the plurality of micro lenses 140*f* is formed so that the first refractive index layer 141*f* and the second refractive index layer 142*f* are disposed symmetrically to each other around the center pixel in the horizontal direction x and the vertical direction y. The micro lens 140*f* as described above is formed through the same process as the case of the first embodiment.

(B) Optical Simulation Results of Micro Lens 140*f*

FIGS. 33A, 33B, 34A, 34B and 35 are diagrams illustrating the result in which the optical simulation is carried out with respect to the micro lens 140*f* in a fifth embodiment relating to the invention.

Figure 33A:
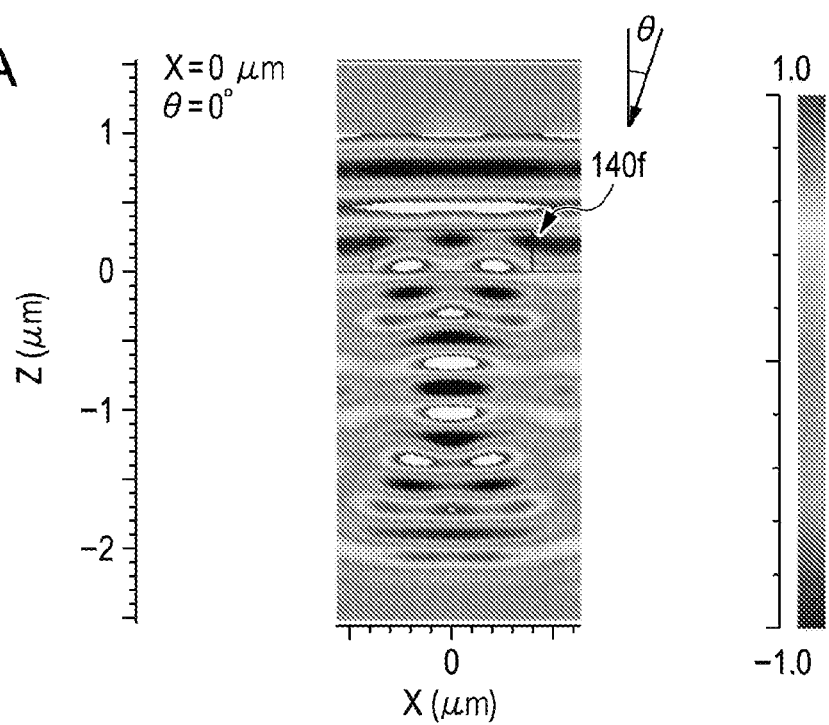
FIGS. 33A and 33B are diagrams illustrating the result in which an optical simulation is carried out in regard to a micro lens in a fifth embodiment relating to the present invention.

Herein, in FIG. 33A, in a case where the micro lens 140*f* is formed by the following conditions and in a case where the incident angle of the main ray is the following conditions, the result when the simulation is carried out by the FDTD method is shown.

transverse width X in which the first refractive index layer 141*f* is formed at the right end portion of the micro lens 140*f*: 0 μm incident angle θ of main ray: 0°

Figure 33B:
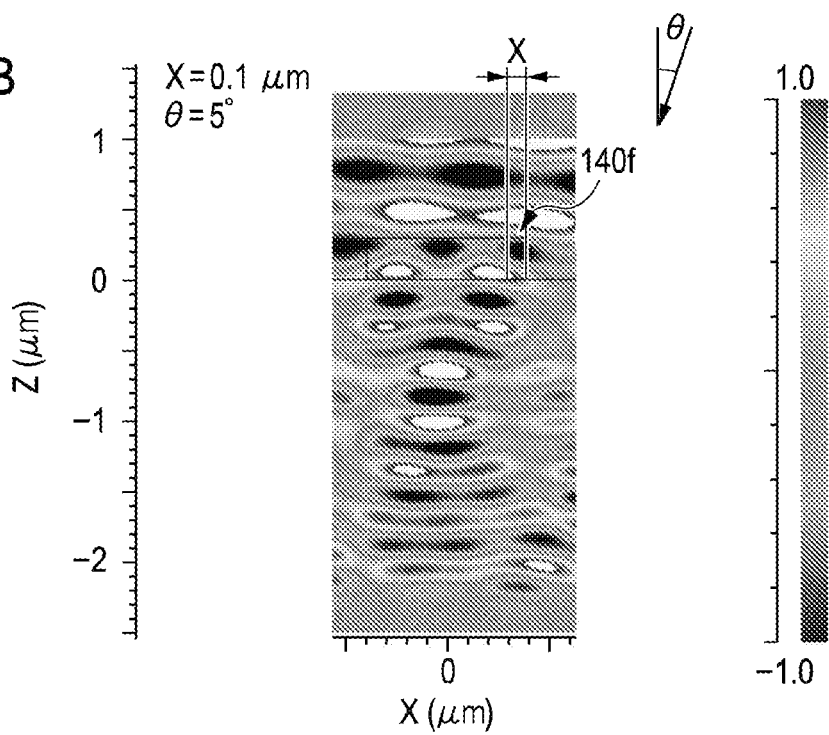

In FIG. 33B, in a case where the micro lens 140*f* is formed by the following conditions and in a case where the incident angle of the main ray is the following conditions, the result when the simulation is carried out by the FDTD method is shown.

transverse width X in which the first refractive index layer 141*f* is formed at the right end portion of the micro lens 140*f*: 0.1 μm incident angle θ of main ray: 5°

Figure 34A:
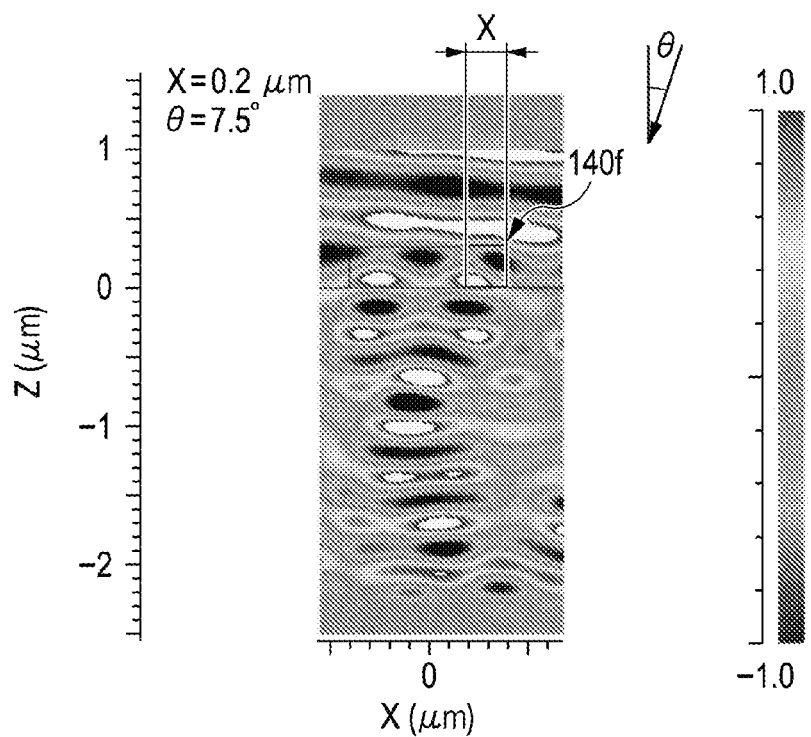
FIGS. 34A and 34B are diagrams illustrating the result in which an optical simulation is carried out in regard to a micro lens in a fifth embodiment relating to the present invention.

In FIG. 34A, in a case where the micro lens 140*f* is formed by the following conditions and in a case where the incident angle of the main ray is the following conditions, the result when the simulation is carried out by the FDTD method is shown.

transverse width X in which the first refractive index layer 141f is formed at the right end portion of the micro lens 140f: 0.2 μm incident angle θ of main ray: 7.5°

Figure 34B:
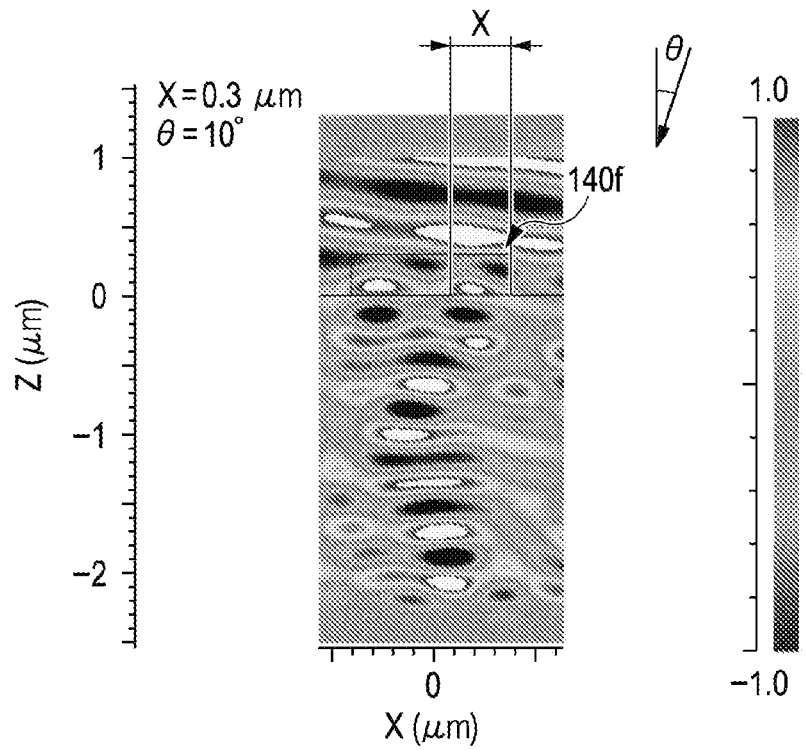

In FIG. 34B, in a case where the micro lens 140f is formed by the following conditions and in a case where the incident angle of the main ray is the following conditions, the result when the simulation is carried out by the FDTD method is shown.

transverse width X in which the first refractive index layer 141f is formed at the right end portion of the micro lens 140f: 0.3 μm incident angle θ of main ray: 10°

Figure 35:
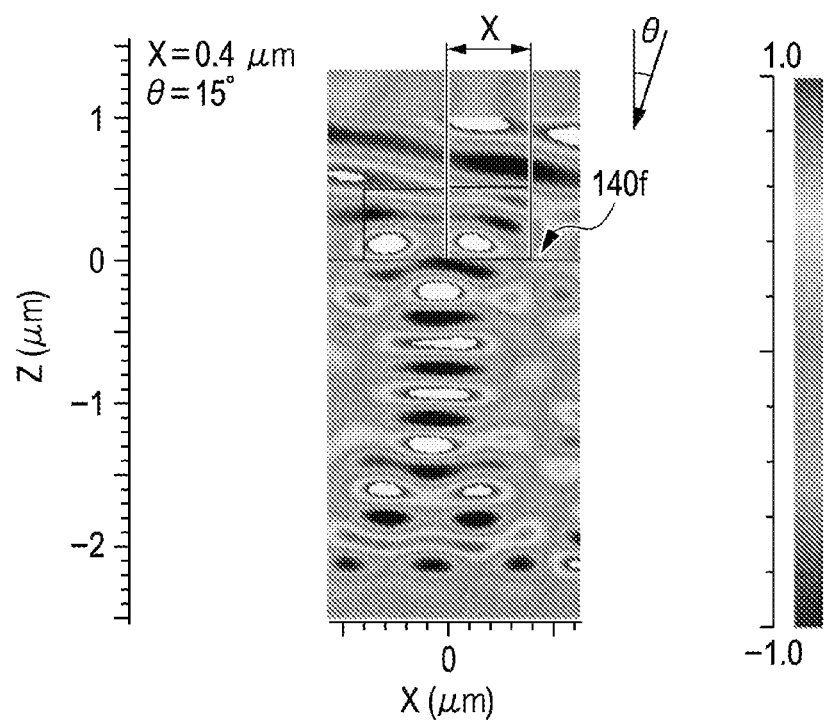
FIG. 35 is a diagram illustrating the result in which an optical simulation is carried out in regard to a micro lens in a fifth embodiment relating to the present invention.

In FIG. 35, in a case where the micro lens 140f is formed by the following conditions and in a case where the incident angle of the main ray is the following conditions, the result when the simulation is carried out by the FDTD method is shown.

transverse width X in which the first refractive index layer 141f is formed at the right end portion of the micro lens 140f: 0.4 μm incident angle θ of main ray: 15°

Except for the above-mentioned conditions, in FIGS. 24A, 24B, 25A and 25B, the micro lens 140f is formed by the conditions shown in FIG. 12 in the first embodiment.

As shown in FIGS. 33A, 33B, 34A, 34B, and 35, in the micro lens 140f of the present embodiment, the inclined main ray is concentrated to the light sensing surface JS perpendicularly to the capturing surface by the micro lens 140f.

(C) Conclusion

As described above, in the present embodiment, the first refractive index layer 141f is situated at the center side of the capturing area PA with respect to the second refractive index layer 142f. The second refractive index layer 142f is situated at the surrounding side of the capturing area PA with respect to the first refractive index layer 141f. Herein, in the center of the capturing area PA, the micro lens 140f does not includes the first refractive index layer 141f, but includes the second refractive index layer 142f. In addition, the plurality of micro lenses 140f is formed so that the horizontal cross section of the first refractive index layer 141f becomes smaller than the horizontal cross section of the second refractive index layer 142f as they faces from the center of the capturing area PA to the surrounding thereof. For this reason, as described above, the sloped main ray is concentrated to the light sensing surface JS perpendicularly to the capturing surface by the micro lens 140f. That is, in the present embodiment, a so-called "pupil correction" is performed.

Thus, in the present embodiment, in the same manner as the case of the first embodiment, it is possible to improve the production efficiency and the reliability of the product, which can realize a reduction in cost. In addition, along with this, the high concentration efficiency can be realized, whereby the image quality of the captured image can be improved.

In addition, since so-called "pupil correction" can be realized, the occurrence of the shading is prevented, whereby the image quality of the captured image can be further improved.

<6. Sixth Embodiment>

(A) Device Configuration and the Like

FIGS. 36 to 38 are diagrams illustrating principal parts of a solid-state imaging device 1e in a sixth embodiment relating to the invention.

Herein, similarly to FIG. 7, FIG. 36 illustrates the upper surface of the capturing area PA. Similarly to FIG. 5, FIGS. 37 and 38 show the cross section of the capturing area PA. FIG. 37 illustrates the cross section of a X1ec-X2ec portion shown in FIG. 36 which is a center portion of the capturing area PA. Furthermore, FIG. 38 illustrates the cross section of a X1es-X2es portion shown in FIG. 36 which is a surrounding portion of the capturing area PA.

As shown in FIGS. 36 to 38, in the present embodiment, the micro lens 140e is different from that of the first embodiment. Except for this point, the present invention is the same as the first embodiment. For this reason, the descriptions of the overlapped portions will be omitted.

As shown in FIGS. 36 to 38, the micro lens 140e includes a first refractive index layer 141e and a second refractive index layer 142e. Similarly to the first embodiment, the first refractive index layer 141e is formed using the material of the refractive index higher than that of the second refractive index layer 142e.

As shown in FIG. 36, in the same manner as the case of the first embodiment, a plurality of micro lenses 140e is formed so that the horizontal cross section is the square shape and the size of the horizontal cross section is identical from the center of the capturing area PA to the surroundings thereof.

Moreover, as shown in FIGS. 37 and 38, in the same manner as the case of the first embodiment, the micro lens 140e is configured so that the vertical cross section, which is a surface (xz surface) perpendicular to the capturing surface (xy surface), becomes a rectangular shape.

However, in the present embodiment, as shown in FIG. 36, the plurality of micro lenses 140e is formed so that the sizes of the area where the first refractive index layer 141d is formed in the horizontal plane (xy surface) are different from each other, depending on the arrangement position between the center of the capturing area PA and the surrounding thereof. In addition, along with this, as shown in FIG. 36, the plurality of micro lenses 140e is formed so that the sizes of the area where the second refractive index layer 142d is formed in the horizontal plane (xy surface) are different from each other, depending on the arrangement position between the center of the capturing area PA and the surrounding thereof.

Specifically, as shown in FIGS. 36 to 38, the first refractive index layer 141e is provided so as to be situated at the center side of the capturing area PA with respect to the second refractive index layer 142e in the respective micro lenses 140e. On the other hand, the second refractive index layer 142e is provided so as to be situated at the surrounding side of the capturing area PA with respect to the first refractive index layer 141e in the respective micro lenses 140e.

In addition, as shown in FIG. 36, each of the plurality of micro lenses 140d are formed so that the horizontal cross section of the first refractive index layer 141e becomes smaller than that of the second refractive index layer 142e, as they face from the center of the capturing area PA to the surrounding thereof.

In the present embodiment, in the center portion of the capturing area PA, as shown in FIGS. 36 and 37, the micro lens 140e does not include the second refractive index layer 142e, but includes the first refractive index layer 141e.

In addition, in the surrounding portion other than the center portion of the capturing area PA, as shown in FIGS. 36 and 38, the micro lens 140e includes both of the first refractive index layer 141e and the second refractive index layer 142e. In addition, the micro lens 140e is formed in rows so that the first refractive index layer 141e is situated at the center side of the capturing area PA and the second refractive index layer 142e is situated at the surrounding side of the capturing area PA.

For example, as shown in FIGS. 36 and 38, in the image capturing area PA, similarly to FIG. 6, in the capturing area PA, in the pixel situated at the right side end portion along the horizontal direction x from the center pixel, the first refractive index layer 141e is provided at the left side (center side of the capturing area PA). Specifically, as shown in FIGS. 36 and 38, in the micro lens 140e, a left half portion when divided into two in the horizontal direction x around the vertical direction y is constituted by the first refractive index layer 141e. Furthermore, in the pixel, as shown in FIGS. 36 and 38, the second refractive index layer 142e is provided at the right side (surrounding side of the capturing area PA). Specifically, as shown in FIGS. 36 and 38, a right half portion of the micro lens 140e is constituted by the second refractive index layer 142e. In addition, as shown in FIG. 36, in the capturing area PA, in the pixel situated in the middle between the center pixel and the pixel of the right side end portion, a portion occupying ¾ at the left side of the micro lens 140e is constituted by the first refractive index layer 141e. That is, the micro lens 140e is formed so that the micro lens 140e includes the first refractive index layer 141e at a ratio between a ratio in which the first refractive index layer 141e occupies in the center pixel and a ratio in which the first refractive index layer 141e occupies in the pixel of the right side end portion. In addition, in the pixel, the remaining portion of the micro lens 140e is constituted by the second refractive index layer 142e. That is, a portion which occupies ¼ of the whole at the right side of the micro lens 140e is constituted by the second refractive index layer 142e.

Furthermore, as shown in FIG. 36, in the pixel situated at the right upper end portion in the capturing area PA, a left lower portion when dividing the micro lens 140e into four in the horizontal direction x and the vertical direction y is constituted by the first refractive index layer 141e. In addition, in the pixel, the remaining portion of the micro lens 140e is constituted by the second refractive index layer 142e.

In addition, as shown in FIG. 36, in the pixel situated at the right upper end portion in the capturing area PA, each of the plurality of micro lenses 140e are formed so that the first refractive index layer 141e and the second refractive index layer 142e are disposed symmetrically to each other around the center pixel in the horizontal direction x and the vertical direction y. The micro lens 140e as described above is formed through the same process as the case of the first embodiment.

Moreover, in the same manner as the case of the fifth embodiment, in the micro lens 140e of the present embodiment, the sloped main ray is concentrated to the light sensing surface JS perpendicularly to the capturing surface by the micro lens 140e.

(C) Conclusion

As described above, in the present embodiment, the first refractive index layer 141e is situated at the center side of the capturing area PA with respect to the second refractive index layer 142e. The second refractive index layer 142e is situated at the surrounding side of the capturing area PA with respect to the first refractive index layer 141e. Herein, in the center of the capturing area PA, the micro lens 140e does not include the second refractive index layer 142e but includes the first refractive index layer 141e. In addition, the plurality of micro lenses 140e is formed so that the horizontal cross section of the first refractive index layer 141e becomes larger than the horizontal cross section of the second refractive index layer 142e as they faces from the center of the capturing area PA to the surrounding thereof. For this reason, as described above, the sloped main ray is concentrated to the light sensing surface JS perpendicularly to the capturing surface by the micro lens 140e. That is, in the present embodiment, a so-called "pupil correction" is performed.

Thus, in the present embodiment, in the same manner as the case of the first embodiment, it is possible to improve the production efficiency and the reliability of the product, which can realize a reduction in cost. In addition, along with this, the high concentration efficiency can be realized, which can improve the image quality of the captured image.

In addition, since so-called "pupil correction" can be realized, the occurrence of the shading is prevented, whereby the image quality of the captured image can be further improved.

<7. Seventh Embodiment>

(A) Production Method and the Like

Figure 39A:
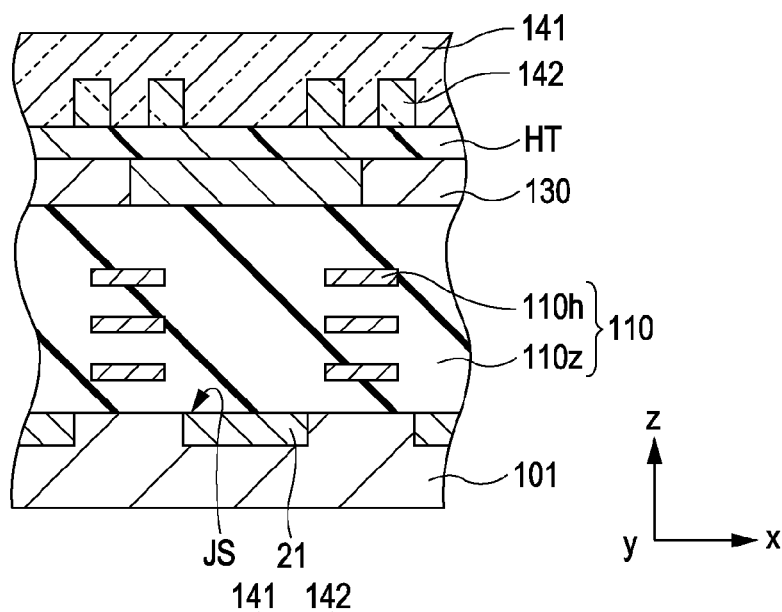
FIGS. 39A to 39C are diagrams illustrating the principal parts provided in each process of a method of producing a solid-state imaging device in a seventh embodiment relating to the present invention.
Figure 39B:
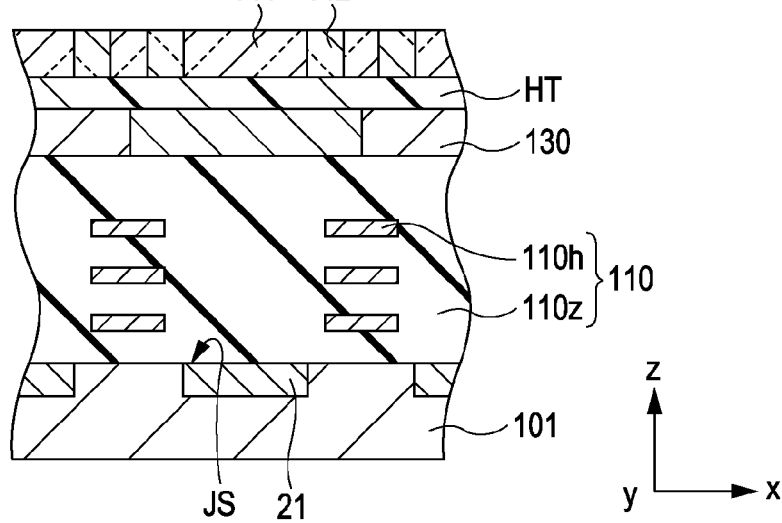
Figure 39C:
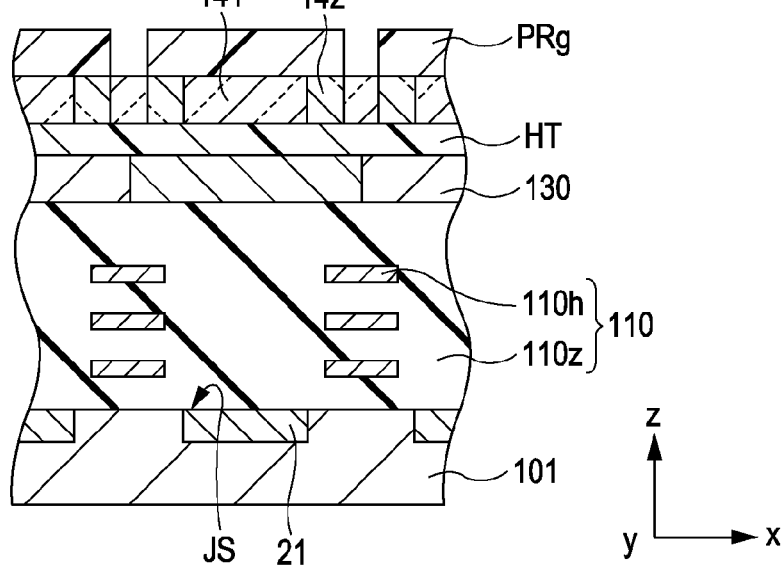

FIGS. 39A to 39C show principal parts provided at each process of a method of producing the solid-state imaging device 1 in a seventh embodiment relating to the invention. FIGS. 39A to 39C are cross sectional views illustrating principal parts of the solid-state imaging device 1 shown in FIG. 5 in the first embodiment. Herein, a process of forming the micro lens 140 forming the solid-state imaging device 1 will be described in detail.

As shown in FIGS. 39A to 39C, in the present embodiment, the production process of the micro lens 140 is different from the first embodiment. Except for this point, the present invention is the same as the first embodiment. For this reason, the description of the overlapped portion will be omitted.

(A-1) Film Formation of First Refractive Index Layer 141

In the present embodiment, before the film formation of the first refractive index layer 141, in the same manner as the case shown in FIGS. 18A to 19A in the third embodiment, the second refractive index layer 142 is subjected to pattern machining on the planarized film HT.

In addition, as shown in FIG. 39A, the first refractive index layer 141 is formed so as to cover the second refractive index layer 142 which has been subjected to pattern machining.

Herein, in the same conditions of the case of the first embodiment, as shown in FIG. 19B, the first refractive index layer 141 is formed so as to cover the upper surface of the second refractive index layer 142.

(A-2) Planarization of Surfaces of First Refractive Index Layer 141 and Second Refractive Index Layer 142

Next, as shown in FIG. 39B, the surfaces of the first refractive index layer 141 and the second refractive index layer 142 are planarized.

Herein, by carrying out, for example, the CMP processing, the upper surface of the first refractive index layer 141 and the upper surface of the second refractive index layer 142 are planarized. In the implementation of the CMP processing, by causing the second refractive index layer 142 to function as a stopper to remove the first refractive index layer 141, the planarization processing is carried out.

(A-3) Formation of Photoresist Mask PRg

Next, as shown in FIG. 39C, a photoresist mask PRg is formed.

Herein, after a photoresist film (not shown) is formed on the upper surfaces of the first refractive index layer 141 and the second refractive index layer 142, pattern machining is carried out with respect to the photoresist film, thereby forming the photoresist mask PRg as shown in FIG. 39C.

As shown in FIG. 5, in the present embodiment, the photoresist film is subjected to pattern machining so as to correspond to the pattern shape of the micro lens 140, thereby forming the photoresist mask PRg. Specifically, after carrying out the light exposure processing which exposes the mask pattern image corresponding to the micro lens 140, the developing processing is performed, thereby forming the photoresist mask PR2. As a result, the photoresist mask PRg is formed so that the surfaces of the portions (see FIG. 5) of the first refractive index layer 141 and the second refractive index layer 142 forming the micro lens 140 are covered and the remaining portions are exposed.

(A-4) Formation of Micro Lens 140

Next, as shown in FIG. 5, the micro lens 140 is formed.

Herein, by performing pattern machining with respect to the first refractive index layer 141, as shown in FIG. 5, the micro lens 140 is formed.

In the present process, by removing a part of the first refractive index layer 141 by the dry etching processing using the photoresist mask PRg, as shown in FIG. 5, the first refractive index layer 141 is machined.

(B) Conclusion

As described above, in the present embodiment, in the same manner as the case of the first embodiment, the micro lens 140 is formed.

Thus, in the same manner as the case of the first embodiment, the present embodiment can improve the production efficiency and reliability of the product and can realize a reduction in cost. In addition, together with this, high concentration efficiency can be realized, which can improve the image quality of the captured image.

<8. Eight Embodiment>

(A) Production Method and the Like

Figure 40A:
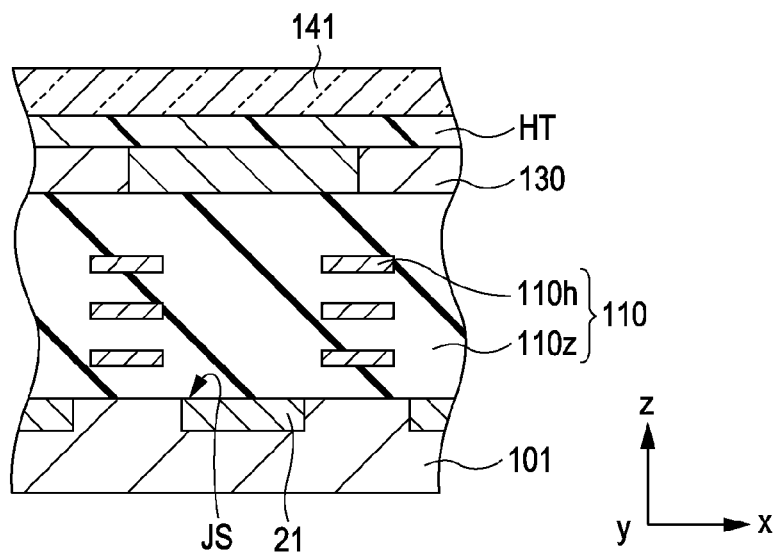
FIGS. 40A to 40C are diagrams illustrating the principal parts provided in each process of a method of producing a solid-state imaging device in an eighth embodiment relating to the present invention.
Figure 40B:
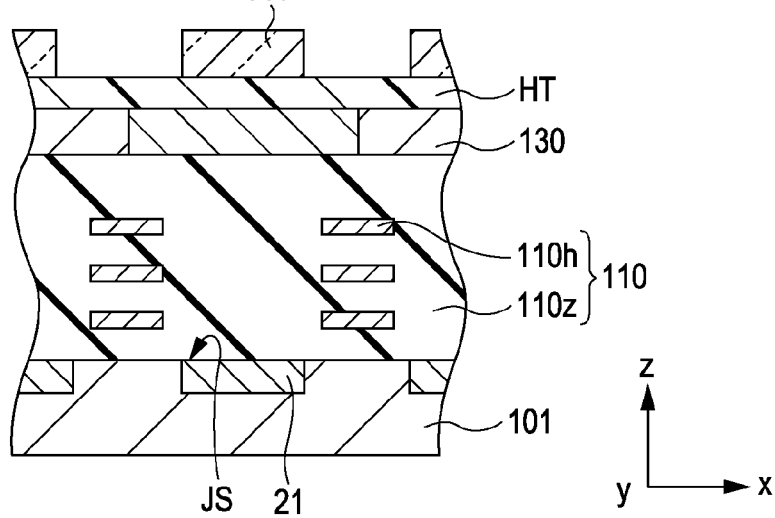
Figure 40C:
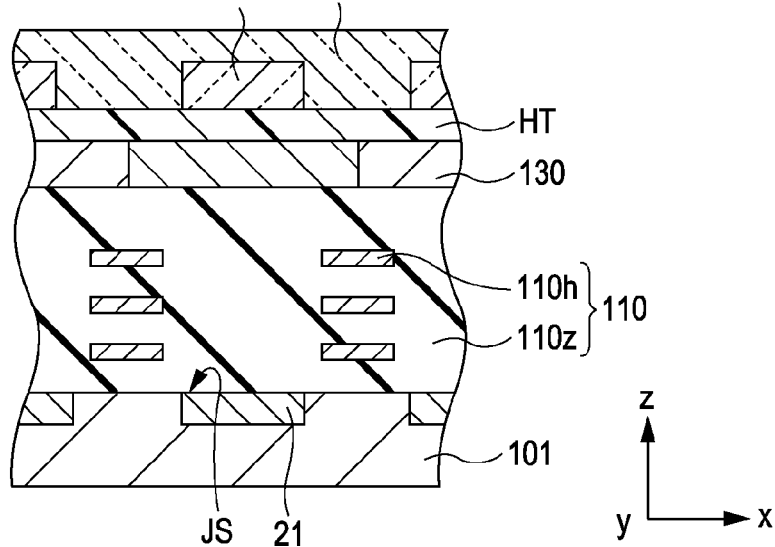

FIGS. 40A to 40C show principal parts provided at each process of a method of producing the solid-state imaging device 1b in an eight embodiment relating to the invention. FIGS. 40A to 40C are cross sectional views illustrating principal parts of the solid-state imaging device 1b shown in FIG. 13 in the second embodiment. Herein, a process of forming the micro lens 140b forming the solid-state imaging device 1b will be described in detail.

As shown in FIGS. 40A to 40C, in the present embodiment, the production process of the micro lens 140b is different from the second embodiment. Except for this point, the present invention is the same as the second embodiment. For this reason, the description of the overlapped portion will be omitted.

(A-1) Film Formation of First Refractive Index Layer 141

Firstly, as shown in FIG. 40A, the film formation of the first refractive index layer 141 is performed.

Herein, before the film formation of the first refractive index layer 141, in the same manner as the case of the second embodiment, as shown in FIG. 40A, the respective members situated at the lower layer of the first refractive index layer 141 is formed on the substrate 101.

After that, as shown in FIG. 40A, the first refractive index layer 141 is formed so as to cover the upper surface of the planarized film HT.

In the present embodiment, unlike the case of the second embodiment, the film formation of the first refractive index layer 141 is performed using the photosensitive resin.

(A-2) Machining of First Refractive Index Layer 141

Next, as shown in FIG. 40B, the first refractive index layer 141 is machined.

Herein, as shown in FIG. 40B, the first refractive index layer 141 is machined so that the vertical cross section (xz surface) perpendicular to the capturing surface (xy surface) becomes the rectangular shape.

In the present process, unlike the case of the second embodiment, the first refractive index layer 141 is machined without providing the photoresist mask on the first refractive index layer 141.

Specifically, the exposing processing of exposing the mask pattern image corresponding to the pattern of the first refractive index layer 141, which forms the micro lens 140b, to the first refractive index layer 141 formed of the photosensitive resin is carried out. After that, the developing processing is performed. As a result, the first refractive index layer 141 is subjected to pattern machining.

(A-3) Film Formation of Second Refractive Index Layer 142

Next, as shown in FIG. 40C, the film formation of the second refractive index layer 142b is performed.

Herein, as shown in FIG. 40C, the film formation of the second refractive index layer 142b is performed so as to cover the upper surface of the first refractive index layer 141.

In the present embodiment, unlike the case of the second embodiment, the film formation of the second refractive index layer 142b is performed using the photosensitive resin.

(A-4) Formation of Micro Lens 140b

Next, as shown in FIG. 13, the micro lens 140b is formed.

Herein, by performing pattern machining with respect to the second refractive index layer 142b, as shown in FIG. 13, the micro lens 140b is formed.

In the present process, unlike the case of the second embodiment, the second refractive index layer 142b is machined without providing the photoresist mask on the second refractive index layer 142b.

Specifically, the exposing processing of exposing the mask pattern image corresponding to the pattern of the micro lens 140b, to the second refractive index layer 142b formed of the photosensitive resin is carried out. After that, the developing processing is performed. As a result, the second refractive index layer 142b is subjected to pattern machining, thereby forming the micro lens 140b.

(B) Conclusion

As described above, in the present embodiment, in the same manner as the case of the second embodiment, the micro lens 140b is formed.

Thus, in the same manner as the case of the second embodiment, the present embodiment can improve the production efficiency and reliability of the product and can realize a reduction in cost. In addition, together with this, the high concentration efficiency can be realized, which can improve the image quality of the captured image.

In addition, since the first refractive index layer 141 and the second refractive index layer 142b are formed using the photosensitive resin in the present embodiment, the number of process can be reduced, which makes it possible to further improve the production efficiency.

Furthermore, in addition to the above-mentioned embodiments, for example, in the case of the first embodiment, the film formations of the first refractive index layer and the second refractive index layer may be performed using the photosensitive resin, thereby forming the micro lens as described above.

<9. Ninth Embodiment>

(A) Production Method and the Like

Figure 41A:
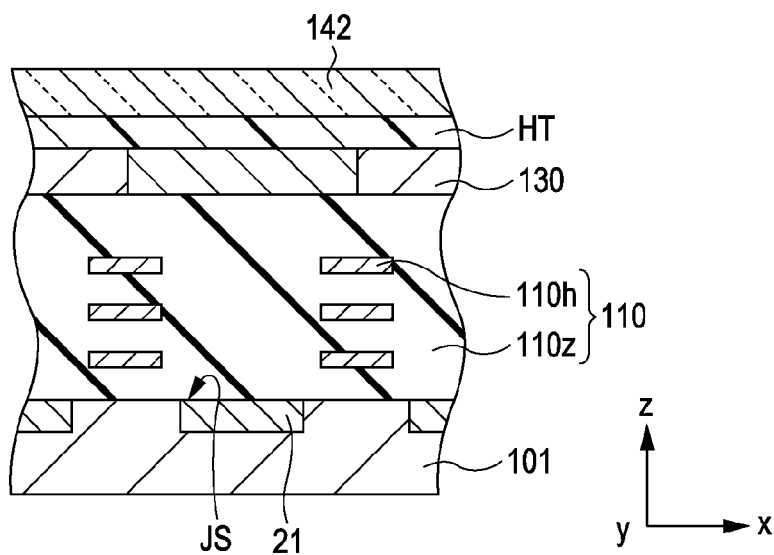
FIGS. 41A to 41C are diagrams illustrating the principal parts provided in each process of a method of producing a solid-state imaging device in a ninth embodiment relating to the present invention.
Figure 41B:
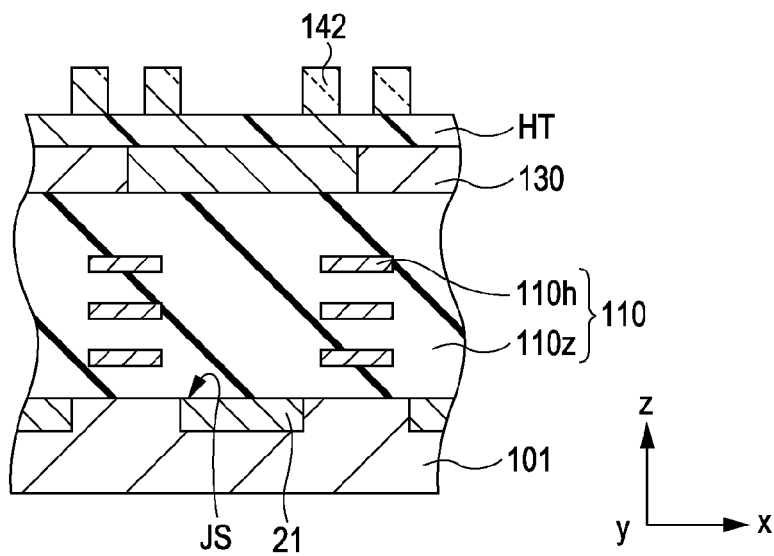
Figure 41C:
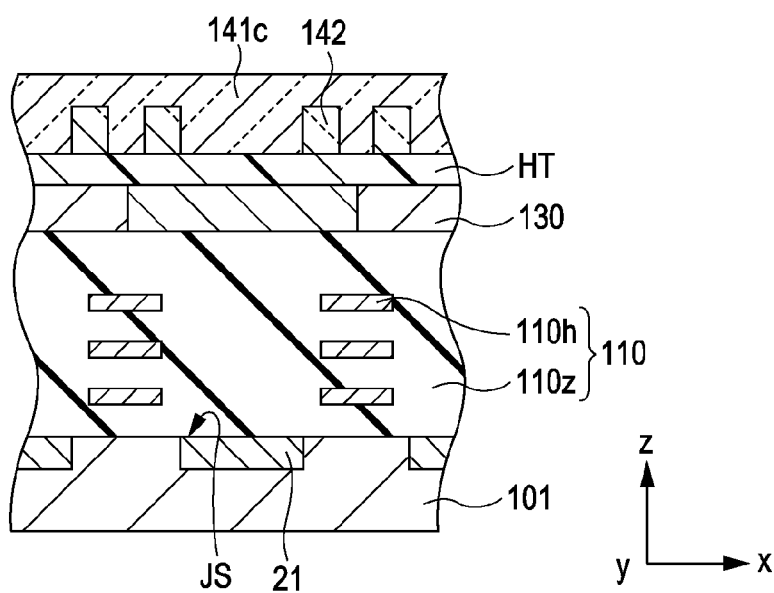

FIGS. 41A to 41C show principal parts provided at each process of a method of producing the solid-state imaging device 1c in a ninth embodiment relating to the invention. FIGS. 41A to 41C are cross sectional views illustrating principal parts of the solid-state imaging device 1c shown in FIG. 16 in the third embodiment. Herein, a process of forming the micro lens 140c forming the solid-state imaging device 1c will be described in detail.

As shown in FIGS. 41A to 41C, in the present embodiment, the production process of the micro lens 140c is different from the third embodiment. Except for this point, the present embodiment is the same as the third embodiment. For this reason, the description of the overlapped portion will be omitted.

(A-1) Film Formation of Second Refractive Index Layer 142

Firstly, as shown in FIG. 41A, the film formation of the second refractive index layer 142 is performed.

Herein, before the film formation of the second refractive index layer 142, in the same manner as the case of the third embodiment, as shown in FIG. 41A, the respective members situated at the lower layer of the second refractive index layer 142 is formed on the substrate 101.

After that, as shown in FIG. 41A, the second refractive index layer 142 is formed so as to cover the upper surface of the planarized film HT.

In the present embodiment, unlike the case of the third embodiment, the film formation of the second refractive index layer 142 is performed using the photosensitive resin.

(A-2) Machining of Second Refractive Index Layer 142

Next, as shown in FIG. 41B, the second refractive index layer 142 is machined.

Herein, as shown in FIG. 41B, the second refractive index layer 142 is machined so that the vertical cross section (xz surface) perpendicular to the capturing surface (xy surface) becomes the rectangular shape.

In the present process, unlike the case of the third embodiment, the second refractive index layer 142 is machined without providing the photoresist mask on the second refractive index layer 142.

Specifically, the exposing processing of exposing the mask pattern image corresponding to the pattern of the second refractive index layer 142, which forms the micro lens 140c, to the second refractive index layer 142 formed of the photosensitive resin is carried out. After that, the developing processing is performed. As a result, the second refractive index layer 142 is subjected to pattern machining.

(A-3) Film Formation of First Refractive Index Layer 141c

Next, as shown in FIG. 41C, the film formation of the second refractive index layer 142b is performed.

Herein, as shown in FIG. 41C, the film formation of the first refractive index layer 141c is performed so as to cover the upper surface of the second refractive index layer 142.

In the present embodiment, unlike the case of the third embodiment, the film formation of the first refractive index layer 141c is performed using the photosensitive resin.

(A-4) Formation of Micro Lens 140c

Next, as shown in FIG. 16, the micro lens 140c is formed.

Herein, by performing pattern machining with respect to the first refractive index layer 141c, as shown in FIG. 16, the micro lens 140c is formed.

In the present process, unlike the case of the third embodiment, the first refractive index layer 141c is machined without providing the photoresist mask on the first refractive index layer 141c.

Specifically, the exposing processing of exposing the mask pattern image corresponding to the pattern of the micro lens 140c, to the first refractive index layer 141c formed of the photosensitive resin is carried out. After that, the developing processing is performed. As a result, the first refractive index layer 141c is subjected to pattern machining, thereby forming the micro lens 140c.

(B) Conclusion

As described above, in the present embodiment, in the same manner as the case of the third embodiment, the micro lens 140c is formed.

Thus, in the same manner as the case of the third embodiment, the present embodiment can improve the production efficiency and reliability of the product and can realize a reduction in cost. In addition, together with this, the high concentration efficiency can be realized, which can improve the image quality of the captured image.

In addition, since the first refractive index layer 141c and the second refractive index layer 142 are formed using the photosensitive resin in the present embodiment, the number of process can be reduced, which makes it possible to further improve the production efficiency.

Furthermore, in addition to the above-mentioned embodiments, for example, in the case of the first embodiment, the film formations of the first refractive index layer and the second refractive index layer may be performed using the photosensitive resin, thereby forming the micro lens as described above.

<10. The Rest>

When carrying out the invention, it is possible to adopt various modified examples without being limited to the above-mentioned embodiments.

Although the case of being applied to the CMOS imaging sensor was described in the above-mentioned embodiment, the invention is not limited thereto. For example, the invention can be applied to the CCD imaging sensor. Furthermore, the invention may be applied to a case of a rear surface irradiation type in which the incident light is received from a rear surface side of an opposite side with respect to a front surface with a pixel transistor provided thereon in the substrate.

Moreover, although the case where the invention is applied to a camera was described in the above-mentioned embodiments, the invention is not limited thereto. The invention may be applied to other electronic equipment including solid-state imaging devices such as a scanner, a copier or the like.

Although a description was given of the case where the micro lens is formed by two layers having different refractive indexes of the first refractive index layer and the second refractive index layer in the above-mentioned embodiments, the invention is not limited thereto. The invention may be applied to a case where the micro lens is formed of three or more layers having different refractive indexes. For example, it is desirable that the micro lens is formed so that refractive index becomes lower from the center to the surroundings.

Although a description was given of the case where color filter is provided on the upper part of the photodiode, so that the colored light penetrating the color filter is received by the photodiode in the above-mentioned embodiments, the invention is not limited thereto. The invention can be similarly applied to a case of receiving the incident light which is incident without passing through the color filter, whereby it is possible to prevent a decline in image quality due to the shading phenomenon.

Furthermore, in the embodiments, a description was given of the case of forming the micro lens without distinction between three different colors of colored layers forming the color filter. That is, a description was given of the case of similarly forming the micro lens between a red filter layer, a green filter layer, and a blue filter layer. However, the invention is not limited thereto. For example, in the case of the fourth embodiment, the micro lens 140d may be formed so that the shift amounts, by which the center of the area where the first refractive index layer 141d having the high refractive index is formed is shifted to the center side of the capturing area PA with respect to the center of the pixel, are different from each other between the colored layers of each color (see FIG. 21). That is, the micro lens 140d may be formed so that the pitches, by which the plurality of first refractive index layers is arranged in the horizontal direction x and the vertical direction y, are different from each other between the colored layers of each color.

Specifically, in order to prevent the occurrence of the color shading, it is desirable to form the micro lens so that the shift amount becomes the following order between the red filter layer, the green filter layer and the blue filter layer.

red filter layer>green filter layer>blue filter layer

The reason for doing so is because, in the case of a minute cell size, as the light which is incident to the imaging element becomes a longer wavelength, it is difficult for the light to reliably concentrate to the light sensing surface (for example, in the case of red light, it is difficult for the light to reliably concentrate to the light sensing surface compared to green light and blue light having a wavelength shorter than red light).

Moreover, in the embodiments, the solid-state imaging devices 1, 1b, 1c, 1d, 1e and 1f correspond to the solid-state imaging device of the invention. In addition, in the embodiments, the photodiode 21 corresponds to the photoelectric transformation portion of the invention. Furthermore, in the embodiments, the camera 40 corresponds to the electronic equipment of the invention. Furthermore, in the embodiments, the substrate 101 corresponds to the substrate of the invention. Moreover, in the embodiments, the color filter 130 corresponds to the color filter of the invention. Moreover, in the embodiments, the micro lenses 140, 140b, 140c, 140d, 140e, and 140f correspond to the micro lens of the invention. Furthermore, in the embodiments, the first refractive index layers 141, 141c, 141d, 141e, and 141f correspond to the first refractive index layer of the invention. Furthermore, in the embodiments, the second refractive index layers 142, 142b, 142c, 142d, 142e, and 142f correspond to the second refractive index layer of the invention. Furthermore, in the embodiments, the light sensing surface JS corresponds to the light sensing surface of the invention. Moreover, in the embodiments, the capturing surface PS corresponds to the capturing surface of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a pixel area, wherein the pixel area includes:
a plurality of pixels, wherein each of the pixels includes at least one photodiode and a micro lens,
wherein the micro lens is formed over the photodiodes of the pixels,
wherein the micro lens includes:
a first layer, wherein the first layer has a first refractive index; and
a second layer, wherein the second layer has a second refractive index that is different from the first refractive index,
wherein the pixel area has a center area and a peripheral area, and
wherein the second refractive index layer covers upper surface of the first refractive index layer, the second refractive index layer is a U shape in vertical cross section which is a surface perpendicular to a capturing surface.

2. The solid-state imaging device of claim 1, wherein a shape of a micro lens of a pixel in the plurality of pixels in the center area is different from the shape of a micro lens of a pixel in the peripheral area.

3. The solid-state imaging device of claim 2, wherein a pitch between centers of the first refractive index layers in a second one of the horizontal and the vertical directions is less than a pitch between centers of the pixels in the second one of the horizontal and vertical directions.

4. The solid-state imaging device of claim 3, wherein for each of the pixels the size of an area of the first layer is the same.

5. The solid-state imaging device of claim 4, wherein for each of the pixels the size of an area of the second layer is the same.

6. The solid-state imaging device of claim 1, wherein the micro lens is rectangular in a horizontal plane along a capturing surface.

7. The solid-state imaging device of claim 1, wherein for each of the pixels the size of an area of the first layer is the same.

8. The solid-state imaging device of claim 1, wherein for each pixel in the peripheral area a center of the first layer in a horizontal cross section does not correspond to a center of the second layer in the horizontal cross section.

9. The solid-state imaging device of claim 1, wherein the first refractive index is higher than the second refractive index.

10. The solid-state imaging device of claim 1, wherein for at least a center pixel the first layer has a center in the horizontal cross section that corresponds to a center of the second layer in the horizontal cross section.

* * * * *